(12) United States Patent
Or-Bach et al.

(10) Patent No.: US 8,846,463 B1
(45) Date of Patent: Sep. 30, 2014

(54) METHOD TO CONSTRUCT A 3D SEMICONDUCTOR DEVICE

(71) Applicant: Monolithic 3D Inc., San Jose, CA (US)

(72) Inventors: Zvi Or-Bach, San Jose, CA (US); Zeev Wurman, Palo Alto, CA (US)

(73) Assignee: Monolithic 3D Inc., San Jose, CA (US)

( * ) Notice: Subject to any disclaimer, the term of this patent is extended or adjusted under 35 U.S.C. 154(b) by 0 days.

(21) Appl. No.: 13/902,606

(22) Filed: May 24, 2013

Related U.S. Application Data

(63) Continuation of application No. 12/951,924, filed on Nov. 22, 2010, now Pat. No. 8,492,886, and a continuation-in-part of application No. 12/706,520, filed on Feb. 16, 2010, and a continuation-in-part of application No. 12/847,911, filed on Jul. 30, 2010, now Pat. No. 7,960,242, and a continuation-in-part of application No. 12/894,252, filed on Sep. 30, 2010, now Pat. No. 8,258,810.

(51) Int. Cl.
*H01L 21/84* (2006.01)
*H01L 21/8232* (2006.01)

(52) U.S. Cl.
CPC .................... *H01L 21/8232* (2013.01)
USPC .......................................... 438/155; 438/164

(58) Field of Classification Search
CPC .................. H01L 21/8221; H01L 21/8232
USPC .................................................. 438/151–166
See application file for complete search history.

(56) References Cited

U.S. PATENT DOCUMENTS

| 3,007,090 A | 10/1961 | Rutz |
| 3,819,959 A | 6/1974 | Chang et al. |
| 4,197,555 A | 4/1980 | Uehara et al. |
| 4,400,715 A | 8/1983 | Barbee et al. |
| 4,487,635 A | 12/1984 | Kugimiya et al. |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |

(Continued)

FOREIGN PATENT DOCUMENTS

| EP | 1267594 A2 | 12/2002 |
| EP | 1909311 A2 | 4/2008 |
| WO | PCT/US2008/063483 | 5/2008 |

OTHER PUBLICATIONS

Topol, A.W., et al., "Enabling SOI-Based Assembly Technology for Three-Dimensional (3D) Integrated Circuits (ICs)," IEDM Tech. Digest, Dec. 5, 2005, pp. 363-366.

(Continued)

*Primary Examiner* — Richard Booth

(57) ABSTRACT

A method to construct a semiconductor device, the method including: forming a first mono-crystallized semiconductor layer; forming a second mono-crystallized semiconductor layer including mono-crystallized semiconductor transistors; where the second mono-crystallized semiconductor layer overlays the first mono-crystallized semiconductor layer, where the first mono-crystallized semiconductor layer includes an alignment mark and the transistors are aligned to the alignment mark, and where the first mono-crystallized semiconductor layer includes logic circuits, and connecting the logic circuits to an external device using input/output (I/O) circuits, where the input/output (I/O) circuits are constructed on the second mono-crystallized semiconductor layer.

21 Claims, 74 Drawing Sheets

(56) References Cited

U.S. PATENT DOCUMENTS

| | | |
|---|---|---|
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,881 A | 6/1998 | Pelella et al. |
| 5,781,031 A | 7/1998 | Bertin et al. |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,222,203 B1 | 4/2001 | Ishibashi et al. |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,259,623 B1 | 7/2001 | Takahashi |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,353,492 B2 | 3/2002 | McClelland et al. |
| 6,355,501 B1 | 3/2002 | Fung et al. |
| 6,358,631 B1 | 3/2002 | Forrest et al. |
| 6,365,270 B2 | 4/2002 | Forrest et al. |
| 6,376,337 B1 | 4/2002 | Wang et al. |
| 6,380,046 B1 | 4/2002 | Yamazaki |
| 6,392,253 B1 | 5/2002 | Saxena |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,289 B2 | 6/2003 | Cox |
| 6,600,173 B2 | 7/2003 | Tiwari |
| 6,620,659 B2 | 9/2003 | Emma et al. |
| 6,624,046 B1 | 9/2003 | Zavracky et al. |
| 6,627,518 B1 | 9/2003 | Inoue et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |

(56) References Cited

U.S. PATENT DOCUMENTS

| | | | |
|---|---|---|---|
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,335,573 B2 | 2/2008 | Takayama et al. |
| 7,337,425 B2 | 2/2008 | Kirk |
| 7,338,884 B2 | 3/2008 | Shimoto et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,393,722 B1 | 7/2008 | Issaq et al. |
| 7,419,844 B2 | 9/2008 | Lee et al. |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,557,367 B2 | 7/2009 | Rogers et al. |
| 7,563,659 B2 | 7/2009 | Kwon et al. |
| 7,566,855 B2 | 7/2009 | Olsen et al. |
| 7,586,778 B2 | 9/2009 | Ho et al. |
| 7,589,375 B2 | 9/2009 | Jang et al. |
| 7,608,848 B2 | 10/2009 | Ho et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,749,884 B2 | 7/2010 | Mathew et al. |
| 7,759,043 B2 | 7/2010 | Tanabe et al. |
| 7,768,115 B2 | 8/2010 | Lee et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,199 B2 | 9/2010 | Oh et al. |
| 7,843,718 B2 | 11/2010 | Koh et al. |
| 7,846,814 B2 | 12/2010 | Lee |
| 7,863,095 B2 | 1/2011 | Sasaki et al. |
| 7,867,822 B2 | 1/2011 | Lee |
| 7,888,764 B2 | 2/2011 | Lee |
| 7,915,164 B2 | 3/2011 | Konevecki et al. |
| 7,960,242 B2 * | 6/2011 | Or-Bach et al. ............... 438/401 |
| 8,013,399 B2 | 9/2011 | Thomas et al. |
| 8,014,195 B2 | 9/2011 | Okhonin et al. |

(56) References Cited

U.S. PATENT DOCUMENTS

| | | |
|---|---|---|
| 8,030,780 B2 | 10/2011 | Kirby et al. |
| 8,031,544 B2 | 10/2011 | Kim et al. |
| 8,044,464 B2 | 10/2011 | Yamazaki et al. |
| 8,107,276 B2 | 1/2012 | Breitwisch et al. |
| 8,129,256 B2 | 3/2012 | Farooq et al. |
| 8,136,071 B2 | 3/2012 | Solomon |
| 8,158,515 B2 | 4/2012 | Farooq et al. |
| 8,183,630 B2 | 5/2012 | Batude et al. |
| 8,184,463 B2 | 5/2012 | Saen et al. |
| 8,203,187 B2 | 6/2012 | Lung et al. |
| 8,208,279 B2 | 6/2012 | Lue |
| 8,264,065 B2 | 9/2012 | Su et al. |
| 8,343,851 B2 | 1/2013 | Kim et al. |
| 8,354,308 B2 | 1/2013 | Kang et al. |
| 2001/0000005 A1 | 3/2001 | Forrest et al. |
| 2001/0014391 A1 | 8/2001 | Forrest et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0141233 A1 | 10/2002 | Hosotani et al. |
| 2002/0153243 A1 | 10/2002 | Forrest et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0157748 A1 | 8/2003 | Kim et al. |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0150068 A1 | 8/2004 | Leedy |
| 2004/0152272 A1 | 8/2004 | Fladre et al. |
| 2004/0155301 A1 | 8/2004 | Zhang |
| 2004/0156233 A1 | 8/2004 | Bhattacharyya |
| 2004/0166649 A1 | 8/2004 | Bressot et al. |
| 2004/0175902 A1 | 9/2004 | Rayssac et al. |
| 2004/0178819 A1 | 9/2004 | New |
| 2004/0195572 A1 | 10/2004 | Kato et al. |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0067620 A1 | 3/2005 | Chan et al. |
| 2005/0067625 A1 | 3/2005 | Hata |
| 2005/0073060 A1 | 4/2005 | Datta et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0249859 A1 | 11/2006 | Eiles et al. |
| 2006/0275962 A1 | 12/2006 | Lee |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0108523 A1 | 5/2007 | Ogawa et al. |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0158659 A1 | 7/2007 | Bensce |
| 2007/0158831 A1 | 7/2007 | Cha et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0210336 A1 | 9/2007 | Madurawe |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2008/0032463 A1 | 2/2008 | Lee |
| 2008/0038902 A1 | 2/2008 | Lee |
| 2008/0048327 A1 | 2/2008 | Lee |
| 2008/0067573 A1 | 3/2008 | Jang et al. |
| 2008/0070340 A1 | 3/2008 | Borrelli et al. |
| 2008/0099780 A1 | 5/2008 | Tran |
| 2008/0108171 A1 | 5/2008 | Rogers et al. |
| 2008/0124845 A1 | 5/2008 | Yu et al. |
| 2008/0128745 A1 | 6/2008 | Mastro et al. |
| 2008/0136455 A1 | 6/2008 | Diamant et al. |
| 2008/0142959 A1 | 6/2008 | DeMulder et al. |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0179678 A1 | 7/2008 | Dyer et al. |
| 2008/0191247 A1 | 8/2008 | Yin et al. |
| 2008/0191312 A1 | 8/2008 | Oh et al. |
| 2008/0194068 A1 | 8/2008 | Temmler et al. |

(56) References Cited

U.S. PATENT DOCUMENTS

| | | |
|---|---|---|
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0261378 A1 | 10/2008 | Yao et al. |
| 2008/0272492 A1 | 11/2008 | Tsang |
| 2008/0277778 A1 | 11/2008 | Furman et al. |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0079000 A1 | 3/2009 | Yamazaki et al. |
| 2009/0081848 A1 | 3/2009 | Erokhin et al. |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bilger et al. |
| 2009/0179268 A1 | 7/2009 | Abou-Khalil et al. |
| 2009/0194152 A1 | 8/2009 | Liu et al. |
| 2009/0194768 A1 | 8/2009 | Leedy |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224364 A1 | 9/2009 | Oh et al. |
| 2009/0234331 A1 | 9/2009 | Langereis et al. |
| 2009/0236749 A1 | 9/2009 | Otremba et al. |
| 2009/0244893 A1 | 10/2009 | Tomiyasu |
| 2009/0250686 A1 | 10/2009 | Sato et al. |
| 2009/0262583 A1 | 10/2009 | Lue |
| 2009/0263942 A1 | 10/2009 | Ohnuma et al. |
| 2009/0267233 A1 | 10/2009 | Lee |
| 2009/0272989 A1 | 11/2009 | Shum et al. |
| 2009/0290434 A1 | 11/2009 | Kurjanowicz |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0025766 A1 | 2/2010 | Nuttinck et al. |
| 2010/0031217 A1 | 2/2010 | Sinha et al. |
| 2010/0038743 A1 | 2/2010 | Lee |
| 2010/0052134 A1 | 3/2010 | Werner et al. |
| 2010/0058580 A1 | 3/2010 | Yazdani |
| 2010/0081232 A1 | 4/2010 | Furman et al. |
| 2010/0112753 A1 | 5/2010 | Lee |
| 2010/0112810 A1 | 5/2010 | Lee et al. |
| 2010/0123202 A1 | 5/2010 | Hofmann |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0190334 A1 | 7/2010 | Lee |
| 2010/0193884 A1 | 8/2010 | Park et al. |
| 2010/0193964 A1 | 8/2010 | Farooq et al. |
| 2010/0224915 A1 | 9/2010 | Kawashima et al. |
| 2010/0276662 A1 | 11/2010 | Colinge |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0143506 A1 | 6/2011 | Lee |
| 2011/0147791 A1 | 6/2011 | Norman et al. |
| 2011/0221022 A1 | 9/2011 | Toda |
| 2011/0227158 A1 | 9/2011 | Zhu |
| 2011/0241082 A1 | 10/2011 | Bernstein et al. |
| 2011/0284992 A1 | 11/2011 | Zhu |
| 2011/0286283 A1 | 11/2011 | Lung et al. |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0063090 A1 | 3/2012 | Hsiao et al. |
| 2012/0074466 A1 | 3/2012 | Setiadi et al. |
| 2012/0178211 A1 | 7/2012 | Hebert |
| 2012/0181654 A1 | 7/2012 | Lue |
| 2012/0182801 A1 | 7/2012 | Lue |
| 2012/0241919 A1 | 9/2012 | Mitani |
| 2012/0319728 A1 | 12/2012 | Madurawe |

OTHER PUBLICATIONS

Demeester, P., et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et. al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

(56) References Cited

OTHER PUBLICATIONS

Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.

Celler, G.K., et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G., et al., "Towards Highly Efficient 4-Terminal Mechanical Photovoltaic Stacks," III-Vs Review, Sep.-Oct. 2006, pp. 24-27, vol. 19, Issue 7.

Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D., et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C., et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," Chptr. 13.4, pp. 407-410, in "Integrated Interconnect Technologies for 3D Nano Electronic Systems", 2009, Artech House.

Weis, M., et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Luo, Z.S., et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

Kada, M., "Updated results of R&D on functionally innovative 3D-integrated circuit (dream chip) technology in FY2009", (2010) International Microsystems Packaging Assembly and Circuits Technology Conference, Impact 2010 and International 3D IC Conference, Proceedings.

Kada, M., "Development of functionally innovative 3D-integrated circuit (dream chip) technology / high-density 3D-integration technology for multifunctional devices", (2009) IEEE International Conference on 3D System Integration, 3DIC 2009.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011 vol. 88, Issue 4, pp. 331-335.

Bobba, S., et al., *"CELONCEL: Effective Design Technique for 3-D Monolithic Integration targeting High Performance Integrated Circuits"*, Asia pacific DAC 2011, paper 4A-4.

Choudhury, D., "3D Integration Technologies for Emerging Microsystems", IEEE Proceedings of the IMS 2010, pp. 1-4.

Lee, Y.-J., et. al, "3D 65nm CMOS with 320° C. Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-C6P58.

Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.

Jung, S.-M., et al., "Highly Area Efficient and Cost Effective Double Stacked S3( Stacked Single-crystal Si) Peripheral CMOS SSTFT and SRAM Cell Technology for 512M bit density SRAM", IEDM 2003, pp. 265-268.

Joyner, J.W., "Opportunities and Limitations of Three-dimensional Integration for Interconnect Design", PhD Thesis, Georgia Institute of Technology, Jul. 2003.

Choi, S.-J., "A Novel TFT with a Laterally Engineered Bandgap for of 3D Logic and Flash Memory", 2010 Symposium of VLSI Technology Digest, pp. 111-112.

Radu, I., et al., "Recent Developments of Cu-Cu non-thermo compression bonding for wafer-to-wafer 3D stacking", IEEE 3D Systems Integration Conference (3DIC), Nov. 16-18, 2010.

Gaudin, G., et al., "Low temperature direct wafer to wafer bonding for 3D integration", 3D Systems Integration Conference (3DIC), IEEE, 2010, Munich, Nov. 16-18, 2010, pp. 1-4.

(56) References Cited

OTHER PUBLICATIONS

Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.

Souri, S. J., "Interconnect Performance in 3-Dimensional Integrated Circuits", PhD Thesis, Stanford, Jul. 2003.

Uemoto, Y., et al., "A High-Performance Stacked-CMOS SRAM Cell by Solid Phase Growth Technique", Symposium on VLSI Technology, 2010, pp. 21-22.

Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.

Steen, S.E., et al., "Overlay as the key to drive wafer scale 3D integration", Microelectronic Engineering 84 (2007) 1412-1415.

Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.

Chan, M., et al., "3-Dimensional Integration for Interconnect Reduction in for Nano-CMOS Technologies", IEEE Tencon, Nov. 23, 2006, Hong Kong.

Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.

Naito, T., et al., "World's first monolithic 3D-FPGA with TFT SRAM over 90nm 9 layer Cu CMOS", 2010 Symposium on VLSI Technology Digest of Technical Papers, pp. 219-220.

Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.

Cong, J., et al., "Quantitative Studies of Impact of 3D IC Design on Repeater Usage", Proceedings of International VLSI/ULSI Multilevel Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

Koyanagi, M, "Different Approaches to 3D Chips", 3D IC Review, Stanford University, May 2005.

Koyanagi, M, "Three-Dimensional Integration Technology and Integrated Systems", ASPDAC 2009 presentation.

Koyanagi, M., et al., "Three-Dimensional Integration Technology and Integrated Systems", ASPDAC 2009, paper 4D-1, pp. 409-415.

Hayashi, Y., et al., "A New Three Dimensional IC Fabrication Technology Stacking Thin Film Dual-CMOS Layers", IEDM 1991, paper 25.6.1, pp. 657-660.

Clavelier, L., et al., "Engineered Substrates for Future More Moore and More Than Moore Integrated Devices", IEDM 2010, paper 2.6.1, pp. 42-45.

Kim, K., "From the Future Si Technology Perspective: Challenges and Opportunities", IEDM 2010, pp. 1.1.1-1.1.9.

Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.

Dong, C., et al., "Performance and Power Evaluation of a 3D CMOS/Nanomaterial Reconfigurable Architecture", ICCAD 2007, pp. 758-764.

Gojman, B., et al., "3D Nanowire-Based Programmable Logic", International Conference on Nano-Networks (Nanonets 2006), Sep. 14-16, 2006.

Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.

Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

Rajendran, B., et al., "Thermal Simulation of laser Annealing for 3D Integration", Proceedings VMIC 2003.

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

Sadaka, M., et al., "Building Blocks for wafer level 3D integration", www.electroiq.com , Aug. 18, 2010, last accessed Aug. 18, 2010.

Madan, N., et al., "Leveraging 3D Technology for Improved Reliability," Proceedings of the 40th Annual IEEE/ACM International Symposium on Microarchitecture (Micro 2007), IEEE Computer Society.

Hayashi, Y., et al., "Fabrication of Three Dimensional IC Using "Cumulatively Bonded IC" (CUBIC) Technology", 1990 Symposium on VLSI Technology, pp. 95-96.

Akasaka, Y., "Three Dimensional IC Trends," Proceedings of the IEEE, vol. 24, No. 12, Dec. 1986.

Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.

Kunio, T., et al., "Three Dimensional ICs, Having Four Stacked Active Device Layers," IEDM 1989, paper 34.6, pp. 837-840.

Gaillardon, P-E., et al., "Can We Go Towards True 3-D Architectures?," DAC 2011, paper 58, pp. 282-283.

Yun, J-G., et al., "Single-Crystalline Si Stacked Array (STAR) NAND Flash Memory," IEEE Transactions on Electron Devices, vol. 58, No. 4, Apr. 2011, pp. 1006-1014.

Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.

Goplen, B., et al., "Thermal Via Placement in 3DICs," Proceedings of the International Symposium on Physical Design, Apr. 3-6, 2005, San Francisco.

Bobba, S., et al., "Performance Analysis of 3-D Monolithic Integrated Circuits," 2010 IEEE International 3D Systems Integration Conference (3DIC), Nov. 2010, Munich, pp. 1-4.

Batude, P., et al., "Demonstration of low temperature 3D sequential FDSOI integration down to 50nm gate length," 2011 Symposium on VLSI Technology Digest of Technical Papers, pp. 158-159.

Batude, P., et al., "Advances, Challenges and Opportunities in 3D CMOS Sequential Integration," 2011 IEEE International Electron Devices Meeting, paper 7.3, Dec. 2011, pp. 151-154.

Yun, C. H., et al., "Transfer of patterned ion-cut silicon layers", Applied Physics Letters, vol. 73, No. 19, Nov. 1998, pp. 2772-2774.

Ishihara, R., et al., "Monolithic 3D-ICs with single grain Si thin film transistors," Solid-State Electronics 71 (2012) pp. 80-87.

Lee, S. Y., et al., "Architecture of 3D Memory Cell Array on 3D IC," IEEE International Memory Workshop, May 20, 2012, Monterey, CA.

Lee, S. Y., et al., "3D IC Architecture for High Density Memories," IEEE International Memory Workshop, p. 1-6, May 2010.

Rajendran, B., et al., "CMOS transistor processing compatible with monolithic 3-D Integration," Proceedings VMIC 2005.

(56) References Cited

OTHER PUBLICATIONS

Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.

Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.

Kim, J., et al., "A Stacked Memory Device on Logic 3D Technology for Ultra-high-density Data Storage," Nanotechnology, vol. 22, 254006 (2011).

Lee, K. W., et al., "Three-dimensional shared memory fabricated using wafer stacking technology," IEDM Tech. Dig., 2000, pp. 165-168.

Chen, H. Y., et al., "HfOx Based Vertical Resistive Random Access Memory for Cost Effective 3D Cross-Point Architecture without Cell Selector," Proceedings IEDM 2012, pp. 497-499.

Huet, K., et al., "Ultra Low Thermal Budget Anneals for 3D Memories: Access Device Formation," Ion Implantation Technology 2012, AIP Conf Proceedings 1496, 135-138 (2012).

Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.

Vinet, M., et.al., "Germanium on Insulator and new 3D architectures opportunities for integration", International Journal of Nanotechnology, vol. 7, No. 4, (Aug. 2010) pp. 304-319.

Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.

Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T., et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.

Burr, G. W., et al., "Overview of candidate device technologies for storage-class memory," IBM Journal of Research and Development , vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enhanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et al., "Nickel vs. Cobalt Silicide integration for sub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Shino, T., et al., "Floating Body RAM Technology and its Scalability to 32nm Node and Beyond," Electron Devices Meeting, 2006, IEDM '06, International , pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to 053511-2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr. and Meth. in Phys. Res. B, 2002, pp. 761-766, vol. 190.

Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).

Vengurlekar, A., et al., "Mechanism of Dopant Activation Enhancement in Shallow Junctions by Hydrogen", Proceedings of the Materials Research Society, vol. 864, Spring 2005, E9.28.1-6.

Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.

(56) References Cited

OTHER PUBLICATIONS

Guo, X., et al., "Cascade single-chip phosphor-free white light emitting diodes," Applied Physics Letters, 2008, pp. 013507-1-013507-3, vol. 92.

Takafuji, Y., et al., "Integration of Single Crystal Si TFTs and Circuits on a Large Glass Substrate," IEEE International Electron Devices Meeting (IEDM), Dec. 7-9, 2009, pp. 1-4.

Wierer, J.J., et al., "High-power AlGaInN flip-chip light-emitting diodes," Applied Physics Letters, May 28, 2001, pp. 3379-3381, vol. 78, No. 22.

El-Gamal, A., "Trends in CMOS Image Sensor Technology and Design," International Electron Devices Meeting Digest of Technical Papers, Dec. 2002.

Ahn, S.W., "Fabrication of a 50 nm half-pitch wire grid polarizer using nanoimprint lithography," Nanotechnology, 2005, pp. 1874-1877, vol. 16, No. 9.

Johnson, R.C., "Switching LEDs on and off to enlighten wireless communications," EE Times, Jun. 2010, last accessed Oct. 11, 2010, <http://www.embeddedinternetdesign.com/design/225402094>.

Ohsawa, et al., "Autonomous Refresh of Floating Body Cell (FBC)", International Electron Device Meeting, 2008, pp. 801-804.

Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.

Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.

Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.

Chen, W., et al., "InP Layer Transfer with Masked Implantation," Electrochemical and Solid-State Letters, Issue 12, No. 4, Apr. 2009, H149-150.

Feng, J., et al., "Integration of Germanium-on-Insulator and Silicon MOSFETs on a Silicon Substrate," IEEE Electron Device Letters, vol. 27, No. 11, Nov. 2006, pp. 911-913.

Zhang, S., et al., "Stacked CMOS Technology on SOI Substrate," IEEE Electron Device Letters, vol. 25, No. 9, Sep. 2004, pp. 661-663.

Brebner, G., "Tooling up for Reconfigurable System Design," IEE Colloquium on Reconfigurable Systems, 1999, Ref. No. 1999/061, pp. 2/1-2/4.

Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.

Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.

Valsamakis, E.A., "Generator for a Custom Statistical Bipolar Transistor Model," IEEE Journal of Solid-State Circuits, Apr. 1985, pp. 586-589, vol. SC-20, No. 2.

Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.

Gosele, U., et al., "Semiconductor Wafer Bonding," Annual Review of Materials Science, Aug. 1998, pp. 215-241, vol. 28.

Spangler, L.J., et al., "A Technology for High Performance Single-Crystal Silicon-on-Insulator Transistors," IEEE Electron Device Letters, Apr. 1987, pp. 137-139, vol. 8, No. 4.

Larrieu, G., et al., "Low Temperature Implementation of Dopant-Segregated Band-edger Metallic S/D junctions in Thin-Body SOI p-MOSFETs", Proceedings IEDM, 2007, pp. 147-150.

Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.

Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.

Abramovici, M., "In-system silicon validation and debug", (2008) IEEE Design and Test of Computers, 25 (3), pp. 216-223.

Saxena, P., et al., "Repeater Scaling and Its Impact on CAD", IEEE Transactions on Computer-Aided Design of Integrated Circuits and Systems, vol. 23, No. 4, Apr. 2004.

Abrmovici, M., et al., A reconfigurable design-for-debug infrastructure for SoCs, (2006) Proceedings—Design Automation Conference, pp. 7-12.

Anis, E., et al., "Low cost debug architecture using lossy compression for silicon debug", (2007) Proceedings of the IEEE/ACM Design, pp. 225-230.

Anis, E., et al., "On using lossless compression of debug data in embedded logic analysis", (2007) Proceedings of the IEEE International Test Conference, paper 18.3, pp. 1-10.

Boule, M., et al., "Adding debug enhancements to assertion checkers for hardware emulation and silicon debug", (2006) Proceedings of the IEEE International Conference on Computer Design, pp. 294-299.

Boule, M., et al., "Assertion checkers in verification, silicon debug and in-field diagnosis", (2007) Proceedings—Eighth International Symposium on Quality Electronic Design, ISQED 2007, pp. 613-618.

Burtscher, M., et al., "The VPC trace-compression algorithms", (2005) IEEE Transactions on Computers, 54 (11), Nov. 2005, pp. 1329-1344.

Frieden, B., "Trace port on powerPC 405 cores", (2007) Electronic Product Design, 28 (6), pp. 12-14.

Hopkins, A.B.T., et al., "Debug support for complex systems on-chip: A review", (2006) IEEE Proceedings: Computers and Digital Techniques, 153 (4), Jul. 2006, pp. 197-207.

Hsu, Y.-C., et al., "Visibility enhancement for silicon debug", (2006) Proceedings—Design Automation Conference, Jul. 24-28, 2006, San Francisco, pp. 13-18.

Josephson, D., et al., "The crazy mixed up world of silicon debug", (2004) Proceedings of the Custom Integrated Circuits Conference, paper 30-1, pp. 665-670.

Josephson, D.D., "The manic depression of microprocessor debug", (2002) IEEE International Test Conference (TC), paper 23.4, pp. 657-663.

Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.

Ko, H.F., et al., "Distributed embedded logic analysis for post-silicon validation of SOCs", (2008) Proceedings of the IEEE International Test Conference, paper 16.3, pp. 755-763.

Ko, H.F., et al., "Functional scan chain design at RTL for skewed-load delay fault testing", (2004) Proceedings of the Asian Test Symposium, pp. 454-459.

Ko, H.F., et al., "Resource-efficient programmable trigger units for post-silicon validation", (2009) Proceedings of the 14th IEEE European Test Symposium, ETS 2009, pp. 17-22.

Liu, X., et al., "On reusing test access mechanisms for debug data transfer in SoC post-silicon validation", (2008) Proceedings of the Asian Test Symposium, pp. 303-308.

Liu, X., et al., "Trace signal selection for visibility enhancement in post-silicon validation", (2009) Proceedings Date, pp. 1338-1343.

McLaughlin, R., et al., "Automated debug of speed path failures using functional tests", (2009) Proceedings of the IEEE VLSI Test Symposium, pp. 91-96.

Morris, K., "On-Chip Debugging—Built-in Logic Analyzers on your FPGA", (2004) Journal of FPGA and Structured ASIC, 2 (3).

Nicolici, N., et al., "Design-for-debug for post-silicon validation: Can high-level descriptions help?", (2009) Proceedings—IEEE International High-Level Design Validation and Test Workshop, HLDVT, pp. 172-175.

(56) References Cited

OTHER PUBLICATIONS

Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.

Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.

Moore, B., et al., "High Throughput Non-contact SiP Testing", (2007) Proceedings—International Test Conference, paper 12.3.

Riley, M.W., et al., "Cell broadband engine debugging for unknown events", (2007) IEEE Design and Test of Computers, 24 (5), pp. 486-493.

Vermeulen, B., "Functional debug techniques for embedded systems", (2008) IEEE Design and Test of Computers, 25 (3), pp. 208-215.

Vermeulen, B., et al., "Automatic Generation of Breakpoint Hardware for Silicon Debug", Proceeding of the 41st Design Automation Conference, Jun. 7-11, 2004, p. 514-517.

Vermeulen, B., et al., "Design for debug: Catching design errors in digital chips", (2002) IEEE Design and Test of Computers, 19 (3), pp. 37-45.

Vermeulen, B., et al., "Core-based scan architecture for silicon debug", (2002) IEEE International Test Conference (TC), pp. 638-647.

Vanrootselaar, G. J., et al., "Silicon debug: scan chains alone are not enough", (1999) IEEE International Test Conference (TC), pp. 892-902.

Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.

Sellathamby, C.V., et al., "Non-contact wafer probe using wireless probe cards", (2005) Proceedings—International Test Conference, 2005, pp. 447-452.

Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.

Meindl, J. D., "Beyond Moore'S Law: The Interconnect Era", IEEE Computing in Science & Engineering, Jan./Feb. 2003, pp. 20-24.

Lin, X., et al., "Local Clustering 3-D Stacked CMOS Technology for Interconnect Loading Reduction", IEEE Transactions on electron Devices, vol. 53, No. 6, Jun. 2006, pp. 1405-1410.

He, T., et al., "Controllable Molecular Modulation of Conductivity in Silicon-Based Devices", J. Am. Chem. Soc. 2009, 131, 10023-10030.

Henley, F., "Engineered Substrates Using the Nanocleave Process", SemiconWest, TechXPOT Conference—Challenges in Device Scaling, Jul. 19, 2006, San Francisco.

Diamant, G., et al., "Integrated Circuits based on Nanoscale Vacuum Phototubes", Applied Physics Letters 92, 262903-1 to 262903-3 (2008).

Landesberger, C., et al., "Carrier techniques for thin wafer processing", CS MANTECH Conference, May 14-17, 2007 Austin, Texas, pp. 33-36.

Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.

Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.

Borland, J.O., "Low Temperature Activation of Ion Implanted Dopants: A Review", International Workshop on Junction technology 2002, S7-3, Japan Society of Applied Physics, pp. 85-88.

Vengurlekar, A., et al., "Hydrogen Plasma Enhancement of Boron Activation in Shallow Junctions", Applied Physics Letters, vol. 85, No. 18, Nov. 1, 2004, pp. 4052-4054.

El-Maleh, A. H., et al., "Transistor-Level Defect Tolerant Digital System Design at the Nanoscale", Research Proposal Submitted to Internal Track Research Grant Programs, 2007. Internal Track Research Grant Programs.

Austin, T., et al., "Reliable Systems on Unreliable Fabrics", IEEE Design & Test of Computers, Jul./Aug. 2008, vol. 25, issue 4, pp. 322-332.

Borkar, S., "Designing Reliable Systems from Unreliable Components: The Challenges of Transistor Variability and Degradation", IEEE Micro, IEEE Computer Society, Nov.-Dec. 2005, pp. 10-16.

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.

Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.

Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.

Ko, C.H., et al., "NiSi Schottky Barrier Process-Strained Si (SB-PSS) CMOS Technology for High Performance Applications", 2006 Symposium on VLSI Technology Digest of Technical Papers.

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

Azevedo, I. L., et al., "The Transition to Solid-State Lighting", Proc. IEEE, vol. 97, No. 3, Mar. 2009, pp. 481-510.

(56) References Cited

OTHER PUBLICATIONS

Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.

Tong, Q.-Y., et al., "A "smarter-cut" approach to low temperature silicon layer transfer", Applied Physics Letters, vol. 72, No. 1, Jan. 5, 1998, pp. 49-51.

Tong, Q.-Y., et al., "Low Temperature Si Layer Splitting", Proceedings 1997 IEEE International SOI Conference, Oct. 1997, pp. 126-127.

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Agarwal, a., et al., "Efficient production of silicon-on-insulator films by co-implantation of He+ with H+" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Miller, D.A.B., "Optical interconnects to electronic chips," Applied Optics, vol. 49, No. 25, Sep. 1, 2010, pp. F59-F70.

En, W. G., et al., "The Genesis Process: A New SOI wafer fabrication method", Proceedings 1998 IEEE International SOI Conference, Oct. 1998, pp. 163-164.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate $SiO_2$," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kuroda, T., "ThruChip Interface for Heterogeneous Chip Stacking," ElectroChemicalSociety Transactions, 50 (14) 63-68 (2012).

Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).

Kuroda, T., "Wireless Proximity Communications for 3D System Integration," Future Directions in IC and Package Design Workshop, Oct. 29, 2007.

\* cited by examiner

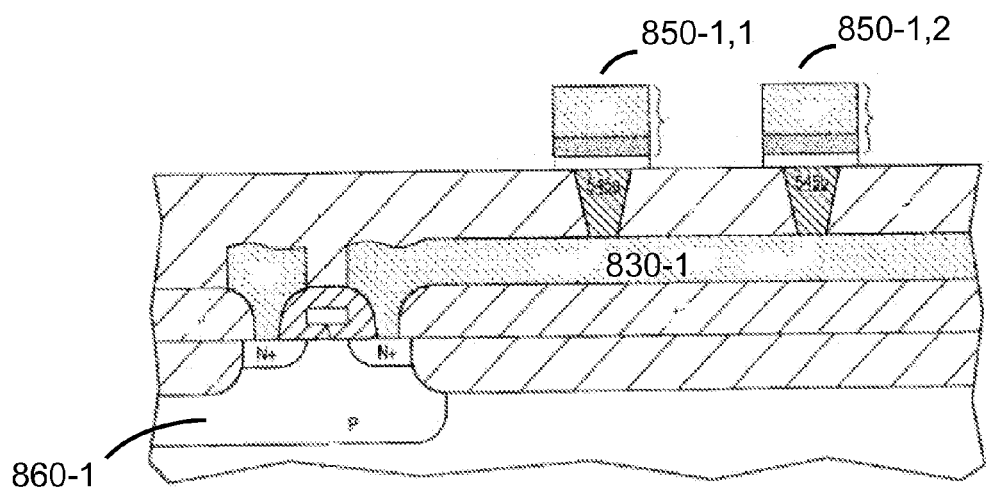
Fig 2 - prior art

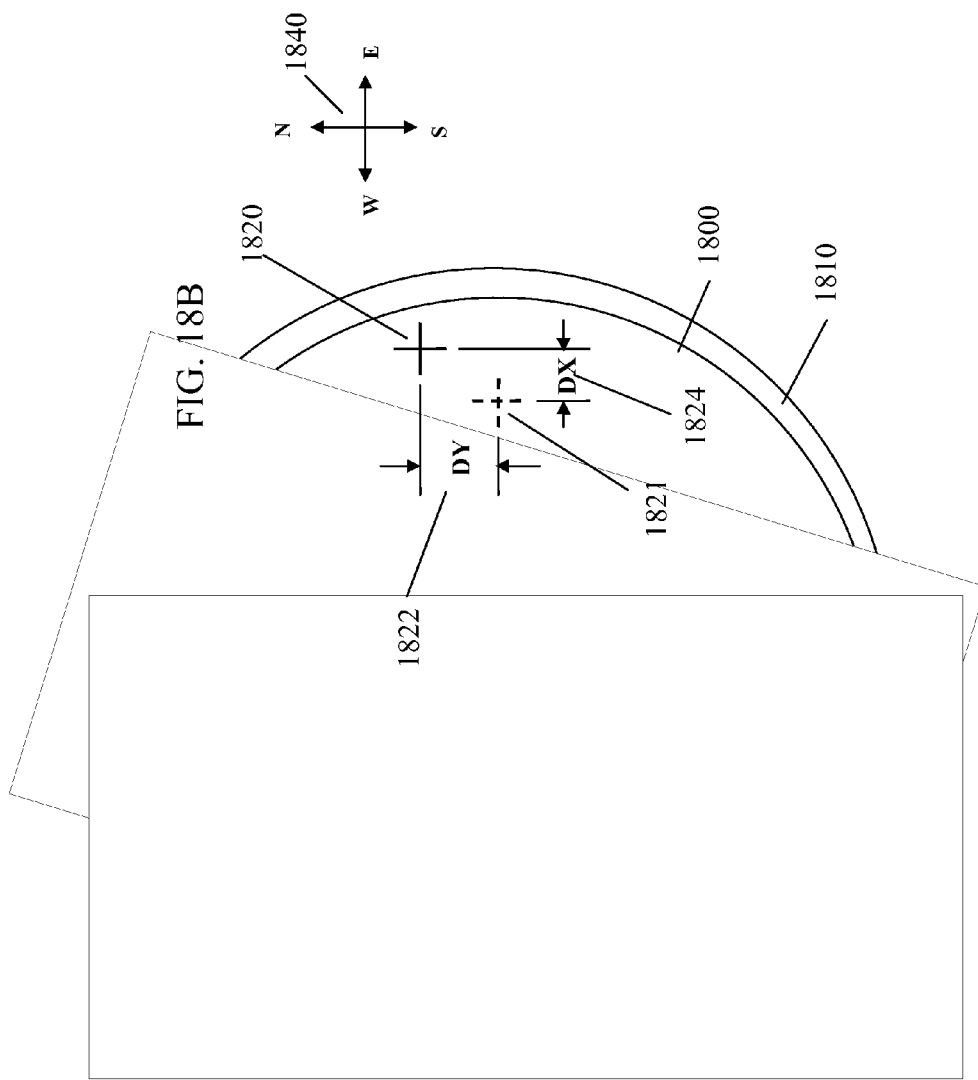

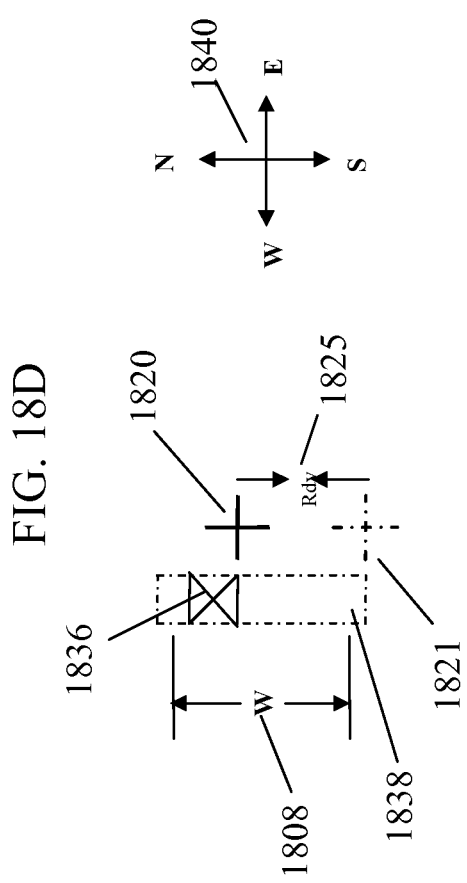

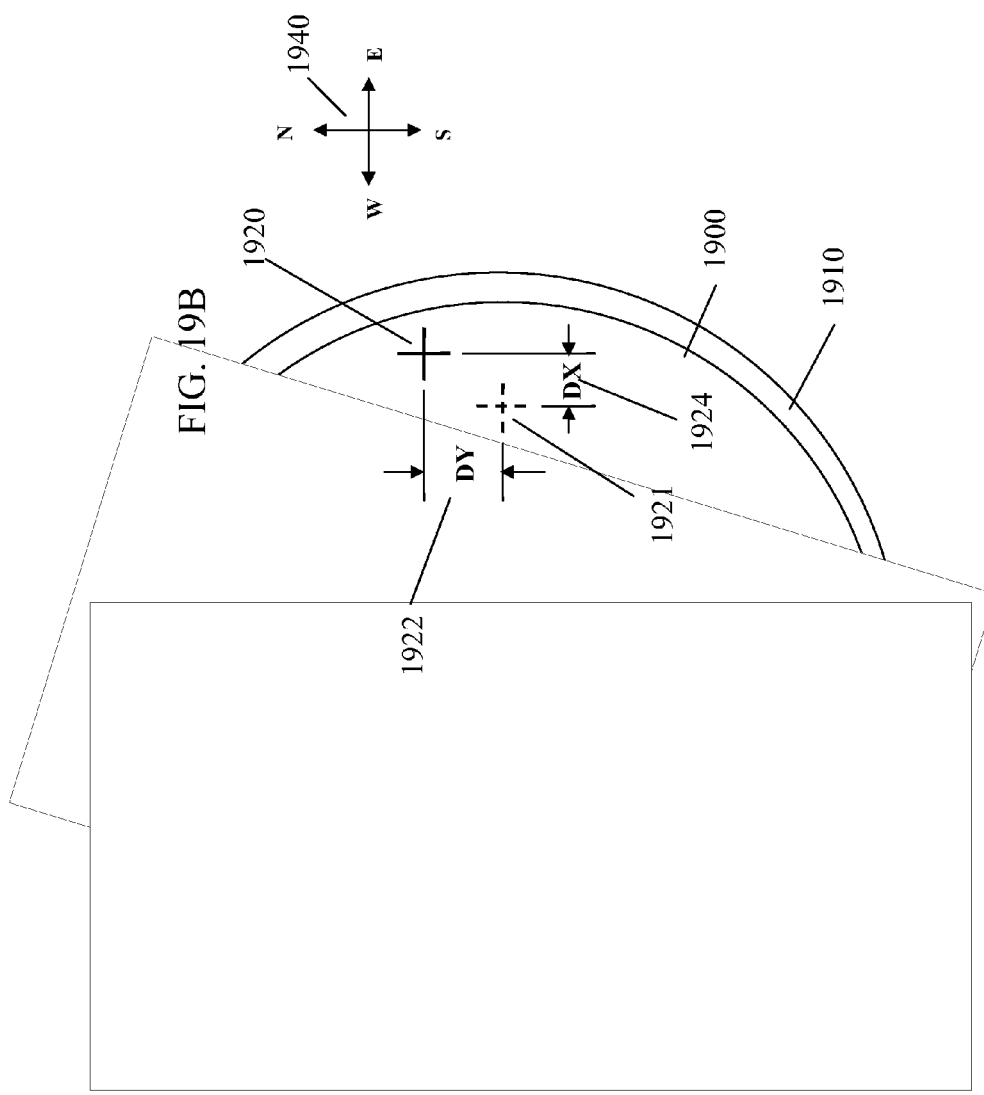

2202

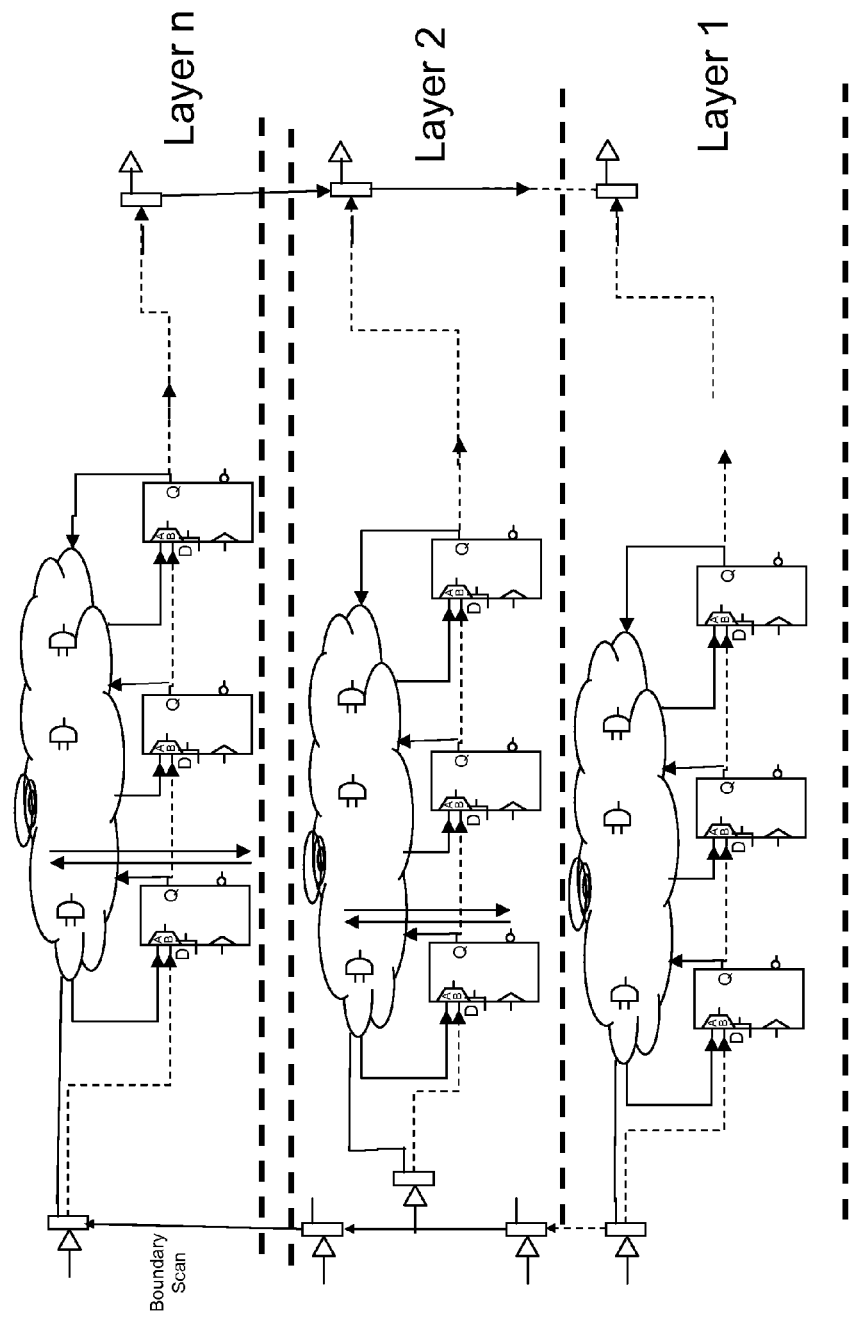

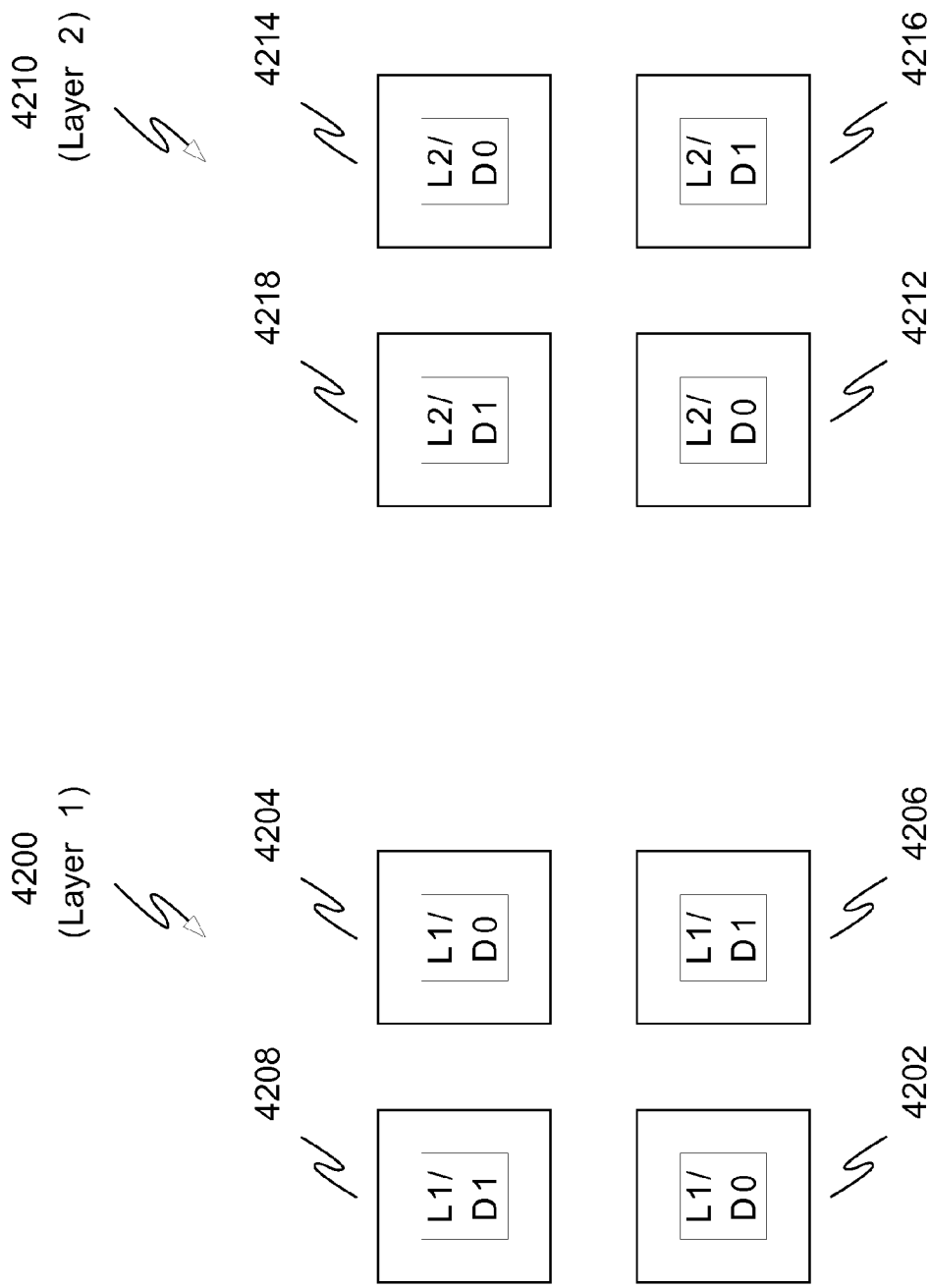

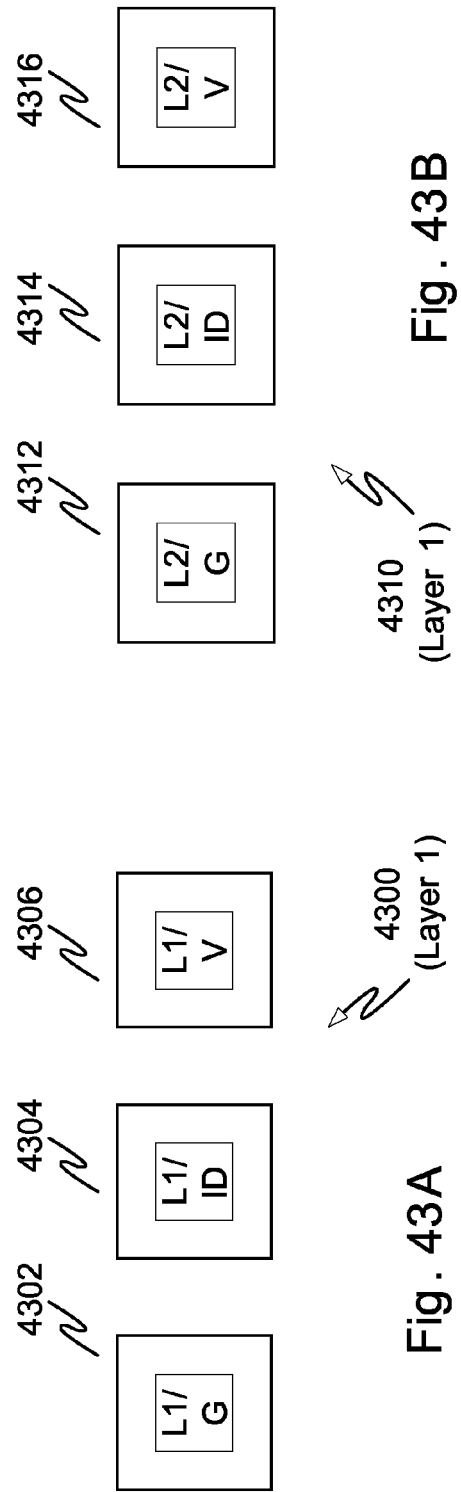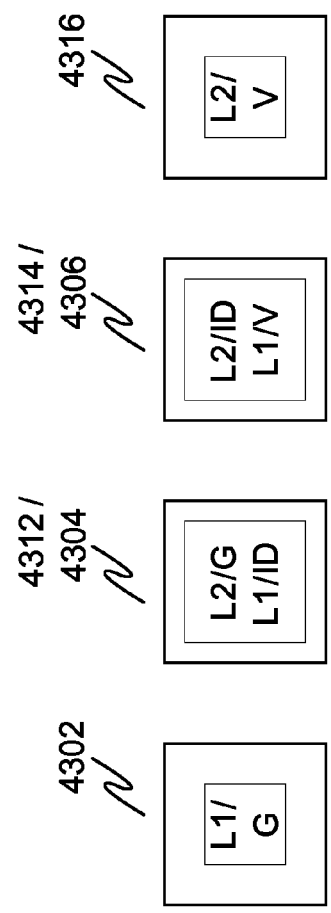

METHOD TO CONSTRUCT A 3D SEMICONDUCTOR DEVICE

BACKGROUND OF THE INVENTION

1. Field of the Invention

This application is continuation of U.S. application Ser. No. 12/951,924.

2. Background

Three dimensional integrated circuits are known in the art, though the field is in its infancy with a dearth of commercial products. Many manufacturers sell multiple standard two dimensional integrated circuit (2DIC) devices in a single package known as a Multi-Chip Modules (MCM) or Multi-Chip Packages (MCP). Often these 2DICs are laid out horizontally in a single layer, like the Core 2 Quad microprocessor MCMs available from Intel Corporation of Santa Clara, Calif. In other products, the standard 2DICs are stacked vertically in the same MCP like in many of the moviNAND flash memory devices available from Samsung Electronics of Seoul, South Korea like the illustration shown in FIG. 9C. None of these products are true 3DICs.

Devices where multiple layers of silicon or some other semiconductor (where each layer comprises active devices and local interconnect like a standard 2DIC) are bonded together with Through Silicon Via (TSV) technology to form a true 3D IC have been reported in the literature in the form of abstract analysis of such structures as well as devices constructed doing basic research and development in this area. FIG. 9A illustrates an example in which Through Silicon Vias are constructed continuing vertically through all the layers creating a global interlayer connection. FIG. 9B provides an illustration of a 3D IC system in which a Through Silicon Via 404 is placed at the same relative location on the top and bottom of all the 3D IC layers creating a standard vertical interface between the layers.

Constructing future 3DICs will require new architectures and new ways of thinking. In particular, yield and reliability of extremely complex three dimensional systems will have to be addressed, particularly given the yield and reliability difficulties encountered in complex Application Specific Integrated Circuits (ASIC) built in recent deep submicron process generations.

Fortunately, current testing techniques will likely prove applicable to 3D IC manufacturing, though they will be applied in very different ways. FIG. 28 illustrates a prior art set scan architecture in a 2D IC ASIC 2800. The ASIC functionality is present in logic clouds 2820, 2822, 2824 and 2826 which are interspersed with sequential cells like, for example, pluralities of flip-flops indicated at 2812, 2814 and 2816. The ASIC 2800 also has input pads 2830 and output pads 2840. The flip-flops are typically provide with circuitry to allow them to function as a shift register in a test mode. In FIG. 28 the flip-flops form a scan register chain where pluralities of flip-flops 2812, 2814 and 2816 are coupled together in series with Scan Test Controller 2810. One scan chain is shown in FIG. 28, but in a practical design comprising millions of flip-flops many sub-chains will be used.

In the test architecture of FIG. 28, test vectors are shifted into the scan chain in a test mode. Then the part is placed into operating mode for one or more clock cycles, after which the contents of the flip-flops are shifted out and compared with the expected results. This provides an excellent way to isolate errors and diagnose problems, though the number of test vectors in a practical design can be very large and an external tester is often required.

FIG. 29 shows a prior art boundary scan architecture in exemplary ASIC 2900. The part functionality is shown in logic function block 2910. The part also has a variety of input/output cells 2920, each comprising a bond pad 2922, an input buffer 2924, and a tri-state output buffer 2926. Boundary Scan Register Chains 2932 and 2934 are shown coupled in series with Scan Test Control block 2930. This architecture operates in a similar manner as the set scan architecture of FIG. 28. Test vectors are shifted in, the part is clocked, and the results are then shifted out to compare with expected results. Typically, set scan and boundary scan are used together in the same ASIC to provide complete test coverage.

FIG. 30 shows a prior art Built-In Self Test (BIST) architecture for testing a logic block 3000 which comprises a core block function 3010 (what is being tested), inputs 3012, outputs 3014, a BIST Controller 3020, an input Linear Feedback Shift Register (LFSR) 3022, and an output Cyclical Redundancy Check (CRC) circuit 3024. Under control of BIST Controller 3020, LFSR 3022 and CRC 3024 are seeded (set to a known starting value), the block 3000 is clocked a predetermined number of times with LFSR 3022 presenting pseudo-random test vectors to the inputs of Block Function 3010 and CRC 3024 monitoring the outputs of Block Function 3010. After the predetermined number of clocks, the contents of CRC 3024 are compared to the expected value (or signature). If the signature matches, block 3000 passes the test and is deemed good. This sort of testing is good for fast "go" or "no go" testing as it is self-contained to the block being tested and does not require storing a large number of test vectors or use of an external tester. BIST, set scan, and boundary scan techniques are often combined in complementary ways on the same ASIC. A detailed discussion of the theory of LSFRs and CRCs can be found in Digital Systems Testing and Testable Design, by Abramovici, Breuer and Friedman, Computer Science Press, 1990, pp 432-447.

Another prior art technique that is applicable to the yield and reliability of 3DICs is Triple Modular Redundancy. This is a technique where the circuitry is instantiated in a design in triplicate and the results are compared. Because two or three of the circuit outputs are always in agreement (as is the case with binary signals) voting circuitry (or majority-of-three or MAJ3) takes that as the result. While primarily a technique used for noise suppression in high reliability or radiation tolerant systems in military, aerospace and space applications, it also can be used as a way of masking errors in faulty circuits since if any two of three replicated circuits are functional the system will behave as if it is fully functional. A discussion of the radiation tolerant aspects of Triple Modular Redundancy systems, Single Event Effects (SEE), Single Event Upsets (SEU) and Single Event Transients (SET) can be found in U.S. Patent Application Publication 2009/0204933 to Rezgui ("Rezgui").

SUMMARY

In one aspect, a 3D IC programmable system includes a first programmable layer of tiles; a second programmable layer of tiles overlaying the first programmable layer of tiles; a redundancy layer of tiles overlaying the first or second programmable layer of tiles; and programmable connections coupling the first and second programmable layers of tiles and the redundancy layer.

In another aspect, a wafer includes a group of tiles of programmable logic formed thereon, wherein each tile comprises a micro control unit (MCU) communicating with adjacent MCUs, and wherein each MCU is controlled in a predetermined order of priority by adjacent MCUs; and dice lines on the wafer to separate the group into one or more end-devices.

In yet another aspect, a semiconductor device includes a first transistor layer; and a second transistor layer overlaying the first transistor layer, wherein said first transistor layer comprises a plurality of flip-flops each having a selectively coupleable additional input generated by said second transistor layer.

In a further aspect, a semiconductor device includes a first transistor layer; and a second transistor layer overlaying the first transistor layer, wherein said first transistor layer comprises a plurality of sequential cells according to a net-list, and wherein each sequential cell has an output coupled to logic circuits comprising transistors of second transistor layer.

In another aspect, a semiconductor device includes a first transistor layer, a second transistor layer overlaying the first transistor layer, and metal interconnect to form a logic circuit comprising transistors of said second transistor layer, wherein said metal interconnect is defined by direct-write-ebeam.

Implementations of the above aspects may include one or more of the following. The selectively coupleable additional input can be a multiplexer. A programmable element can be provided to control said multiplexer. A controller can perform testing of a portion of said device. A signal can be connected from each of said flip-flop outputs to the second transistor layer. Logic circuits comprising transistors of the first transistor layer can be selectively replaceable by logic circuits comprising transistors of the second transistor layer. A plurality of circuits each can perform a comparison between a signal generated by transistors of the first transistor layer and a signal generated by transistors of the second transistor layer. A plurality of sequential cells can be provided according to a net-list, wherein each sequential cell has an extra signal from its output coupled to a logic circuit comprising transistors of second transistor layer.

In another aspect, a method to construct a semiconductor device, the method comprising: forming a first mono-crystallized semiconductor layer; forming a second mono-crystallized semiconductor layer comprising mono-crystallized semiconductor transistors; wherein said second mono-crystallized semiconductor layer overlays said first mono-crystallized semiconductor layer, wherein said first mono-crystallized semiconductor layer comprises an alignment mark and said transistors are aligned to said alignment mark, and wherein said first mono-crystallized semiconductor layer comprises logic circuits, and connecting said logic circuits to an external device using input/output (I/O) circuits, said input/output (I/O) circuits are constructed on said second mono-crystallized semiconductor layer.

In another aspect, a method to construct a semiconductor device, the method comprising: forming a first mono-crystallized semiconductor layer; forming a second mono-crystallized semiconductor layer comprising mono-crystallized semiconductor transistors; wherein said second mono-crystallized semiconductor layer overlays said first mono-crystallized semiconductor layer, wherein said first mono-crystallized semiconductor layer comprises logic circuits, and connecting said logic circuits to an external device using input/output (I/O) circuits, said input/output (I/O) circuits are constructed on said second mono-crystallized semiconductor layer, wherein said input/output (I/O) circuits comprise a SerDes circuit.

In another aspect, a method to construct a semiconductor device, the method comprising: forming a first mono-crystallized semiconductor layer; forming a second mono-crystallized semiconductor layer comprising mono-crystallized semiconductor transistors; wherein said second mono-crystallized semiconductor layer overlays said first mono-crystallized semiconductor layer, wherein said first mono-crystallized semiconductor layer comprises an alignment mark and said transistors are aligned to said alignment mark, wherein said transistors are connected to form second logic circuits, and wherein said second logic circuits comprise a scan chain.

BRIEF DESCRIPTION OF THE DRAWINGS

FIG. 2 illustrates a cross section of a prior art antifuse programming transistor.

FIG. 18B illustrates donor and receptor wafer alignment in the alignment reduction scheme of FIG. 18A.

FIG. 18D illustrates an inter-wafer via contact landing area in the alignment reduction scheme of FIG. 18A.

FIG. 19B illustrates donor and receptor wafer alignment in the alignment reduction scheme of FIG. 19A.

FIG. 24B illustrates boundary scan and set scan chains of the 3D IC of FIG. 24A.

FIG. 43A illustrates a third via metal overlap pattern according to the present invention.

FIG. 43B illustrates a fourth via metal overlap pattern according to the present invention.

FIG. 43C illustrates the alignment of the via metal overlap patterns of FIGS. 43A and 43B in a 3DIC according to the present invention.

DETAILED DESCRIPTION OF THE INVENTION

Figure 1:
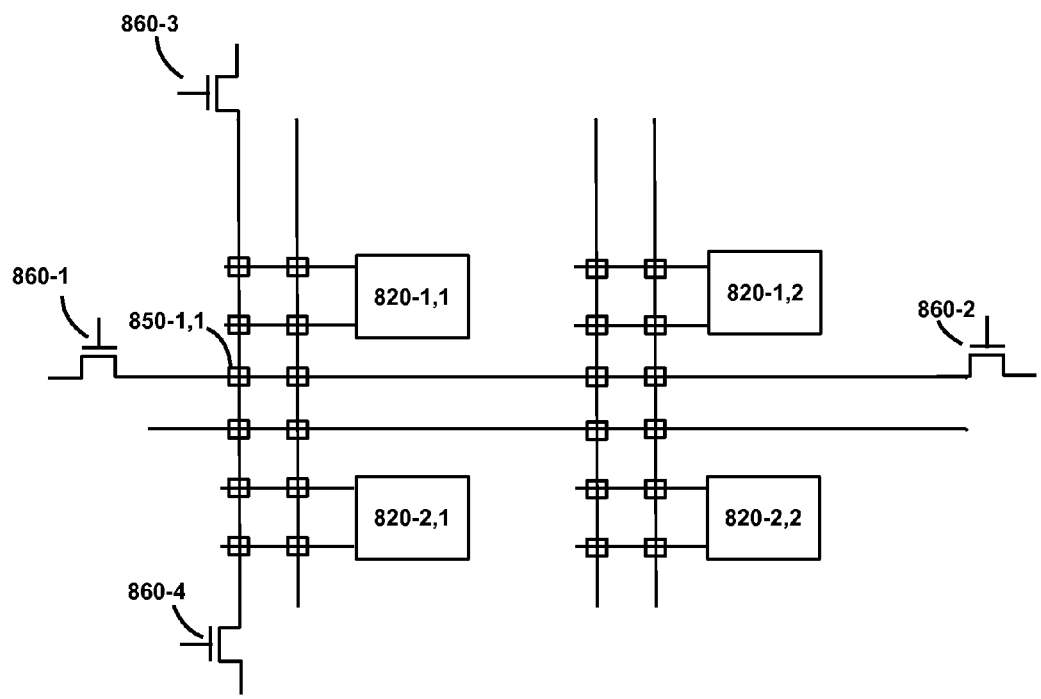
FIG. 1 illustrates a prior art antifuse programming circuit.

Embodiments of the present invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the spirit of the appended claims.

FIG. 1 illustrates a circuit diagram illustration of a prior art, where, for example, 860-1 to 860-4 are the programming transistors to program Antifuse ("AF") 850-1,1.

FIG. 2 is a cross-section illustration of a portion of a prior art represented by the circuit diagram of FIG. 1 showing the programming transistor 860-1 built as part of the silicon substrate.

Figure 3A:
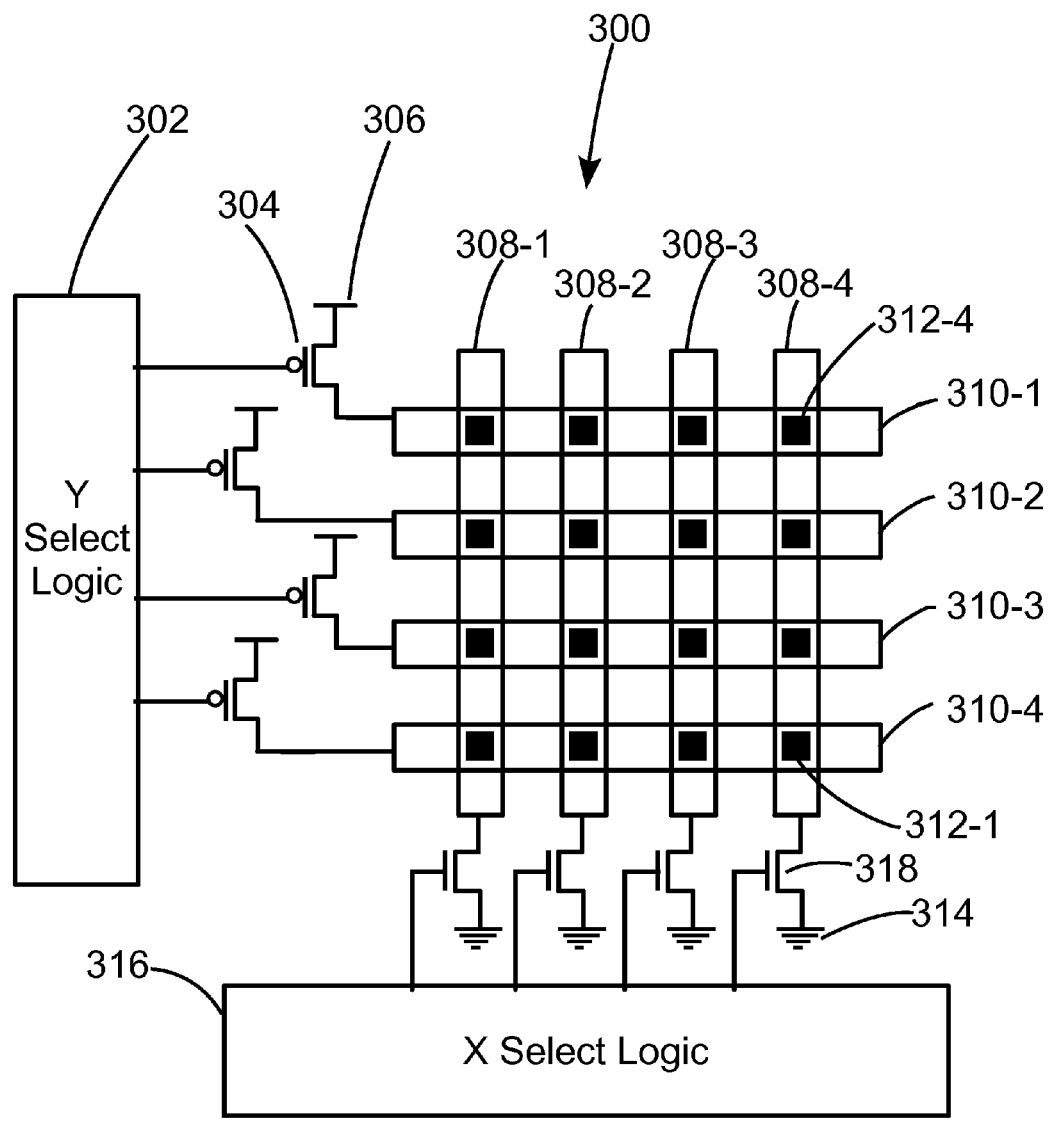
FIG. 3A illustrates a programmable interconnect tile using antifuses.

FIG. 3A is a drawing illustration of the principle of programmable (or configurable) interconnect tile 300 using Antifuse. Two consecutive metal layers have orthogonal arrays of metal strips, 310-1, 310-2, 310-3, 310-4 and 308-1, 308-2, 308-3, 308-4. AFs are present in the dielectric isolation layer between two consecutive metal layers at crossover locations between the perpendicular traces, e.g., 312-1, 312-4. Normally the AF starts in its isolating state, and to program it so the two strips 310-1 and 308-4 will connect, one needs to apply a relatively high programming voltage 306 to strip 310-1 through programming transistor 304, and ground 314 to strip 308-4 through programming transistor 318. This is done by applying appropriate control pattern to Y decoder 302 and X decoder 316, respectively. A typical programmable connectivity array tile will have up to a few tens of metal strips to serve as connectivity for a Logic Block ("LB") described later.

Figure 3B:
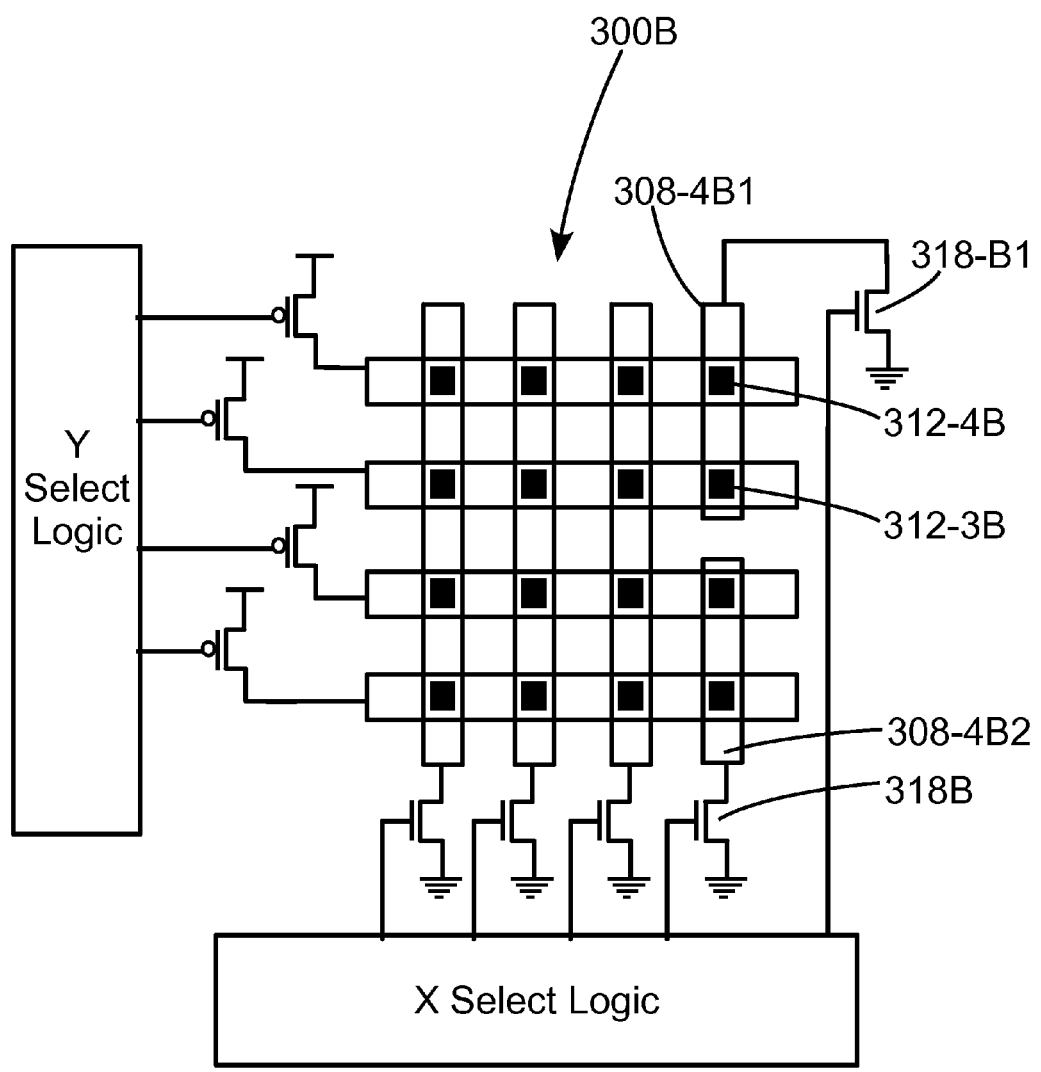
FIG. 3B illustrates a programmable interconnect tile with a segmented routing line.

One should recognize that the regular pattern of FIG. 3A often needs to be modified to accommodate specific needs of the architecture. FIG. 3B describes a routing tile 300B where one of the full-length strips was partitioned into shorter sections 308-4B1 and 308-4B2. This allows, for example, for two distinct electrical signals to use a space assigned to a single track and is often used when LB input and output ("I/O") signals need to connect to the routing fabric. Since Logic Block may have 10-20 (or even more) I/O pins, using a full-length strip wastes a significant number of available tracks. Instead, splitting of strips into multiple section is often used to allow I/O signals to connect to the programmable interconnect using at most two, rather than four, AFs 312-3B, 312-4B, and hence trading access to routing tracks with fabric size. Additional penalty is that multiple programming transistors, 318-B and 318-B1 in this case instead of just 318-B, and additional decoder outputs, are needed to accommodate the multiplicity of fractional strips. Another use for fractional strips may be to connect to tracks from another routing hierarchy, e.g., longer tracks, or for bringing other special signals such as local clocks, local resets, etc., into the routing fabric.

Unlike prior art for designing Field Programmable Gate Array ("FPGA"), the current invention suggests constructing the programming transistors and much or all of the programming circuitry at a level above the one where the functional diffusion level circuitry of the FPGA resides, hereafter referred to as an "Attic.". This provides an advantage in that the technology used for the functional FPGA circuitry has very different characteristics from the circuitry used to program the FPGA. Specifically, the functional circuitry typically needs to be done in an aggressive low-voltage technology to achieve speed, power, and density goals of large scale designs. In contrast, the programming circuitry needs high voltages, does not need to be particularly fast because it operates only in preparation of the actual in-circuit functional operation, and does not need to be particularly dense as it needs only on the order of 2N transistors for N*N programmable AFs. Placing the programming circuitry on a different level from the functional circuitry allows for a better design tradeoff than placing them next to each other. A typical example of the cost of placing both types of circuitry next to each other is the large isolation space between each region because of their different operating voltage. This is avoided in the case of placing programming circuitry not in the base (i.e., functional) silicon but rather in the Attic above the functional circuitry.

It is important to note that because the programming circuitry imposes few design constraints except for high voltage, a variety of technologies such as Thin Film Transistors ("TFT"), Vacuum FET, bipolar transistors, and others, can readily provide such programming function in the Attic.

A possible fabrication method for constructing the programming circuitry in an Attic above the functional circuitry on the base silicon is by bonding a programming circuitry wafer on top of functional circuitry wafer using Through Silicon Vias. Other possibilities include layer transfer using ion implantation (typically but not exclusively hydrogen), spraying and subsequent doping of amorphous silicon, carbon nano-structures, and similar. The key that enables the use of such techniques, that often produce less efficient semiconductor devices in the Attic, is the absence of need for high performance and fast switching from programming transistors. The only major requirement is the ability to withstand relatively high voltages, as compared with the functional circuitry.

Another advantage of AF-based FPGA with programming circuitry in an Attic is a simple path to low-cost volume production. One needs simply to remove the Attic and replace the AF layer with a relatively inexpensive custom via or metal mask.

Another advantage of programming circuitry being above the functional circuitry is the relatively low impact of the vertical connectivity on the density of the functional circuitry. By far, the overwhelming number of programming AFs resides in the programmable interconnect and not in the Logic Blocks. Consequently, the vertical connections from the programmable interconnections need to go upward towards the programming transistors in the Attic and do not need to cross downward towards the functional circuitry diffusion area, where dense connectivity between the routing fabric and the LBs occurs, where it would incur routing congestion and density penalty.

Figure 4A:
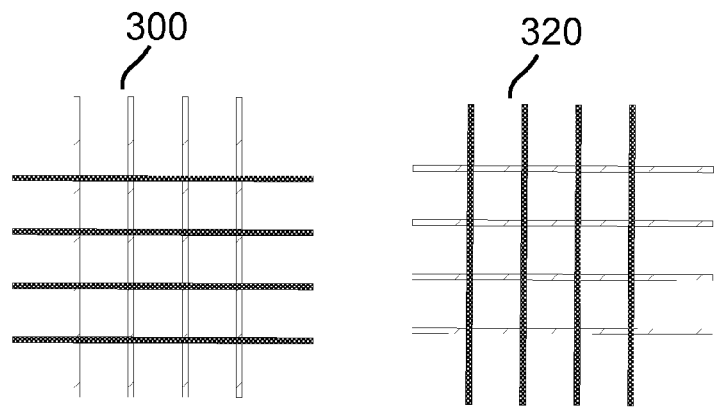
FIG. 4A illustrates two routing tiles.
Figure 4B:
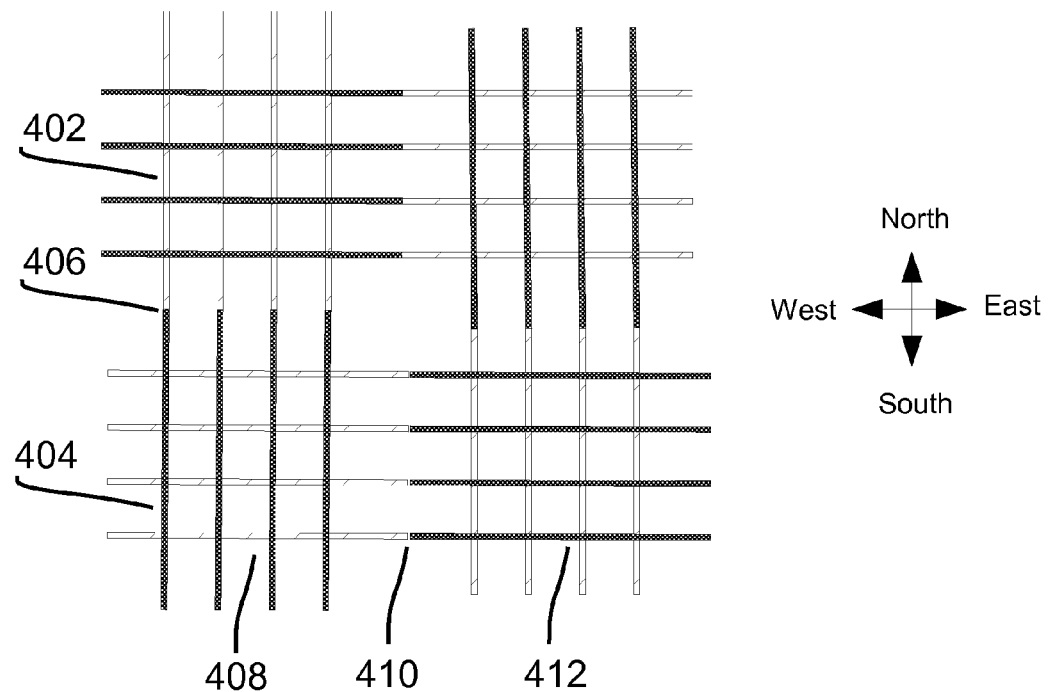
FIG. 4B illustrates an array of four routing tiles.

FIG. 4A is a drawing illustration of a routing tile 300 similar to that in FIG. 3A, where the horizontal and vertical strips are on different but adjacent metal layers. Tile 320 is similar to 300 but rotated 90 degrees. When larger routing fabric is constructed from individual tiles, we need to control signal propagation between tiles. This can be achieved by stitching the routing fabric from same orientation tiles (as in either 300 or 320 with bridges such as 701A or 701VV, described later, optionally connecting adjacent strips) or from alternating orientation tiles, such as illustrated in FIG. 4B. In that case the horizontal and vertical tracks alternate between the two metals such as 402 and 404, or 408 and 412, with AF present at each overlapping edge such as 406 and 410. When a segment needs to be extended its edge AF 406 (or 410) is programmed to conduct, whereas by default each segment will span only to the edge of its corresponding tile. Change of signal direction, such as vertical to horizontal (or vice versa) is achieved by programming non-edge AF such as 312-1 of FIG. 3A.

Logic Blocks are constructed to implement programmable logic functions. There are multiple ways of constructing LBs that can be programmed by AFs. Typically LBs will use low metal layers such as metal 1 and 2 to construct its basic functions, with higher metal layers reserved for the programmable routing fabric.

Figure 5A:
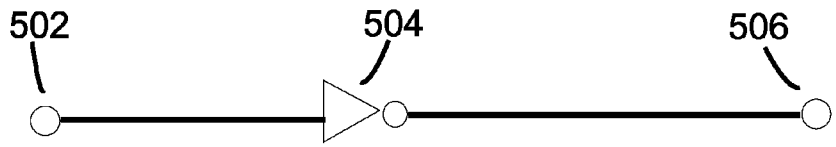
FIG. 5A illustrates an inverter.
Figure 5B:
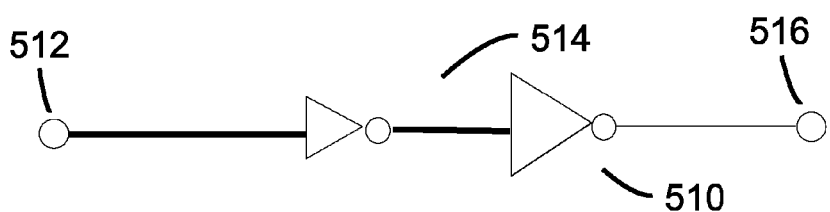
FIG. 5B illustrates a buffer.
Figure 5C:
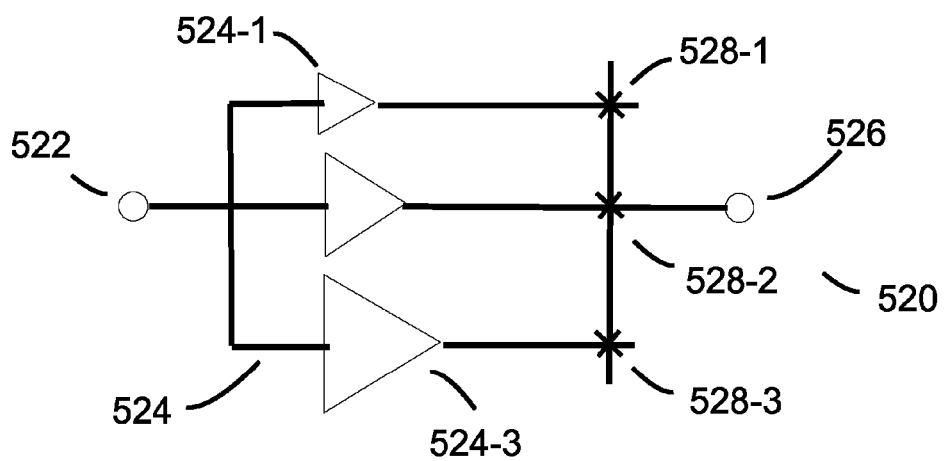
FIG. 5C illustrates a variable drive buffer.

Each logic block needs to be able to drive its outputs onto the programmable routing. FIG. 5A illustrates an inverter 504 (with input 502 and output 506) that can perform this function with logical inversion. FIG. 5B describes two inverters configured as a non-inverting buffer 514 (with input 512 and output 516) made of variable size inverters 510. Such structures can be used to create a variable-drive buffer 520 illustrated in FIG. 5C (with input 522 and output 526), where programming AFs 528-1, 528-2, and 528-3 will be used to select the varying sized buffers such as 524-1 or 524-3 to drive their output with customized strength onto the routing structure. A similar (not illustrated) structure can be implemented for programmable strength inverters.

Figure 5D:
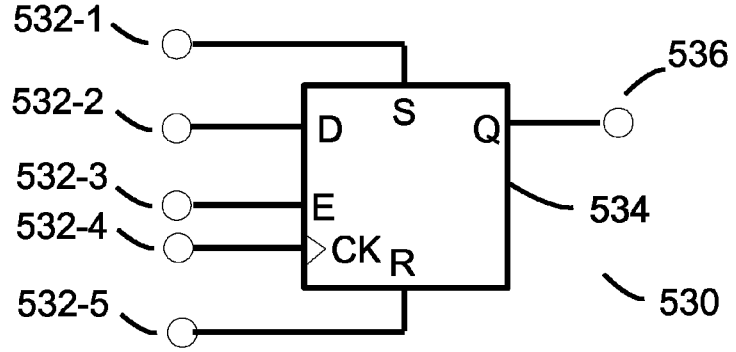
FIG. 5D illustrates a flip-flop.

FIG. 5D is a drawing illustration of a flip flop ("FF") 530 with its input 532-2, output 536, and typical control signals 532-1, 532-3, 532-4 and 532-5. AFs can be used to connect its inputs, outputs, and controls, to LB-internal signals, or to drive them to and from the programmable routing fabric.

Figure 6:
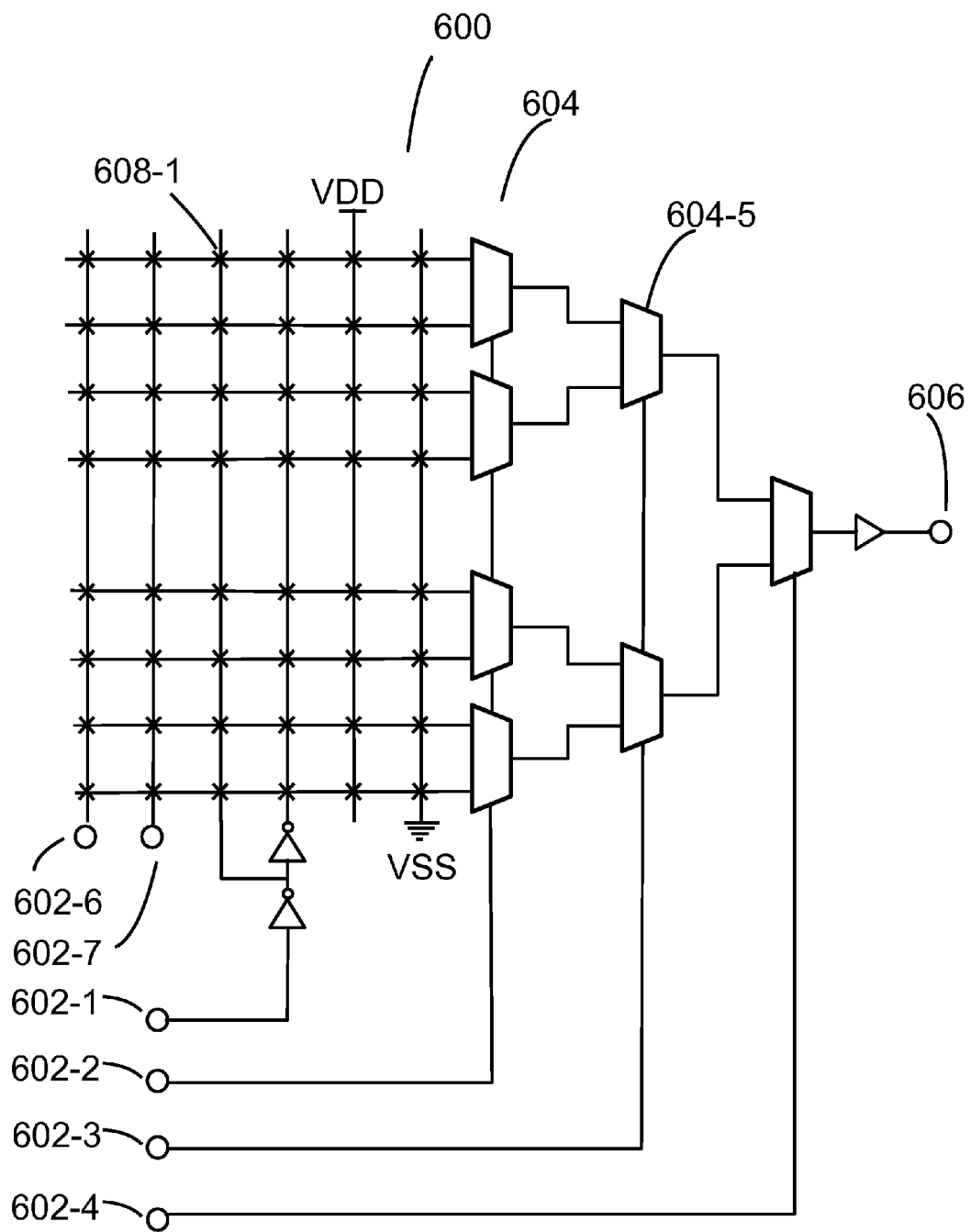
FIG. 6 illustrates a four input look up table logic module.

FIG. 6 is a drawing illustration of one possible implementation of a four input lookup table 600 ("LUT4") that can implement any combinatorial function of 4 inputs. The basic structure is that of a 3-level 8:1 multiplexer tree 604 made of 2:1 multiplexers 604-5 with output 606 controlled by 3 control lines 602-2, 602-3, 602-4, where each of the 8 inputs to the multiplexer is defined by AFs 608-1 and can be VSS, VDD, or the fourth input 602-1 either directly or inverted. The programmable cell of FIG. 6 may comprise additional inputs 602-6, 602-7 with additional 8 AFs for each input to allow some functionality in addition to just LUT4. Such function could be a simple select of one of the extra input 602-6 or 602-7 or more complex logic comprising the extra inputs.

Figure 6A:
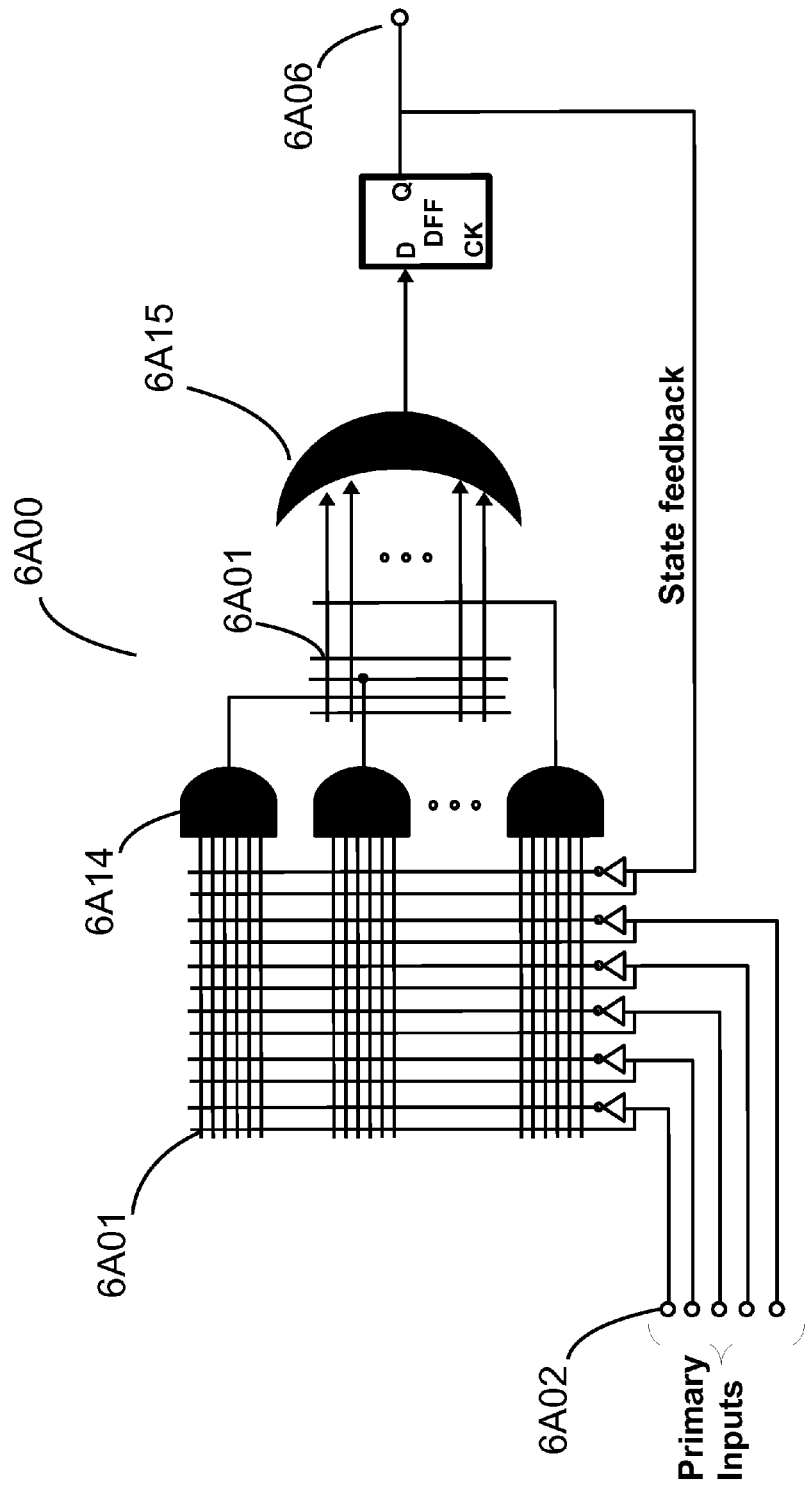
FIG. 6A illustrates a programmable logic array module.

FIG. 6A is a drawing illustration of another common universal programmable logic primitive, the Programmable Logic Array 6A00 ("PLA"). Similar structures are sometimes known as Programmable Logic Device ("PLD") or Programmable Array Logic ("PAL"). It comprises of a number of wide AND gates such as 6A14 that are fed by a matrix of true and inverted primary inputs 6A02 and a number of state variables. The actual combination of signals fed to each AND is determined by programming AFs such as 6A01. The output of some of the AND gates is selected—also by AF—through a wide OR gate 6A15 to drive a state FF with output 6A06 that is also available as an input to 6A14.

Figure 7:
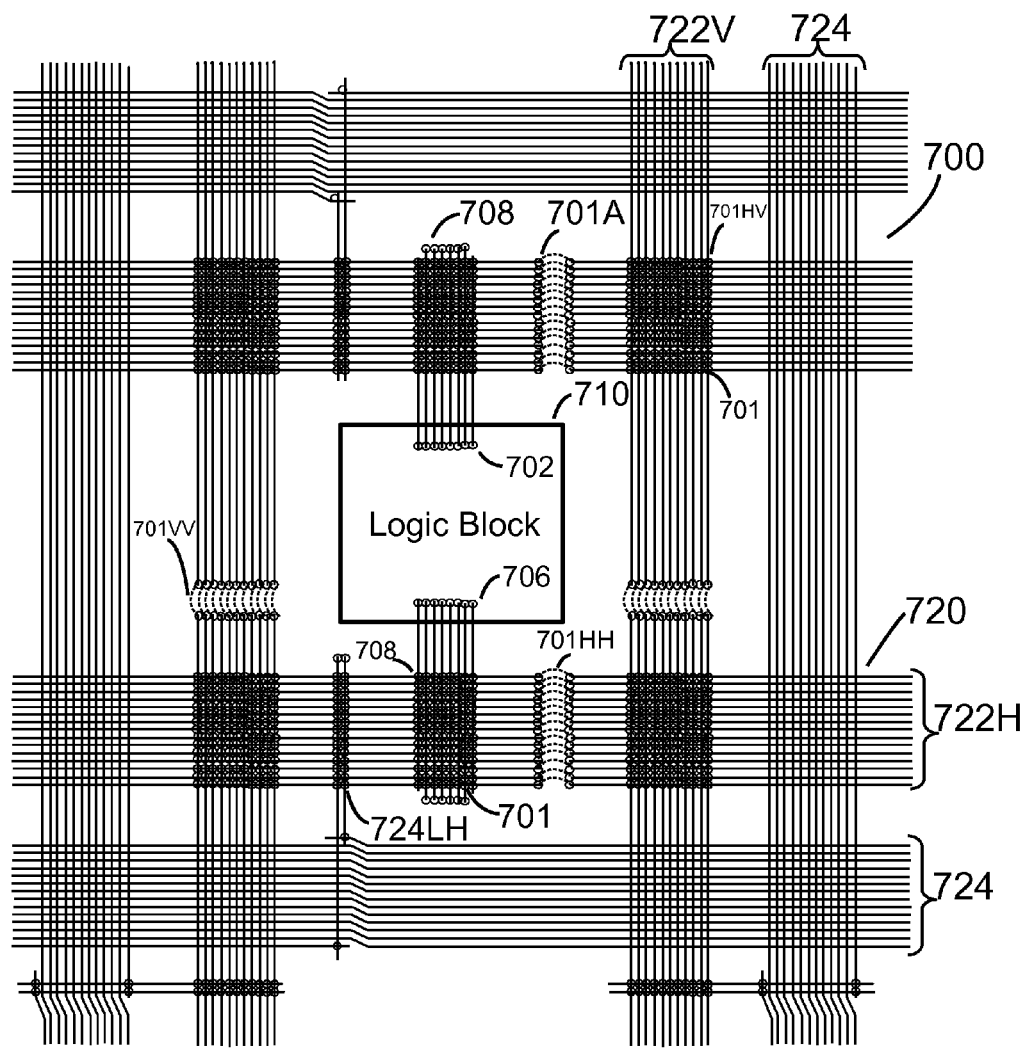
FIG. 7 illustrates an antifuse-based FPGA tile.

Antifuse-programmable logic elements such as described in FIGS. 5A-D, 6, and 7, are just representative of possible implementation of Logic Blocks of an FPGA. There are many possible variations of tying such element together, and connecting their I/O to the programmable routing fabric. The whole chip area can be tiled with such logic blocks logically embedded within programmable fabric 700 as illustrated in FIG. 7. Alternately, a heterogeneous tiling of the chip area is possible with LBs being just one possible element that is used for tiling, other elements being selected from memory blocks, Digital Signal Processing ("DSP") blocks, arithmetic elements, and many others.

FIG. 7 is a drawing illustration of an example Antifuse-based FPGA tiling 700 as mentioned above. It comprises of LB 710 embedded in programmable routing fabric 720. The LB can include any combination of the components described in FIGS. 5A-D and 6-6A, with its inputs and outputs 702 and 706. Each one of the inputs and outputs can be connected to short horizontal wires such as 722H by an AF-based connection matrix 708 made of individual AFs such as 701. The short horizontal wires can span multiple tiles through activating AF-based programming bridges 701HH and 701A. These programming bridges are constructed either from short strips on adjacent metal layer in the same direction as the main wire and with an AF at each end of the short strip, or through rotating adjacent tiles by 90 degree as illustrated in FIG. 4B and using single AF for bridging. Similarly, short vertical wires 722V can span multiple tiles through activating AF-based programming bridges 701VV. Change of signal direction from horizontal to vertical and vice versa can be achieved through activating AFs 701 in connection matrices like 701HV. In addition to short wires the tile also includes long horizontal and vertical wires 724. These wires span multiple cells and only a fraction of them is accessible to the short wires in a given tile through AF-based connection 724LH.

The depiction of the AF-based programmable tile above is just one example, and other variations are possible. For example, nothing limits the LB from being rotated 90 degrees with its inputs and outputs connecting to short vertical wires instead of short horizontal wires, or providing access to multiple long wires 724 in every tile.

Figure 8:
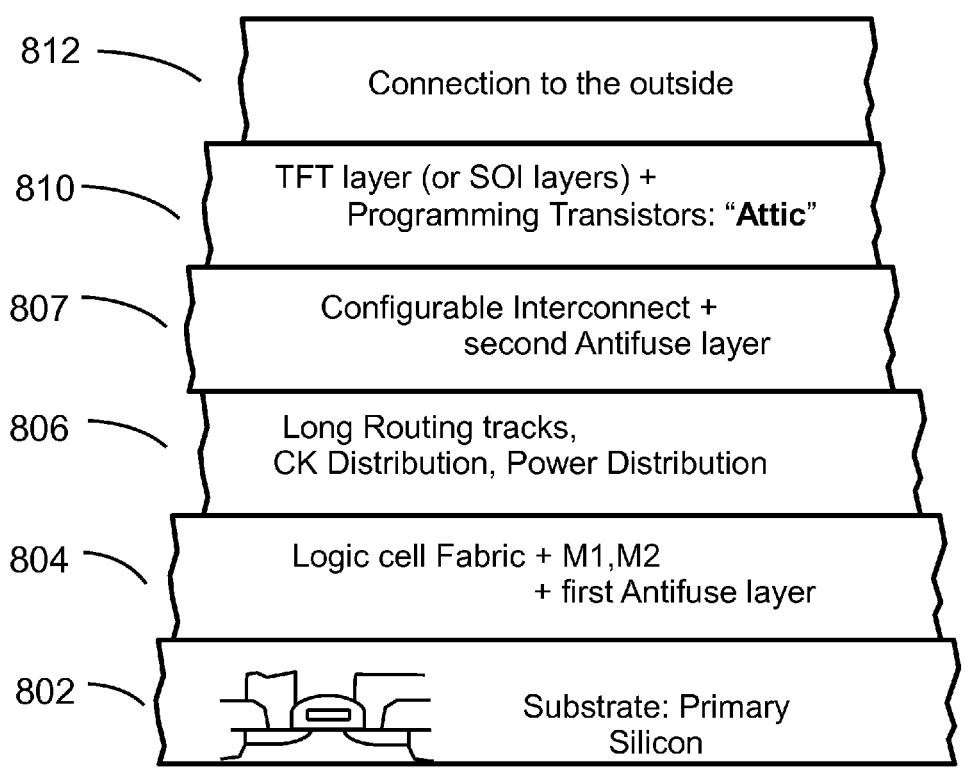
FIG. 8 illustrates a first 3D IC according to the present invention.

FIG. 8 is a drawing illustration of alternative implementation of the current invention, with AFs present in two dielectric layers. Here the functional transistors of the Logic Blocks are defined in the logic substrate 802, with low metal layers 804 (M1 & M2 in this depiction, can be more as needed) providing connectivity for the definition of the LB. AFs are present in select locations between metal layers of 804 to assist in finalizing the function of the LB. AFs in 804 can also serve to conFIG. clocks and other special signals (e.g., reset) present in layers 806 for connection to the LB and other special functions that do no require high density programmable connectivity to the configurable fabric 807. Additional AF use can be to power on used LBs and unpower unused ones to save on power dissipation of the device.

On top of layer 806 comes configurable interconnect 807 with a second Antifuse layer. This connectivity is done similarly to the way depicted in FIG. 7 typically occupying two or four metal layers. Programming of AFs in both layers is done with programming circuitry designed in an Attic TFT layer 810, or other alternative over the oxide transistors, placed on top of 807 similarly to what was described previously. Finally, additional metals layers 812 are deposited on top of 810 to complete the programming circuitry in 810, as well as provide connections to the outside for the FPGA.

The advantage of this alternative implementation is that two layers of AFs provide increased programmability (and hence flexibility) for FPGA, with the lower AF layer close to the base substrate where LB configuration needs to be done, and the upper AF layer close to the metal layers comprising the configurable interconnect.

U.S. Pat. Nos. 5,374,564 and 6,528,391, describe the process of Layer Transfer whereby a few tens or hundreds nanometer thick layer of mono crystalline silicon from "donor" wafer is transferred on top of a base wafer using oxide-oxide bonding and ion implantation. Such a process, for example, is routinely used in the industry to fabricate the so-called Silicon-on-Insulator ("SOI") wafers for high performance integrated circuits ("IC"s).

Figure 8A:
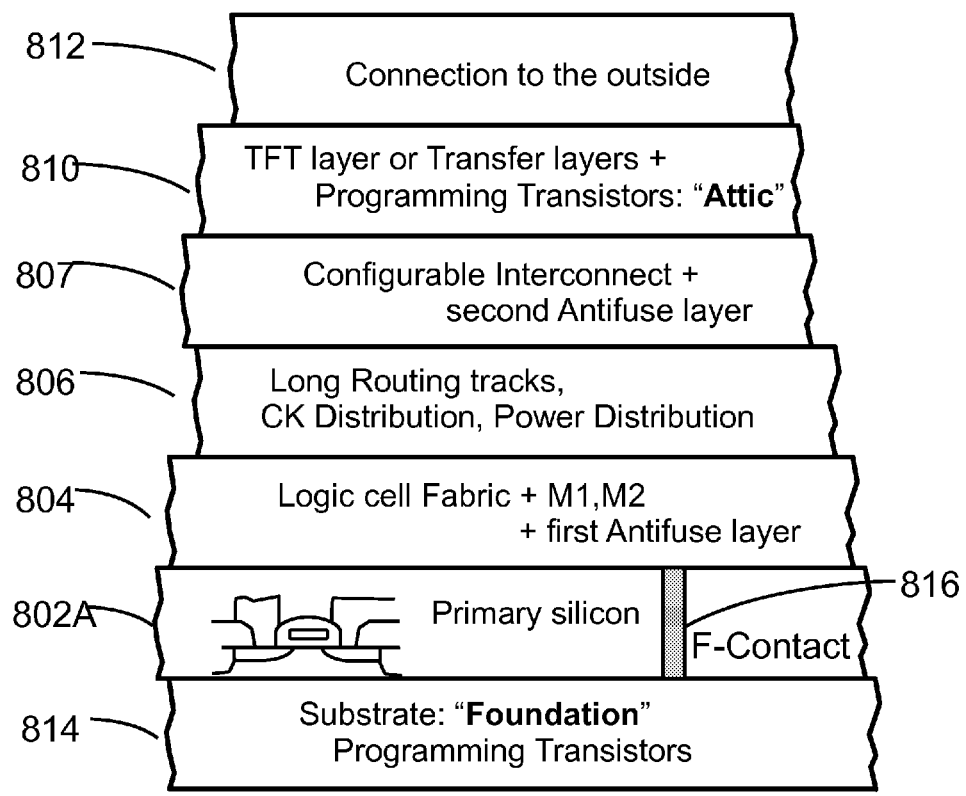
FIG. 8A illustrates a second 3D IC according to the present invention.

Yet another alternative implementation of the current invention is illustrated in FIG. 8A. It builds on the structure of FIG. 8, except that what was base substrate 802 in FIG. 8 is now a primary silicon layer 802A placed on top of an insulator above base substrate 814 using the abovementioned Layer Transfer process.

In contrast to the typical SOI process where the base substrate carries no circuitry, the current invention suggest to use base substrate 814 to provide high voltage programming circuits that will program the lower level 804 of AFs. We will use the term "Foundation" to describe this layer of programming devices, in contrast to the "Attic" layer of programming devices placed on top that has been previously described.

The major obstacle to using circuitry in the Foundation is the high temperature potentially needed for Layer Transfer, and the high temperature needed for processing the primary silicon layer 802A. High temperatures in excess of 400° C. that are often needed cause damage to pre-existing copper or aluminum metallization patterns that may have been previously fabricated in Foundation 814. U.S. Patent Application Publication 2009/0224364 proposes using tungsten-based metallization to complete the wiring of the relatively simple circuitry in the Foundation. Tungsten has very high melting temperature and can withstand the high temperatures that may be needed for both for Layer Transfer and for processing of primary silicon 802A. Because the Foundation provides mostly the programming circuitry for AFs in layer 804, its lithography can be less advanced and less expensive than that of the primary silicon 802A and facilitates fabrication of high voltage devices needed to program AFs. Further, the thinness and hence the transparency of the SOI layer facilitates precise alignment of patterning of layers 802A to the underlying patterning of 814

Having two layers of AF-programming devices, Foundation on the bottom and Attic on the top, is an effective way to architect AF-based FPGAs with two layers of AFs. The first AF layer 804 is close to the primary silicon 802 that it configures, and its connections to it and to the Foundation programming devices 814 are directed downwards. The second layer of AFs 807 has its programming connections directed upward towards Attic 810. This way the AF connections to its programming circuitry minimize routing congestion across layers 802, 804, 806, and 807.

Figure 9A:
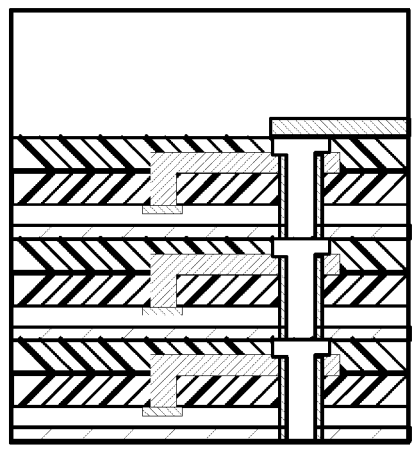
FIG. 9A illustrates a first prior art 3DIC.
Figure 9B:
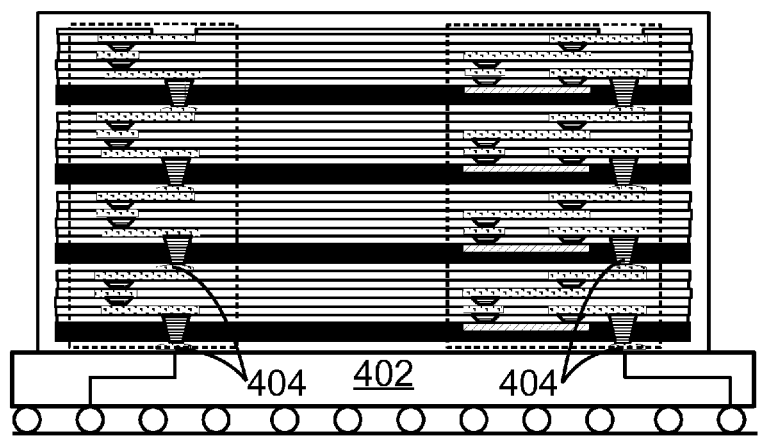
FIG. 9B illustrates a second prior art 3DIC.
Figure 9C:
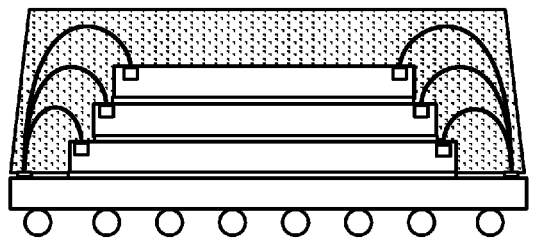
FIG. 9C illustrates a third prior art 3DIC.

FIGS. 9A through 9C illustrates prior art alternative configurations for three-dimensional ("3D") integration of multiple dies constructing IC system and utilizing Through Silicon Via. FIG. 9A illustrates an example in which the Through Silicon Via is continuing vertically through all the dies constructing a global cross-die connection. FIG. 9B provides an illustration of similar sized dies constructing a 3D system. 9B shows that the Through Silicon Via 404 is at the same relative location in all the dies constructing a standard interface.

FIG. 9C illustrates a 3D system with dies having different sizes. FIG. 9C also illustrates the use of wire bonding from all three dies in connecting the IC system to the outside.

Figure 10A:
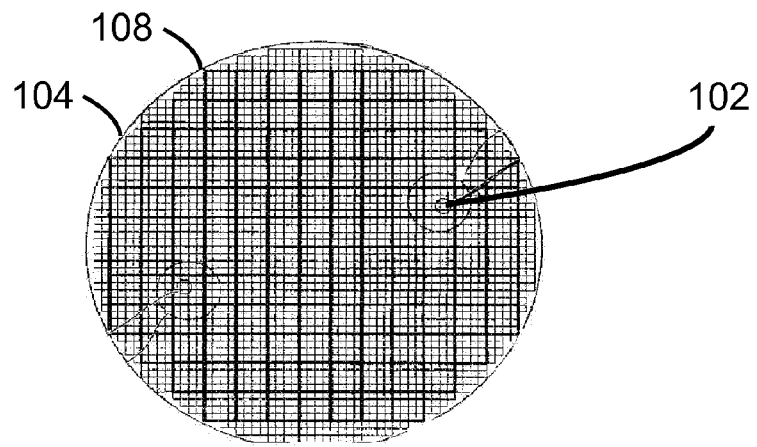
FIG. 10A illustrates a prior art continuous array wafer.
Figure 10B:
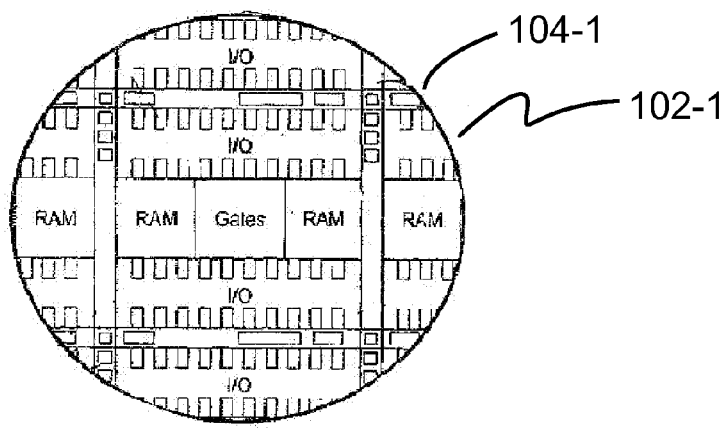
FIG. 10B illustrates a first prior art continuous array wafer tile.
Figure 10C:
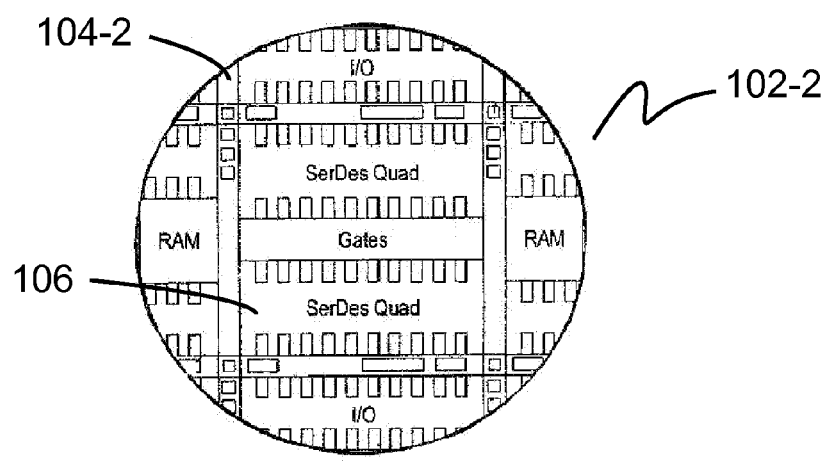
FIG. 10C illustrates a second prior art continuous array wafer tile.

FIG. 10A is a drawing illustration of a continuous array wafer of a prior art U.S. Pat. No. 7,337,425. The bubble 102 shows the repeating tile of the continuous array, 104 are the horizontal and vertical potential dicing lines (or dice lines). The tile 102 could be constructed as in FIG. 10B 102-1 with potential dicing line 104-1 or as in FIG. 10C with SerDes Quad 106 as part of the tile 102-2 and potential dicing lines 104-2.

In general, logic devices need varying amounts of logic, memory, and I/O. The continuous array ("CA") of U.S. Pat. No. 7,105,871 allows flexible definition of the logic device size, yet for any size the ratio between the three components remained fixed, barring minor boundary effect variations. Further, there exist other types of specialized logic that are difficult to implement effectively using standard logic such as DRAM, Flash memory, DSP blocks, processors, analog functions, or specialized I/O functions such as SerDes. The continuous array of prior art does not provide effective solution for these specialized yet not common enough functions that would justify their regular insertion into CA wafer.

Embodiments of the current invention enable a different and more flexible approach. Additionally the prior art proposal for continuous array were primarily oriented toward Gate Array and Structured ASIC where the customization includes some custom masks. In contrast, the current invention proposes an approach which could fit well FPGA type products including options without any custom masks. Instead of adding a broad variety of such blocks into the CA which would make it generally area-inefficient, and instead of using a range of CA types with different block mixes which would require large number of expensive mask sets, the current invention allows using Through Silicon Via to enable a new type of configurable system.

The technology of "Package of integrated circuits and vertical integration" has been described in U.S. Pat. No. 6,322,903 issued to Oleg Siniaguine and Sergey Savastiouk on Nov. 27, 2001. Accordingly, embodiment of the current invention suggests the use of CA tiles, each made of one type, or of very few types, of elements. The target system is then constructed using desired number of tiles of desired type stacked on top of each other and connected with TSVs comprising 3D Configurable System.

Figure 11A:
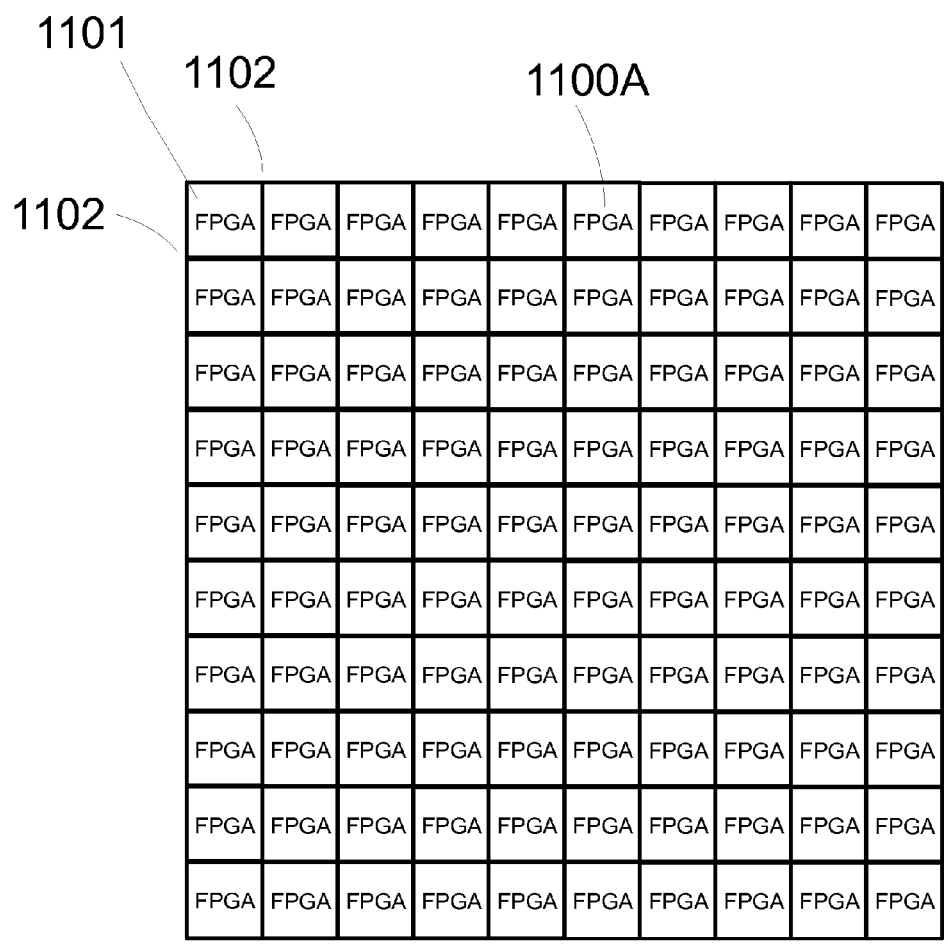
FIG. 11A illustrates a continuous array reticle of FPGA tiles according to the present invention.
Figure 11B:
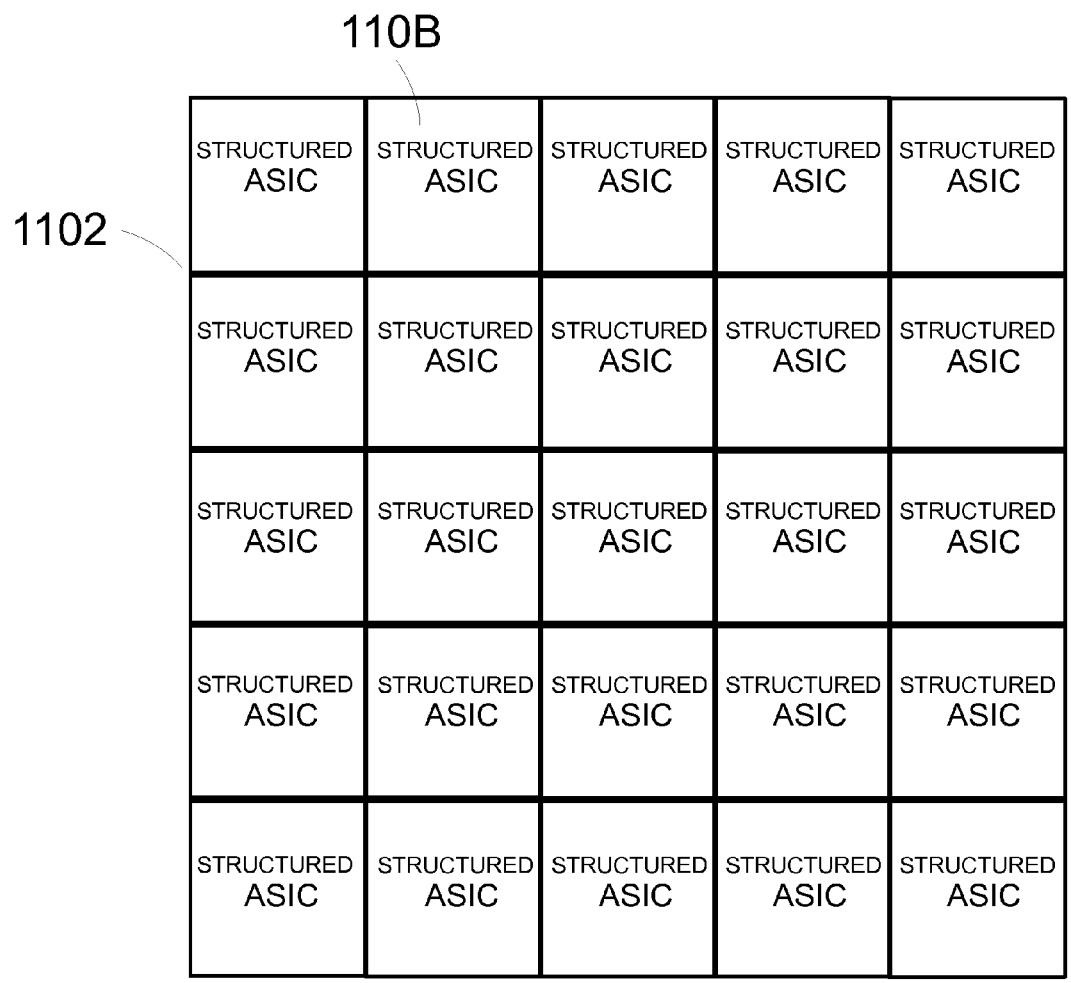
FIG. 11B illustrates a continuous array reticle of structured ASIC tiles according to the present invention.
Figure 11C:
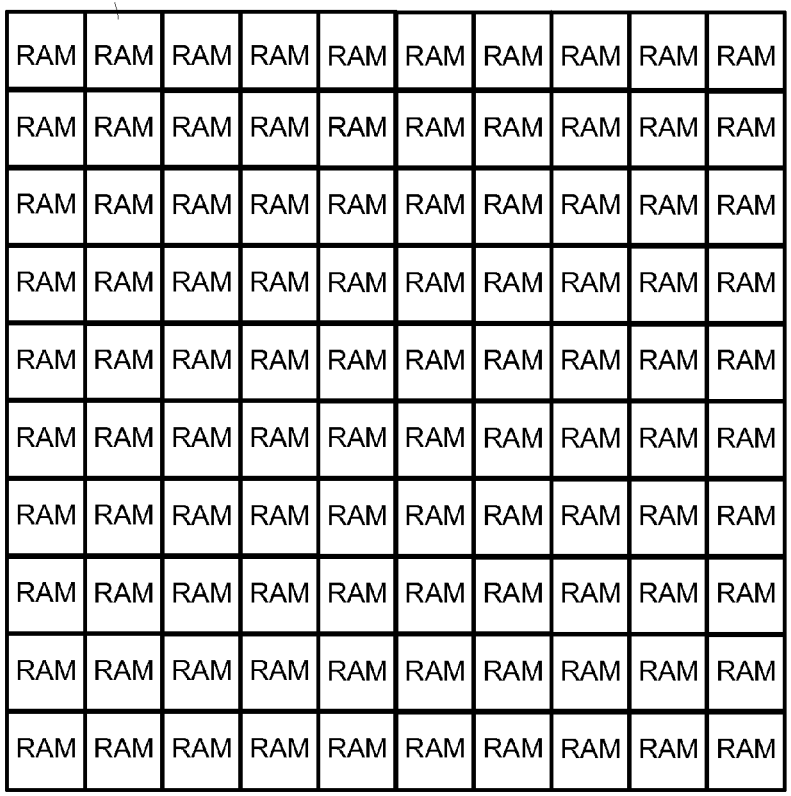
FIG. 11C illustrates a continuous array reticle of RAM tiles according to the present invention.
Figure 11D:
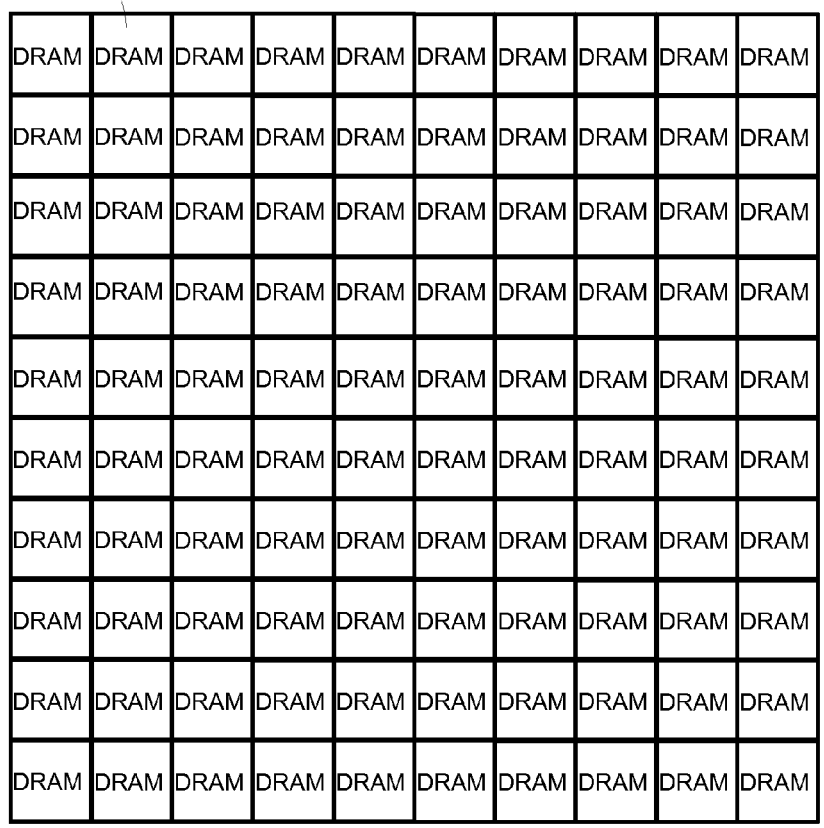
FIG. 11D illustrates a continuous array reticle of DRAM tiles according to the present invention.
Figure 11E:
FIG. 11E illustrates a continuous array reticle of microprocessor tiles according to the present invention.
Figure 11F:
FIG. 11F illustrates a continuous array reticle of I/O SERDES tiles according to the present invention.

FIG. 11A is a drawing illustration of one reticle size area of CA wafer, here made of FPGA-type of tiles 1100A. Between the tiles there exist potential dicing lines 1102 that allow the wafer to be diced into desired configurable logic die sizes. Similarly, FIG. 11B illustrates CA comprising structured ASIC tiles 1109B that allow the wafer to be diced into desired configurable logic die sizes. FIG. 11C illustrates CA comprising RAM tiles 1100C that allow the wafer to be diced into desired RAM die sizes. FIG. 11D illustrates CA comprising DRAM tiles 1100D that allow the wafer to be diced into desired DRAM die sizes. FIG. 11E illustrates CA comprising microprocessor tiles 1100E that allow the wafer to be diced into desired microprocessor die sizes. FIG. 11F illustrates CA comprising I/O or SerDes tiles 1100F that allow the wafer to be diced into desired I/O die or SERDES die or combination I/O and SERDES die sizes. It should be noted that the edge size of each type of repeating tile may differ, although there may be an advantage to make all tile sizes a multiple of the smallest desirable tile size. For FPGA-type tile 1100A an edge size between 0.5 mm and 1 mm represents a good tradeoff between granularity and area loss due to unused potential dicing lines.

In some types of CA wafers it may be advantageous to have metal lines crossing perpendicularly the potential dicing lines, which will allow connectivity between individual tiles. This requires cutting some such lines during wafer dicing. Alternate embodiment may not have metal lines crossing the potential dicing lines and in such case connectivity across uncut dicing lines can be obtained using dedicated mask and custom metal layers accordingly to provide connections between tiles for the desired die sizes.

It should be noted that in general the lithography over the wafer is done by repeatedly projecting what is named reticle over the wafer in a "step-and-repeat" manner. In some cases it might be preferable to consider differently the separation between repeating tile 102 within a reticle image vs. tiles that relate to two projections. For simplicity this description will use the term wafer but in some cases it will apply only to tiles with one reticle.

Figure 12A:
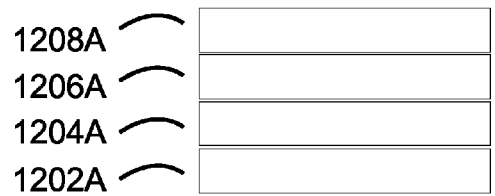
FIG. 12A illustrates a 3D IC of the present invention comprising equal sized continuous array tiles.
Figure 12B:
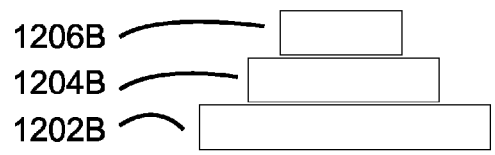
FIG. 12B illustrates a 3D IC of the present invention comprising different sized continuous array tiles.
Figure 12C:
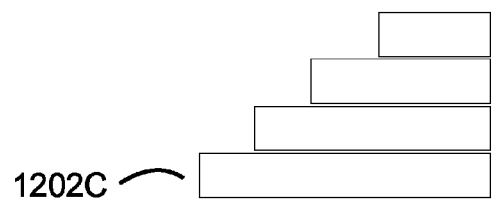
FIG. 12C illustrates a 3D IC of the present invention comprising different sized continuous array tiles with a different alignment from FIG. 12B.
Figure 12D:
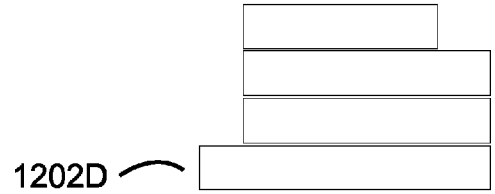
FIG. 12D illustrates a 3D IC of the present invention comprising some equal and some different sized continuous array tiles.
Figure 12E:
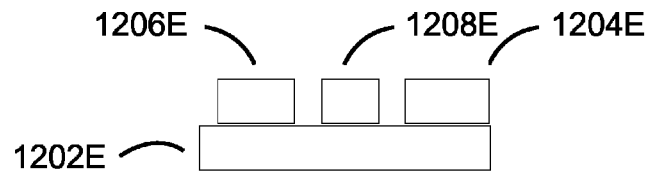
FIG. 12E illustrates a 3D IC of the present invention comprising smaller sized continuous array tiles at the same level on a single tile.

FIGS. 12A-E is a drawing illustration of how dies cut from CA wafers such as in FIGS. 11A-F can be assembled into a 3D Configurable System using TSVs. FIG. 12A illustrates the case where all dies 1202A, 1204A, 1206A and 1208A are of the same size. FIGS. 12B and 12C illustrate cases where the upper dies are decreasing in size and have different type of alignment. FIG. 12D illustrates a mixed case where some, but not all, of the stacked dies are of the same size. FIG. 12E illustrates the case where multiple smaller dies are placed at a same level on top of a single die. It should be noted that such architecture allows constructing wide variety of logic devices with variable amounts of specific resources using only small number of mask sets. It should be also noted that the preferred position of high power dissipation tiles like logic is toward the bottom of such 3D stack and closer to external cooling access, while the preferred position of I/O tiles is at the top of the stack where it can directly access the Configurable System I/O pads or bumps.

Person skilled in the art will appreciate that a major benefit of the approaches illustrated by FIGS. 12A-12E occurs when the TSV patterns on top of each die are standardized in shape, with each TSV having either predetermined or programmable function. Once such standardization is achieved an aggressive mix and match approach to building broad range of System on a Chip ("SoC") 3D Configurable Systems with small number of mask sets defining borderless Continuous Array stackable wafers becomes viable. Of particular interest is the case illustrated in 12E that is applicable to SoC or FPGA based on high density homogenous CA wafers, particularly without off-chip I/O. Standard TSV pattern on top of CA sites allows efficient tiling with custom selection of I/O, memory, DSP, and similar blocks and with a wide variety of characteristics and technologies on top of the high-density SoC 3D stack.

Figure 13:
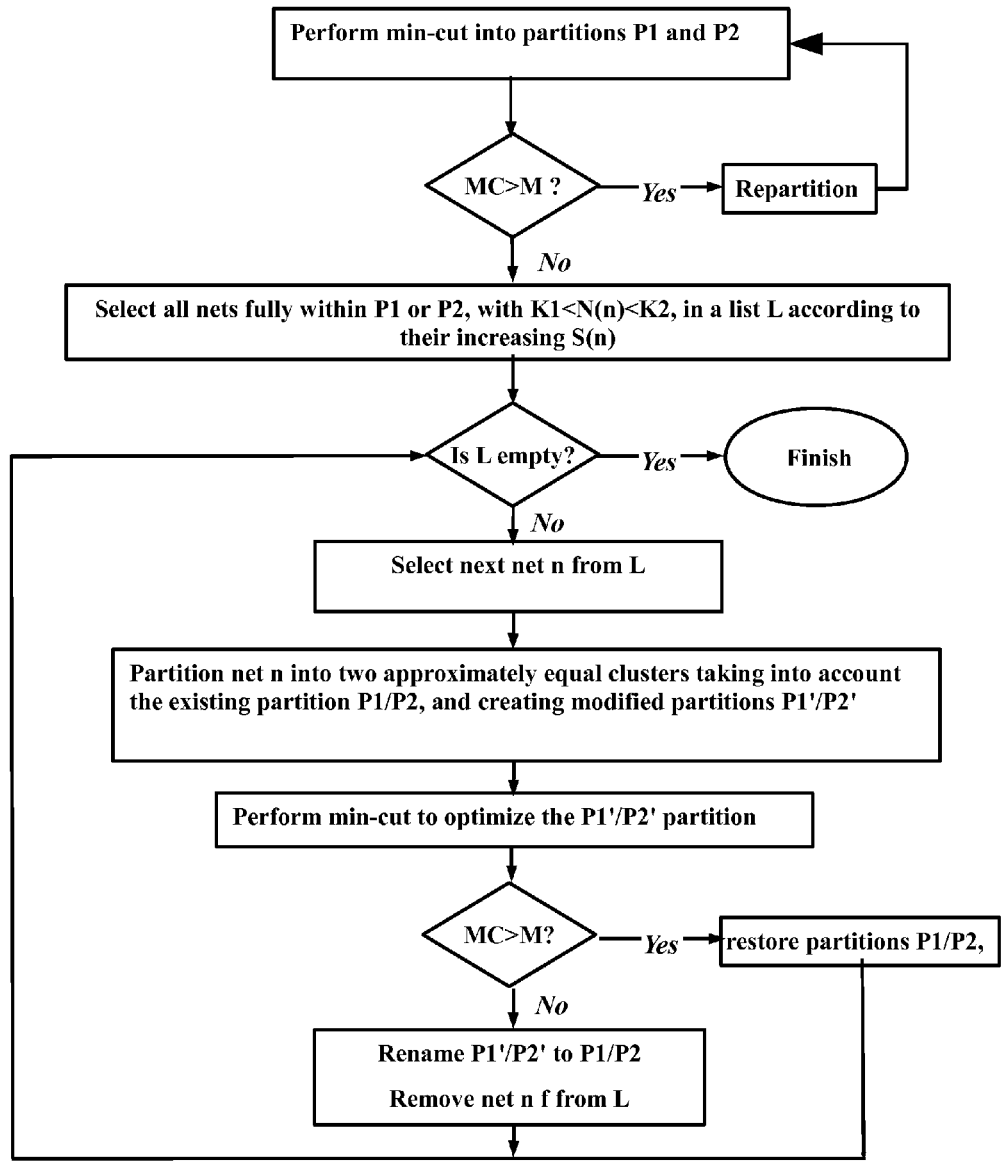
FIG. 13 illustrates a flow chart of a partitioning method according to the present invention.

FIG. 13 is a flow chart illustration of a partitioning method to take advantage of the 3D increased concept of proximity. It uses the following notation:

M—Maximum number of TSVs available for a given IC
MC—Number of nets (connections) between two partitions
S(n)—Timing slack of net n
N(n)—The fanout of net n
K1, K2—constants determined by the user
min-cut—a known algorithm to split a graph into two partitions each of about equal number of nodes with minimal number of arcs between the partitions.

The key idea behind the flow is to focus first on large-fanout low-slack nets that can take the best advantage of the added three-dimensional proximity. K1 is selected to limit the number of nets processed by the algorithm, while K2 is selected to remove very high fanout nets, such as clocks, from being processed by it, as such nets are limited in number and may be best handled manually. Choice of K1 and K2 should yield MC close to M.

A partition is constructed using min-cut or similar algorithm. Timing slack is calculated for all nets using timing analysis tool. Targeted high fanout nets are selected and ordered in increasing amount of timing slack. The algorithm takes those nets one by one and splits them about evenly across the partitions, readjusting the rest of the partition as needed.

Person skilled in the art will appreciate that a similar process can be extended to more than 2 vertical partitions using multi-way partitioning such as ratio-cut or similar.

Figure 14:
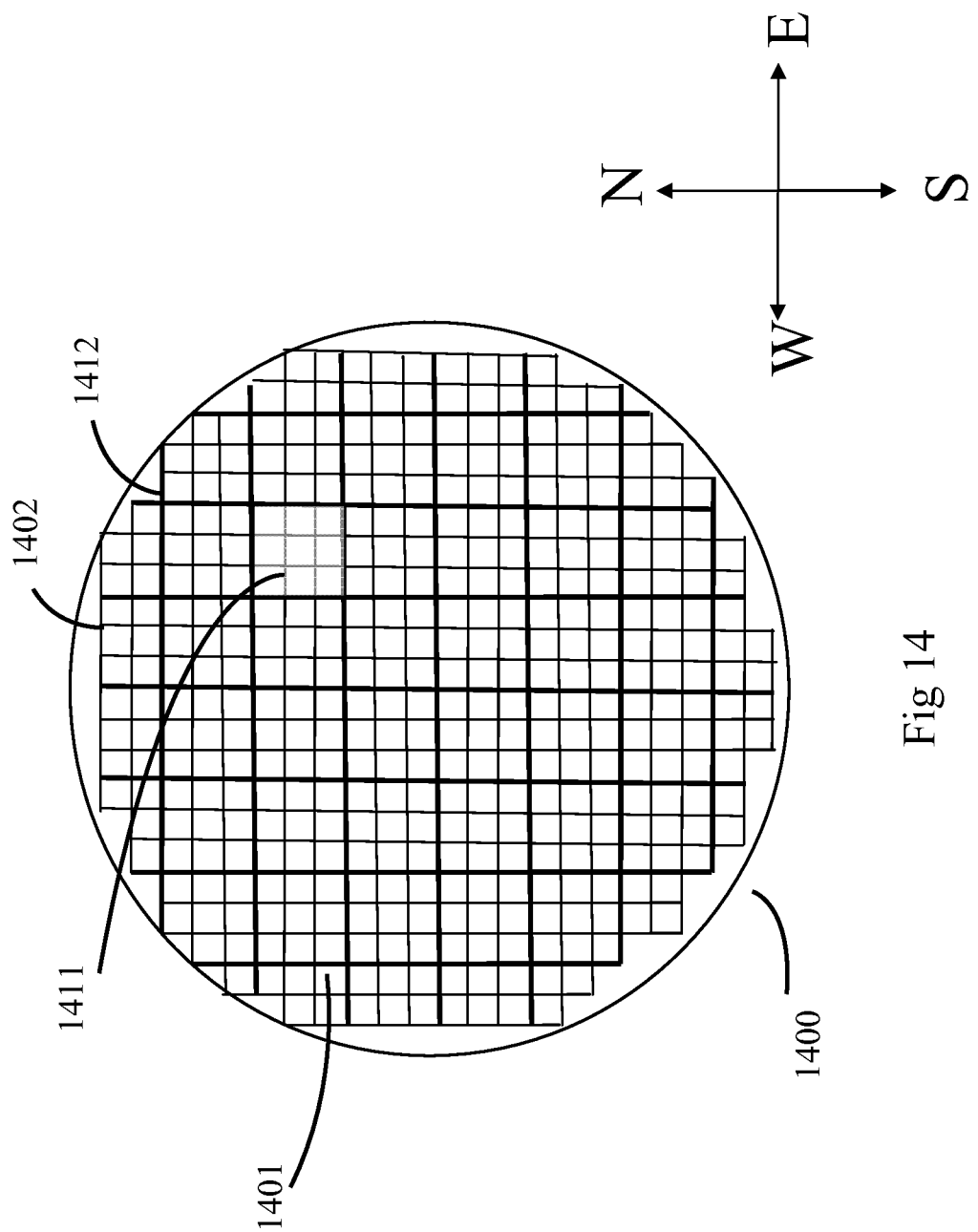
FIG. 14 illustrates a continuous array wafer with different dicing options according to the present invention.

There are many manufacturing and performance advantages to the flexible construction and sizing of 3D Configurable System as described above. At the same time it is also helpful if the complete 3D Configurable System behaves as a single system rather than as a collection of individual tiles. In particular it is helpful is such 3D Configurable System can automatically conFIG. itself for self-test and for functional operation in case of FPGA logic and the likes. FIG. 14 illustrates how this can be achieved in CA architecture, where a wafer 1400 carrying a CA of tiles 1401 with potential dicing lines 1412 has targeted 3×3 die size 1411.

Figure 15:
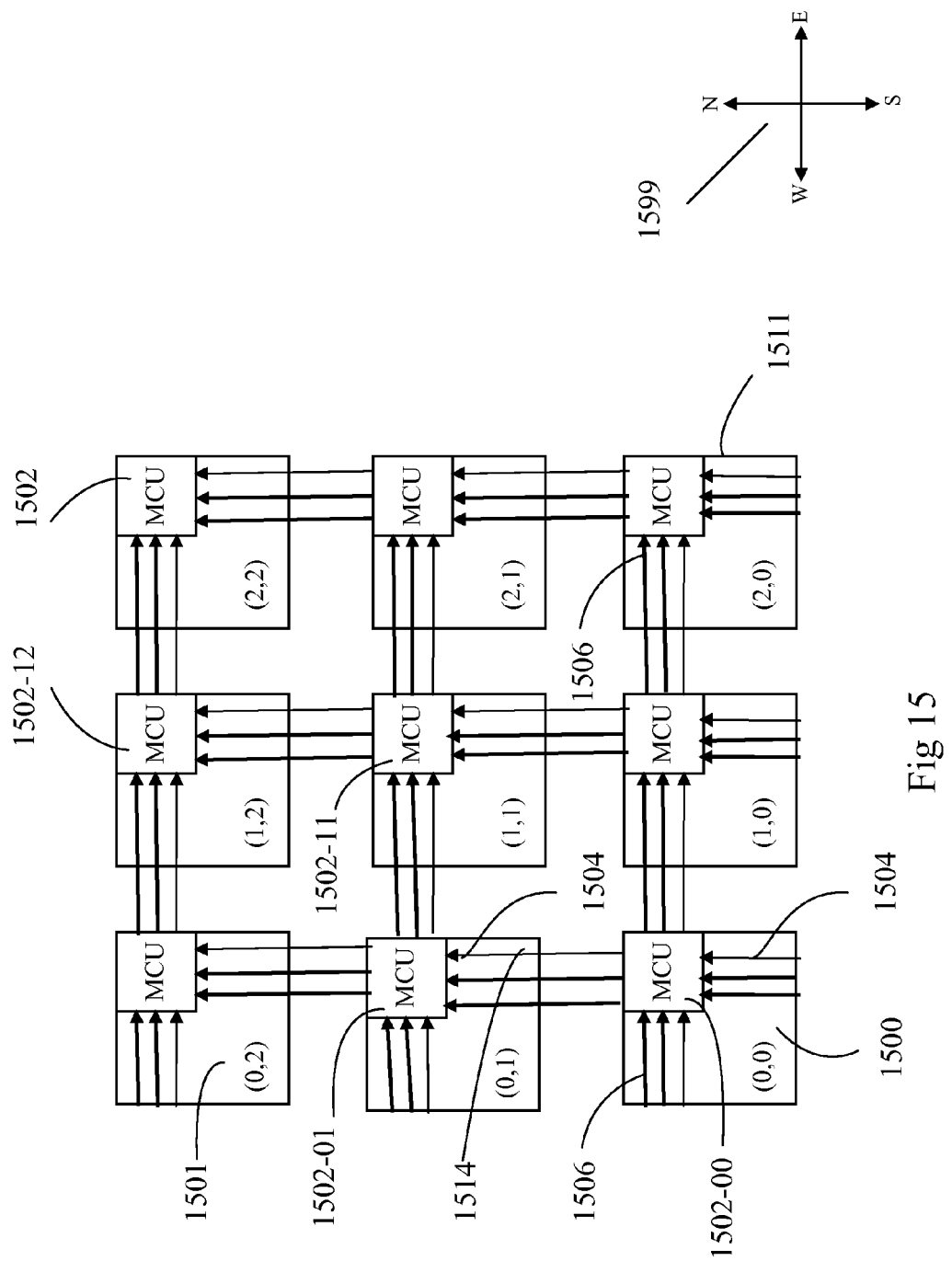
FIG. 15 illustrates a 3×3 array of continuous array tiles according to the present invention with a microcontroller testing scheme.

FIG. 15 is a drawing illustration of the 3×3 target device 1411 comprising 9 tiles 1501 such as 1401. Each tile 1501 includes a small microcontroller unit ("MCU") 1502. For ease of description the tiles are indexed in 2 dimensions starting at bottom left corner. The MCU is a fully autonomous controller such as 8051 with program and data memory and input/output lines. The MCU of each tile is used to configure, initialize, and potentially tests and manage, the configurable logic of the tile. Using the compass rose 1599 as a reference in FIG. 15, MCU inputs of each tile are connected to its southern neighbor through fixed connection lines 1504 and its western neighbor through fixed connection lines 1506. Similarly each MCU drives its northern and eastern neighbors. Each MCU is controlled in priority order by its western neighbor and by its southern neighbor. For example, MCU 1502-11 is controlled by MCU 1502-01, while MCU 1502-01 having no western neighbor is controlled by MCU 1502-00 south of it. MCU 1502-00 that senses neither westerly nor southerly neighbors automatically becomes the die master. It should be noted that the directions in the discussion above are representative and the system can be trivially modified to adjust to direction changes.

Figure 16:
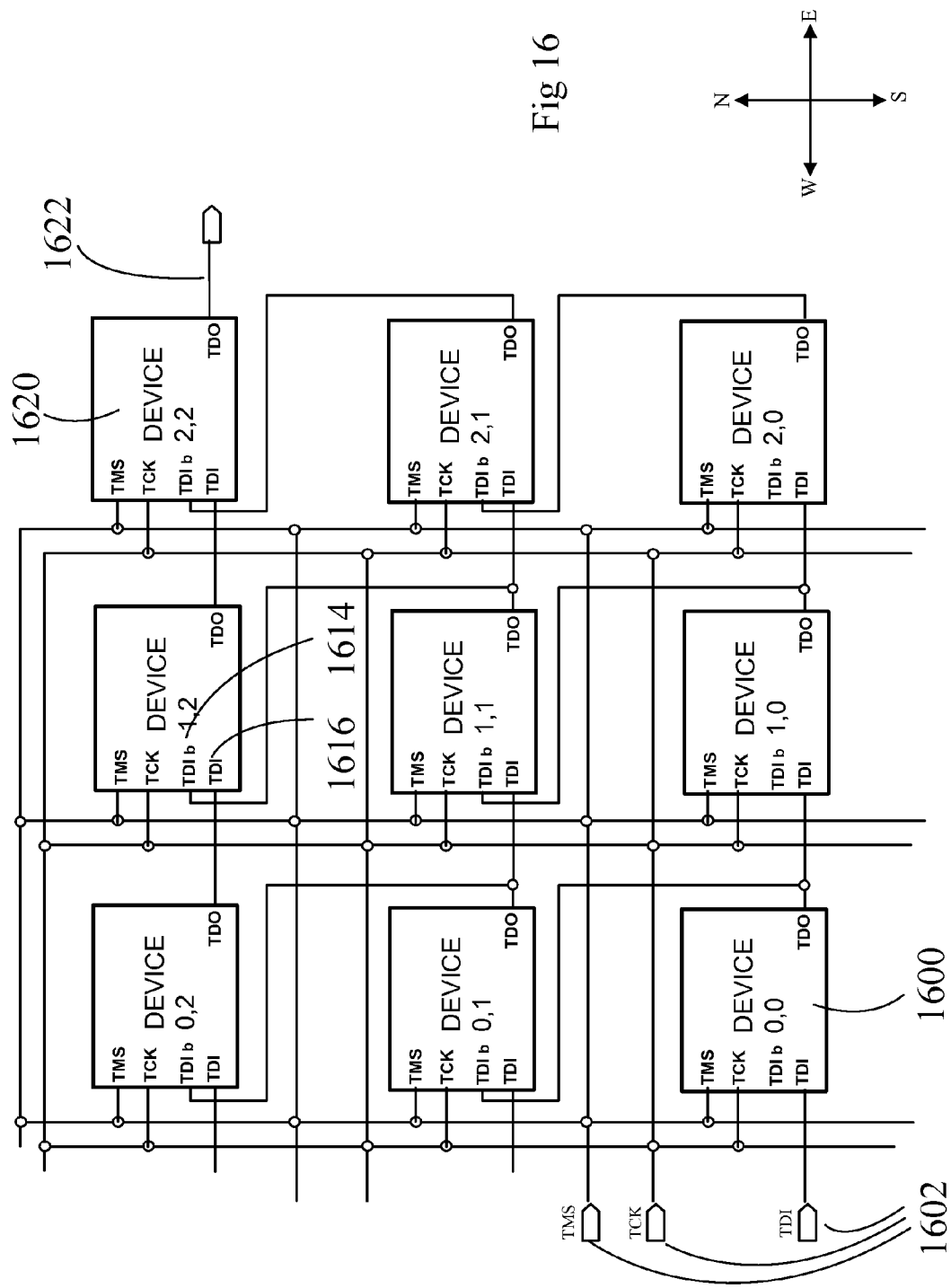
FIG. 16 illustrates a 3×3 array of continuous array tiles according to the present invention with a Joint Test Action Group (JTAG) testing scheme.

FIG. 16 is a drawing illustration of a scheme using modified Joint Test Action Group ("JTAG") (also known as IEEE Standard 1149.1) industry standard interface interconnection scheme. Each MCU has two TDI inputs TDI 1616 and TDIb 1614 instead of one, which are priority encoded with 1616 having the higher priority. JTAG inputs TMS and TCK are shared in parallel among the tiles, while JTAG TDO output of each MCU is driving its northern and eastern neighbors. Die level TDI, TMS, and TCK pins 1602 are fed to tile 1600 at lower left, while die level TDO 1622 is output from top right tile 1620. Accordingly, such setup allows the MCUs in any convex rectangular array of tiles to self conFIG. at power-on and subsequently allow for each MCU to configure, test, and initialize its own tile using uniform connectivity.

The described uniform approach to configuration, test, and initialization is also helpful for designing SoC dies that include programmable FPGA array of one or more tiles as a part of their architecture. The size-independent self-configuring electrical interface allows for easy electrical integration, while the autonomous FPGA self test and uniform configuration approach make the SoC boot sequence easier to manage.

U.S. Patent Application Publication 2009/0224364 describes methods to create 3D systems made of stacking very thin layers, of thickness of few tens to few hundreds of nanometers, of monocrystalline silicon with pre-implanted patterning on top of base wafer using low-temperature (below approximately 400° C.) technique called layer transfer.

Figure 17:
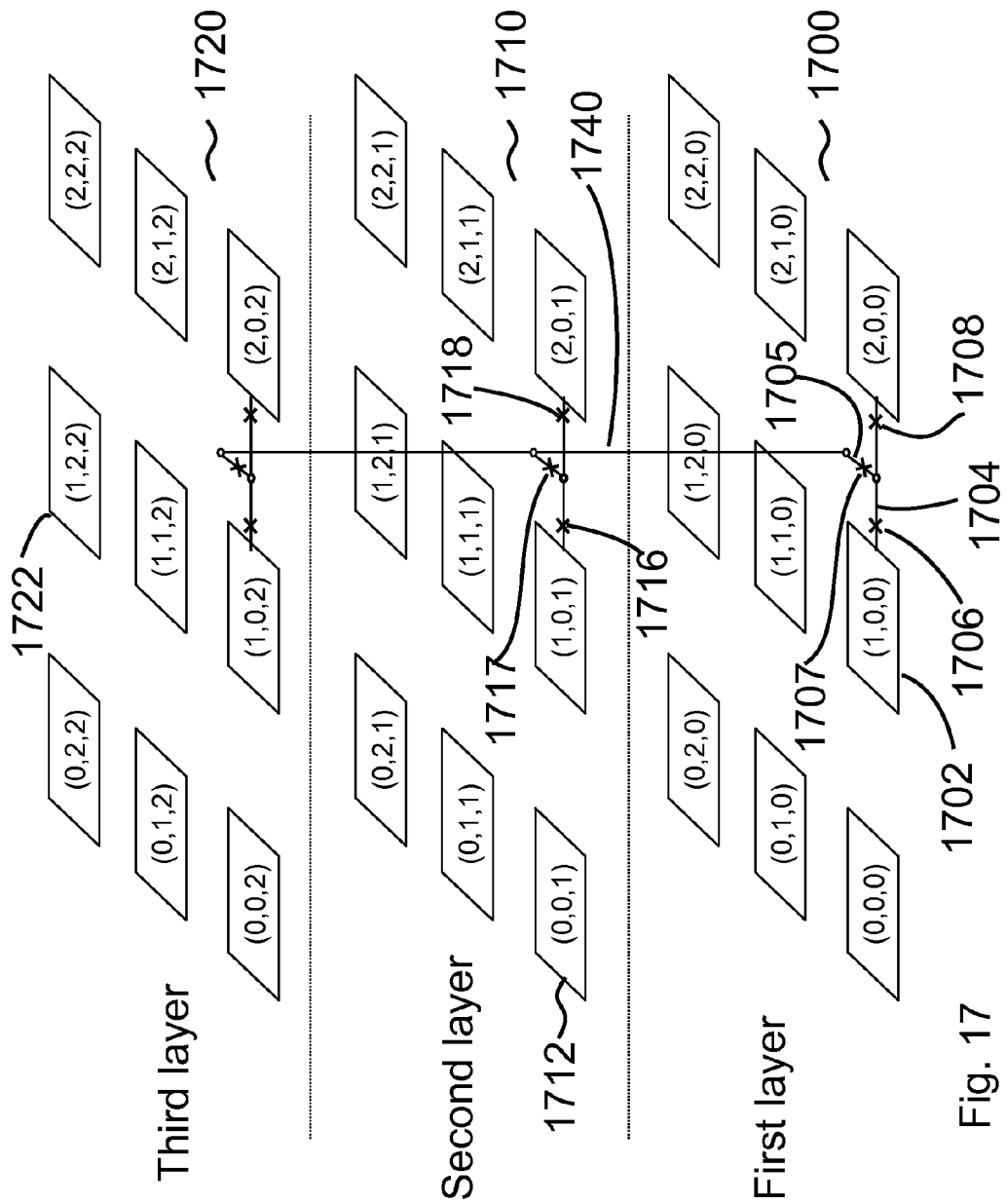
FIG. 17 illustrates a programmable 3D IC with redundancy according to the present invention.

An alternative of the invention uses vertical redundancy of configurable logic device such as FPGA to improve the yield of 3D ICs. FIG. 17 is a drawing illustration of a programmable 3D IC with redundancy. It comprises of three stacked layers 1700, 1710 and 1720, each having 3×3 array of programmable LBs indexed with three dimensional subscripts. One of the stacked layers is dedicated to redundancy and repair, while the rest of the layers—two in this case—are functional. In this discussion we will use the middle layer 1710 as the repair layer. Each of the LB outputs has a vertical connection such as 1740 that can connect the corresponding outputs at all vertical layers through programmable switches such as 1707 and 1717. The programmable switch can be Antifuse-based, a pass transistor, or an active-device switch.

Functional connection 1704 connects the output of LB (1,0,0) through switches 1706 and 1708 to the input of LB (2,0,0). In case LB (1,0,0) malfunctions, which can be found by testing, the corresponding LB (1,0,1) on the redundancy/repair layer can be programmed to replace it by turning off switch 1706 and turning on switches 1707, 1717, and 1716 instead. The short vertical distance between the original LB and the repair LB guarantees minimal impact on circuit performance. In a similar way LB (1,0,1) could serve to repair malfunction in LB (1,0,2). It should be noted that the optimal placement for the repair layer is about the center of the stack, to optimize the vertical distance between malfunctioning and repair LBs. It should be also noted that a single repair layer can repair more than two functional layers, with slowly decreasing efficacy of repair as the number of functional layers increases.

In a 3D IC based on layer transfer in U.S. Patent Applications Publications 2006/0275962 and 2007/0077694 we will call the underlying wafer a Receptor wafer, while the layer placed on top of it will come from a Donor wafer. Each such layer can be patterned with advanced fine pitch lithography to the limits permissible by existing manufacturing technology. Yet the alignment precision of such stacked layers is limited. Best layer transfer alignment between wafers is currently on the order of 1 micron, almost two orders of magnitude coarser than the feature size available at each individual layer, which prohibits true high-density vertical system integration.

Figure 18A:
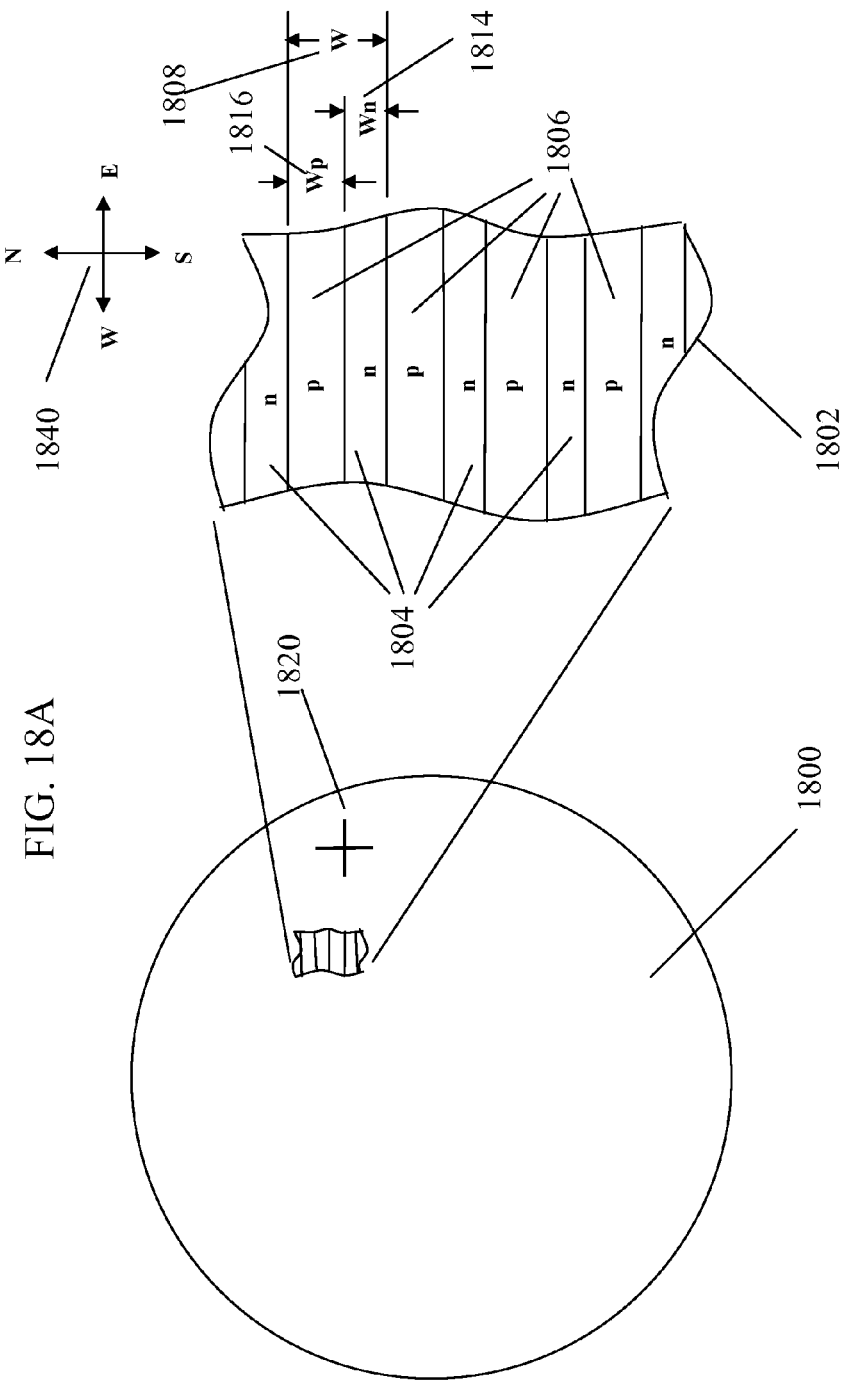
FIG. 18A illustrates a first alignment reduction scheme according to the present invention.

FIG. 18A is a drawing illustration that sets the basic elements to show how such large misalignment can be reduced for the purpose of vertical stacking of pre-implanted monocrystalline silicon layers using layer transfer. Compass rose 1840 is used throughout to assist in describing the invention. Donor wafer 1800 comprise a repetitive bands of P devices 1806 and N devices 1804 in the north-south direction as depicted in its magnified region 1802. The width of the P band 1806 is Wp 1816, and that of the N band 1804 is Wn 1814. The overall pattern repeats every step W 1808, which is the sum of Wp, Wn, and possibly an additional isolation band. Alignment mark 1820 is aligned with these patterns on 1800. FIG. 18B is a drawing illustration that demonstrates how such donor wafer 1800 can be placed on top of a Receptor wafer 1810 that has its own alignment mark 1821. In general, wafer alignment for layer transfer can maintain very precise angular alignment between wafers, but the error DY 1822 in north-south direction and DX 1824 in east-west direction are large and typically much larger than the repeating step 1808. This situation is illustrated in drawing of FIG. 18C. However, because the pattern on the donor wafer repeats in the north-south direction, the effective error in that direction is only Rdy 1825, the remainder of DY 1822 modulo W 1808. Clearly, Rdy 1825 is equal or smaller than W 1808.

FIG. 18D is a drawing illustration that completes the explanation of this concept. For a feature on the Receptor to have an assured connection with any point in a metal strip 1838 of the Donor, it is sufficient that the Donor strip is of length W in the north-south direction plus the size of an inter-wafer via 1836 (plus any additional overhang as dictated by the layout design rules as needed, plus accommodation for angular wafer alignment error as needed, plus accommodations for wafer bow and warp as needed). Also, because the transferred layer is very thin as noted above, it is transparent and both alignment marks 1820 and 1821 are visible readily allowing calculation of Rdy and the alignment of via 1836 to alignment mark 1820 in east-west direction and to alignment mark 1821 in north-south direction.

Figure 18C:
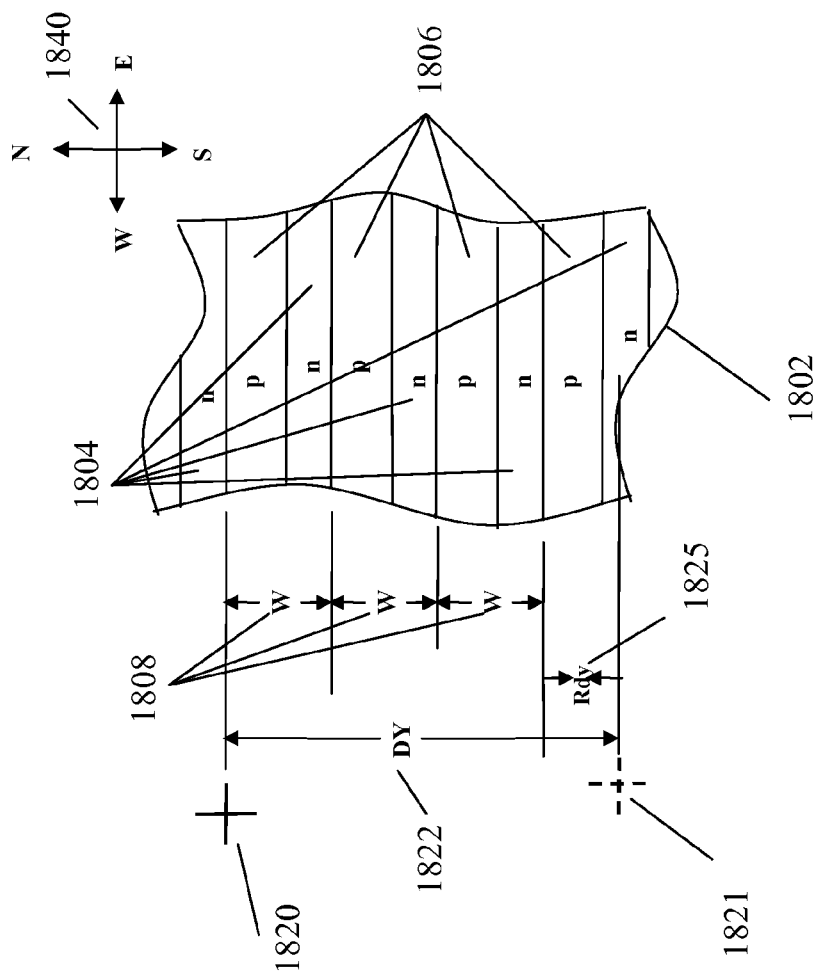
FIG. 18C illustrates alignment with respect to a repeatable structure in the alignment in the alignment reduction scheme of FIG. 18A.
Figure 19A:
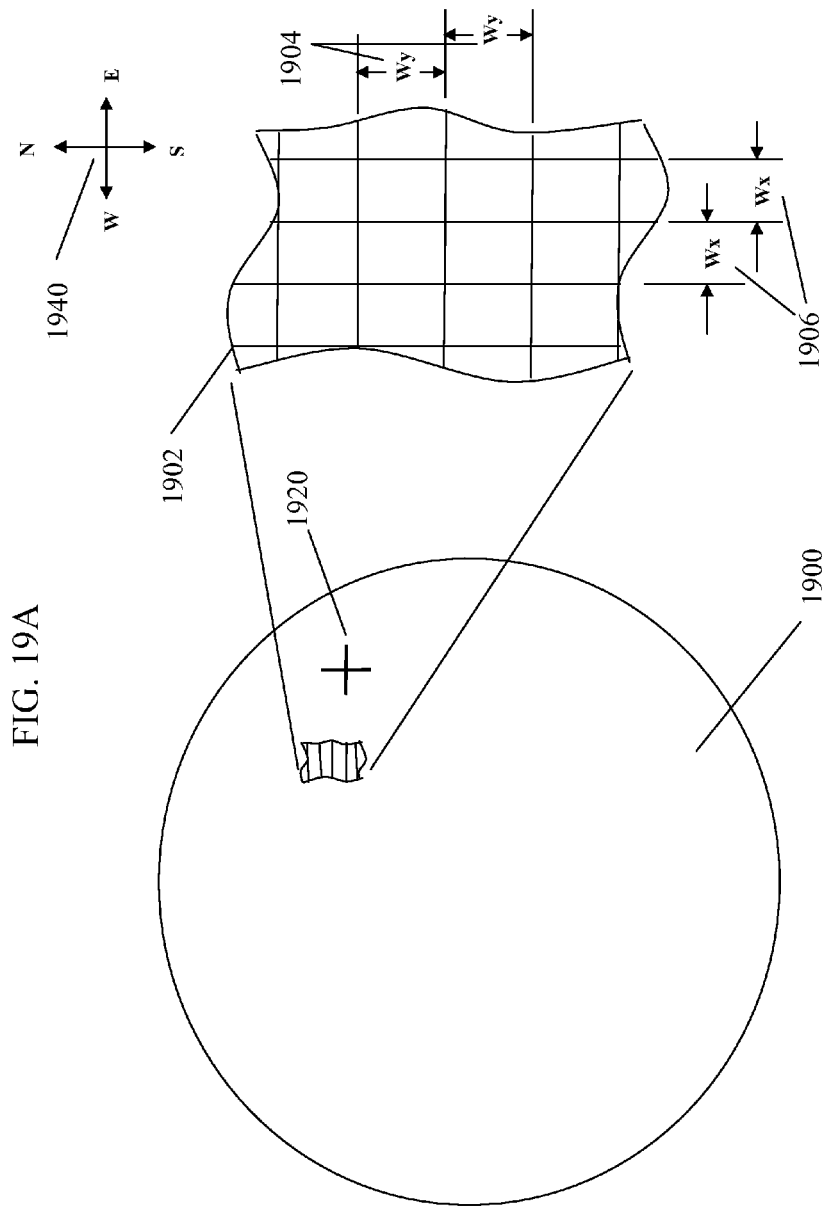
FIG. 19A illustrates a second alignment reduction scheme according to the present invention.
Figure 19C:
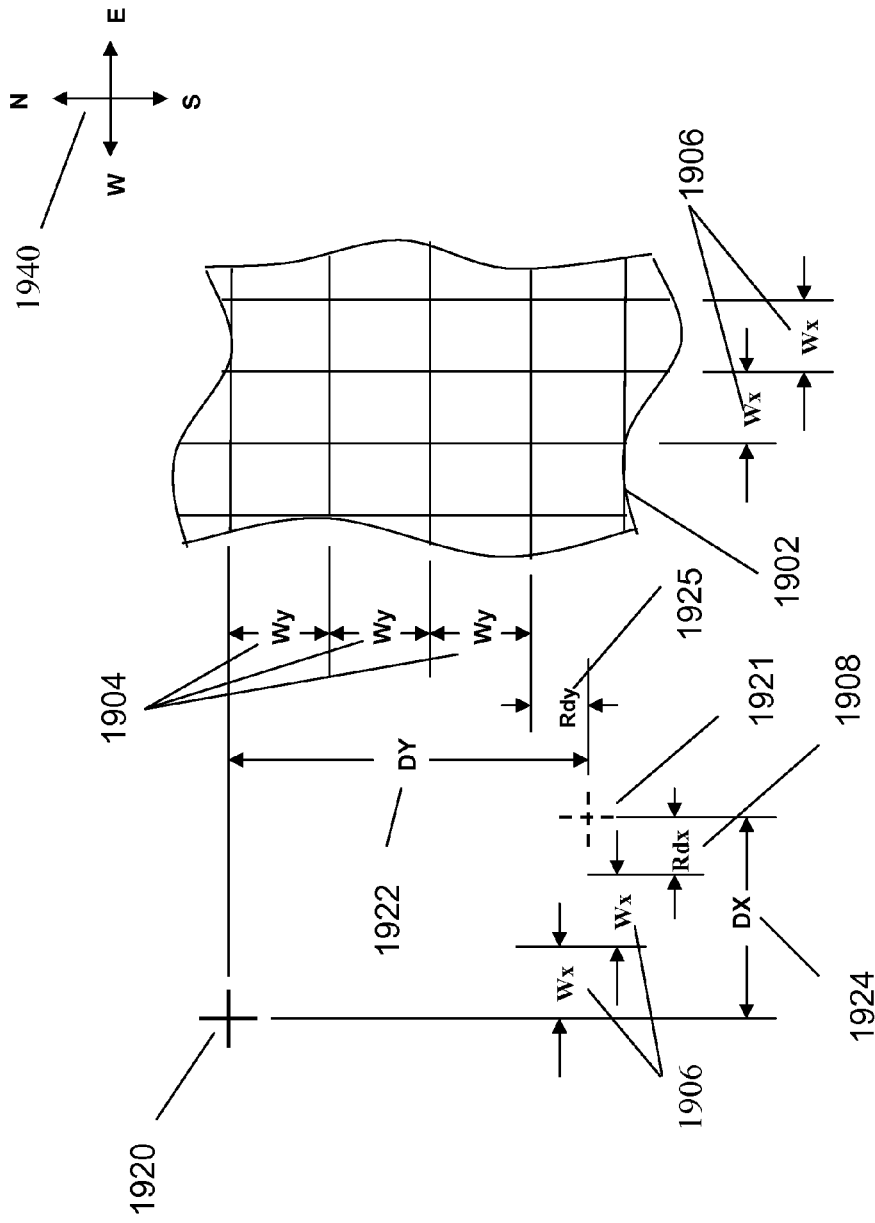
FIG. 19C illustrates alignment with respect to a repeatable structure in the alignment in the alignment reduction scheme of FIG. 19A.
Figure 19D:
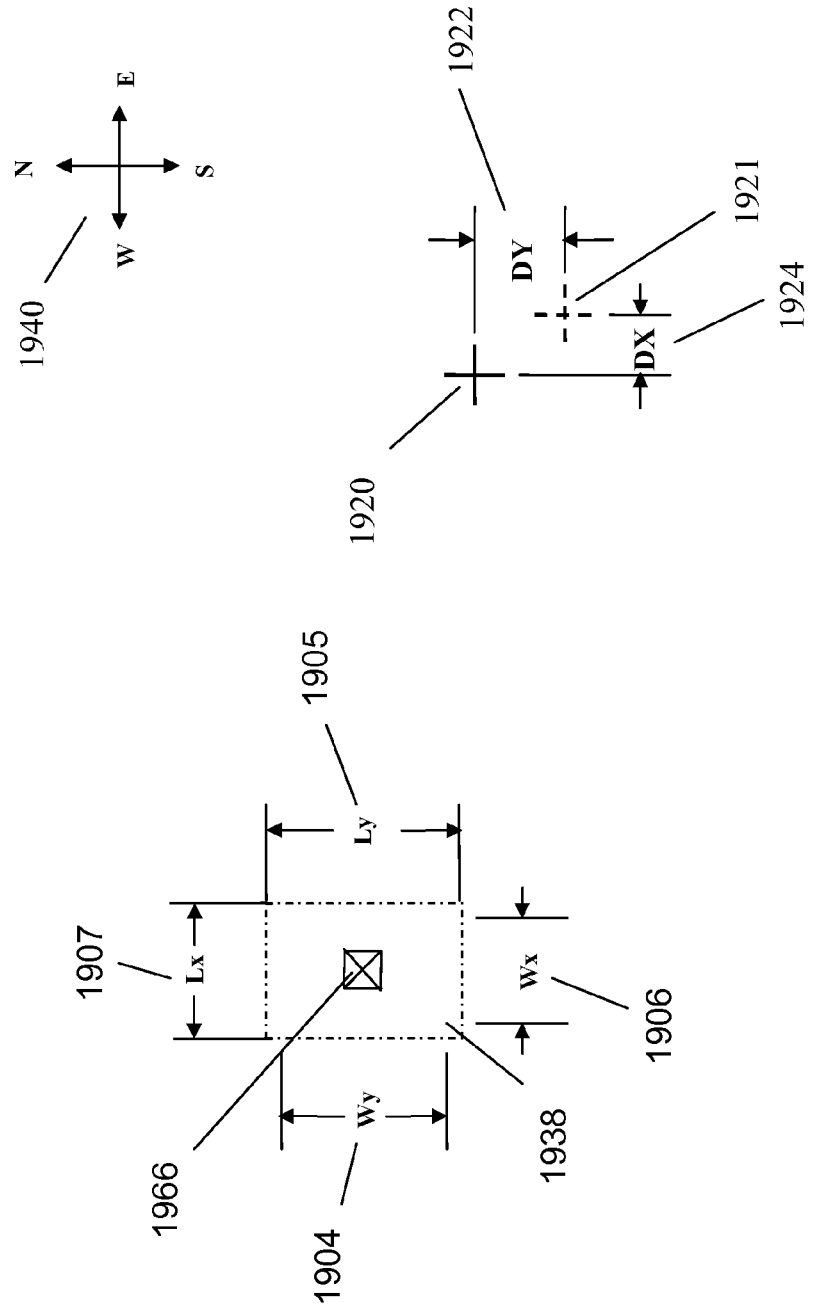
FIG. 19D illustrates an inter-wafer via contact landing area in the alignment reduction scheme of FIG. 19A.

FIG. 19A is a drawing illustration that extends this concept into two dimensions. Compass rose 1940 is used throughput to assist in describing the invention. Donor wafer 1900 has an alignment mark 1920 and the magnification 1902 of its structure shows a uniform repeated pattern of devices in both north-south and east-west directions, with steps Wy 1903 and Wx 1906 respectively. FIG. 19B shows a placement of such wafer 1900 onto a Receptor wafer 1910 with its own alignment mark 1921, and with alignment errors DY 1922 and DX 1924 in north-south and east-west respectively. FIG. 19C shows, in a manner analogous to FIG. 18C, shows that the maximum effective misalignments in both north-south and east-west directions are the remainders Rdy 1925 of DY modulo Wy and Rdx 1908 of DX modulo Wx respectively, both much smaller than the original misalignments DY and DX. As before, the transparency of the very thin transferred layer readily allows the calculation of Rdx and Rdy after layer transfer. FIG. 19D, in a manner analogous to FIG. 18D, shows that the minimum landing area 1938 on the Receptor wafer to guarantee connection to any region of the Donor wafer is of size Ly 1905 (Wy plus inter-wafer via 1966 size) by Lx 1907 (Wx plus via 1966 size), plus any overhangs that may be required by layout rules and additional wafer warp, bow, or angular error accommodations as needed. As before, via 1966 is aligned to both marks 1920 and 1921. Landing area 1938 may be much smaller than wafer misalignment errors DY and DX.

Figure 19E:
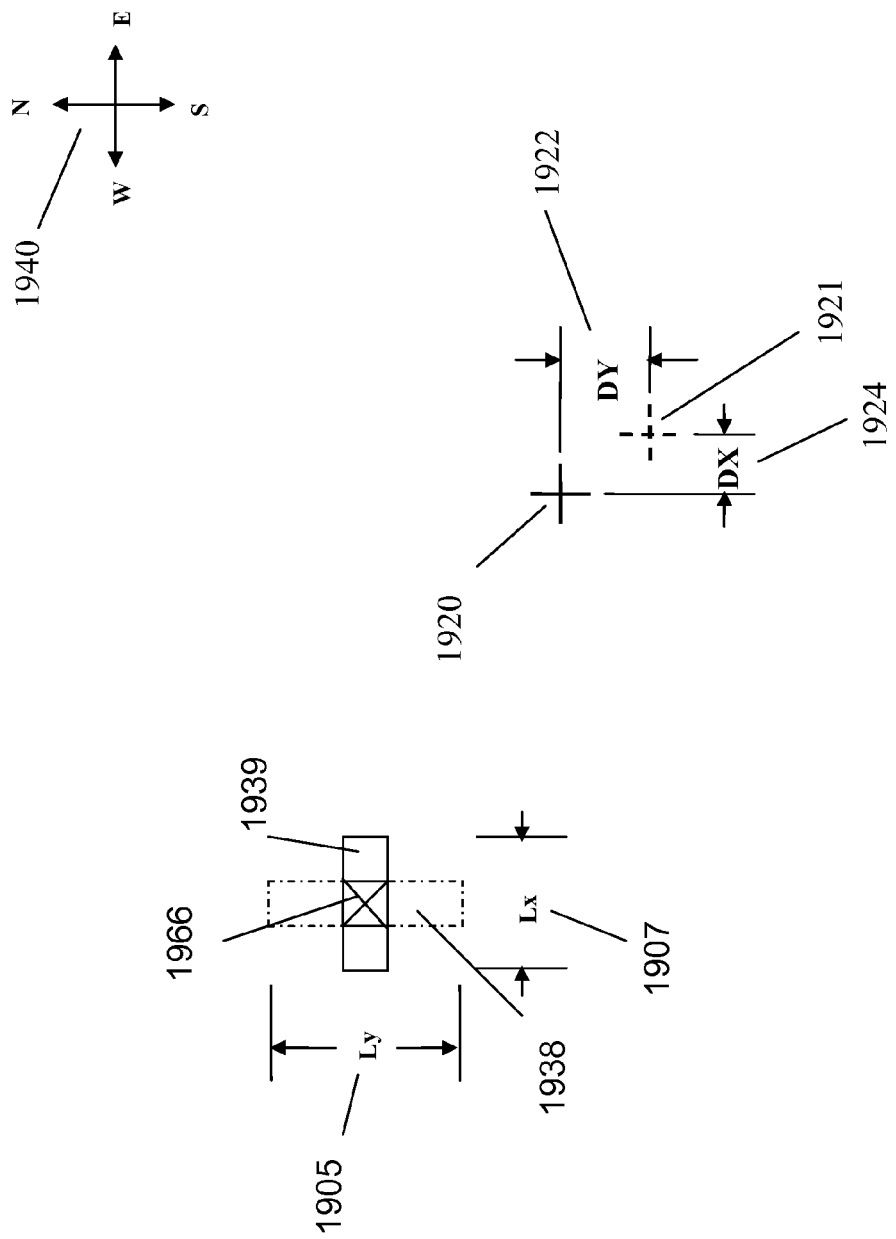
FIG. 19E illustrates a reduction in the size of the inter-wafer via contact landing area of FIG. 19D.

FIG. 19E is a drawing illustration that suggests that the landing area can actually be smaller than Ly times Lx. The Receptor wafer 1910 may have metal strip 1938 of minimum width necessary for fully containing a via 1966 and of length Ly 1905. Similarly, the Donor wafer 1900 may include metal strip 1939 of minimum width necessary for fully containing a via 1966 and of length Lx 1907. This guarantees that irrespective of wafer alignment error the two strips will always cross each other with sufficient overlap to fully place a via in it, aligned to both marks 1920 and 1921 as before.

This concept of small effective alignment error is only valid in the context of fine grain repetitive device structure stretching in both north-south and east-west directions, which will be described in the following sections.

Figure 20A:
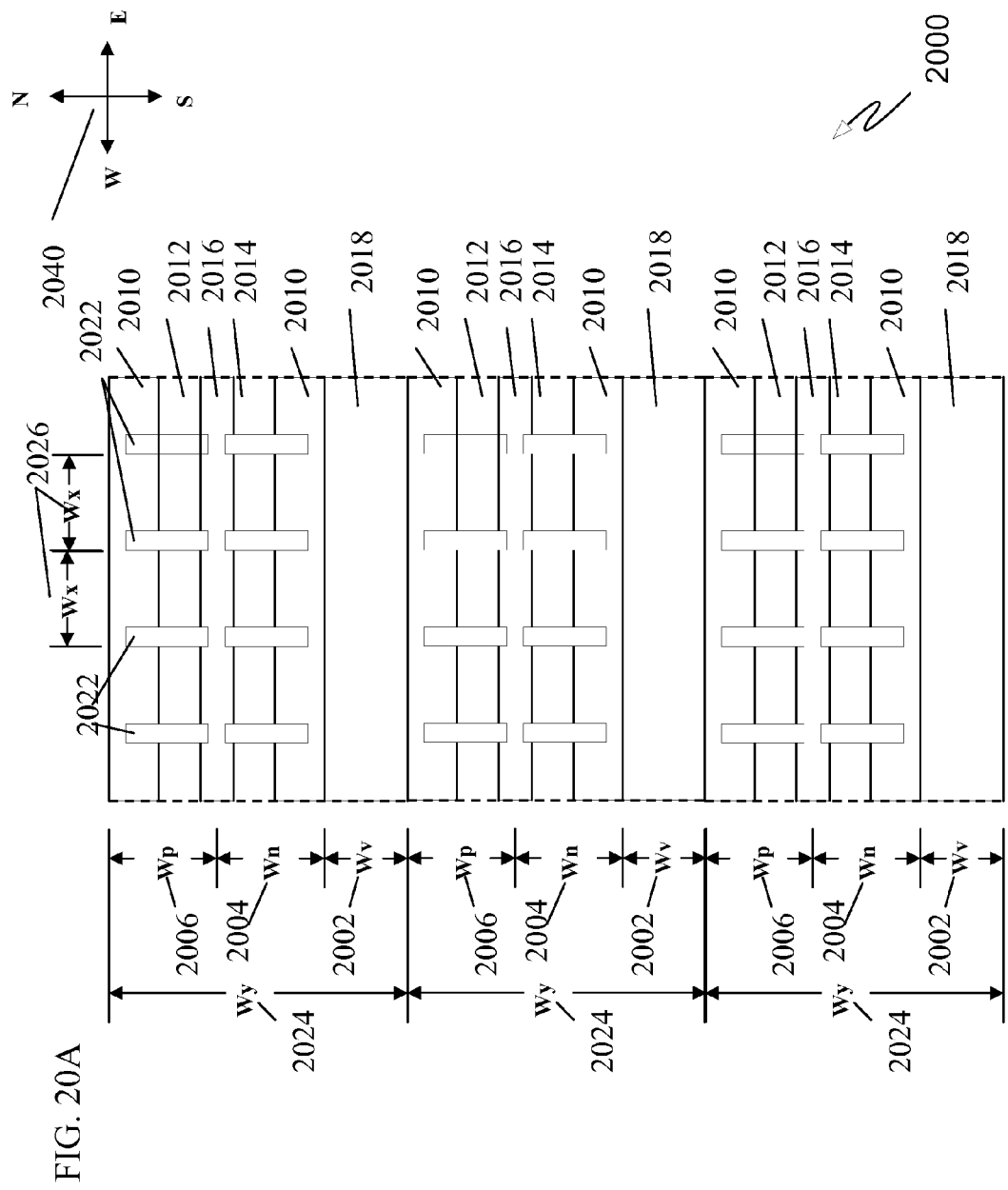
FIG. 20A illustrates a repeatable structure suitable for use with the wafer alignment reduction scheme of FIG. 18C.

FIG. 20A is a drawing illustration of exemplary repeating transistor structure 2000 (or repeating transistor cell structure) suitable for use as repetitive structure 1804 in FIG. 18C. Repeating transistor structure 2000 comprises continuous east-west strips of isolation regions 2010, 2016 and 2018, active P and N regions 2012 and 2014 respectively, and with repetition step Wy 2024 in north-south direction. Continuous array of gates 2022 is formed over active regions, with repetition step Wx 2026 in east-west direction.

Such structure is conducive for creation of customized CMOS circuits through metallization. Horizontally adjacent transistors can be electrically isolated by properly biasing the gate between them, such as grounding the NMOS gate and tying the PMOS to Vdd using custom metallization.

Using F to denote feature size of twice lambda, the minimum design rule, we shall estimate the repetition steps in such terrain. In the east-west direction gates 2022 are of F width and spaced perhaps 4F from each other, giving east-west step 2026 of 5F. In north-south direction the active regions width can be perhaps 3F each, with isolation regions 2010, 2016 and 2018 being 3F, 1F and 5F respectively yielding 18F north-south step 2024.

Figure 20B:
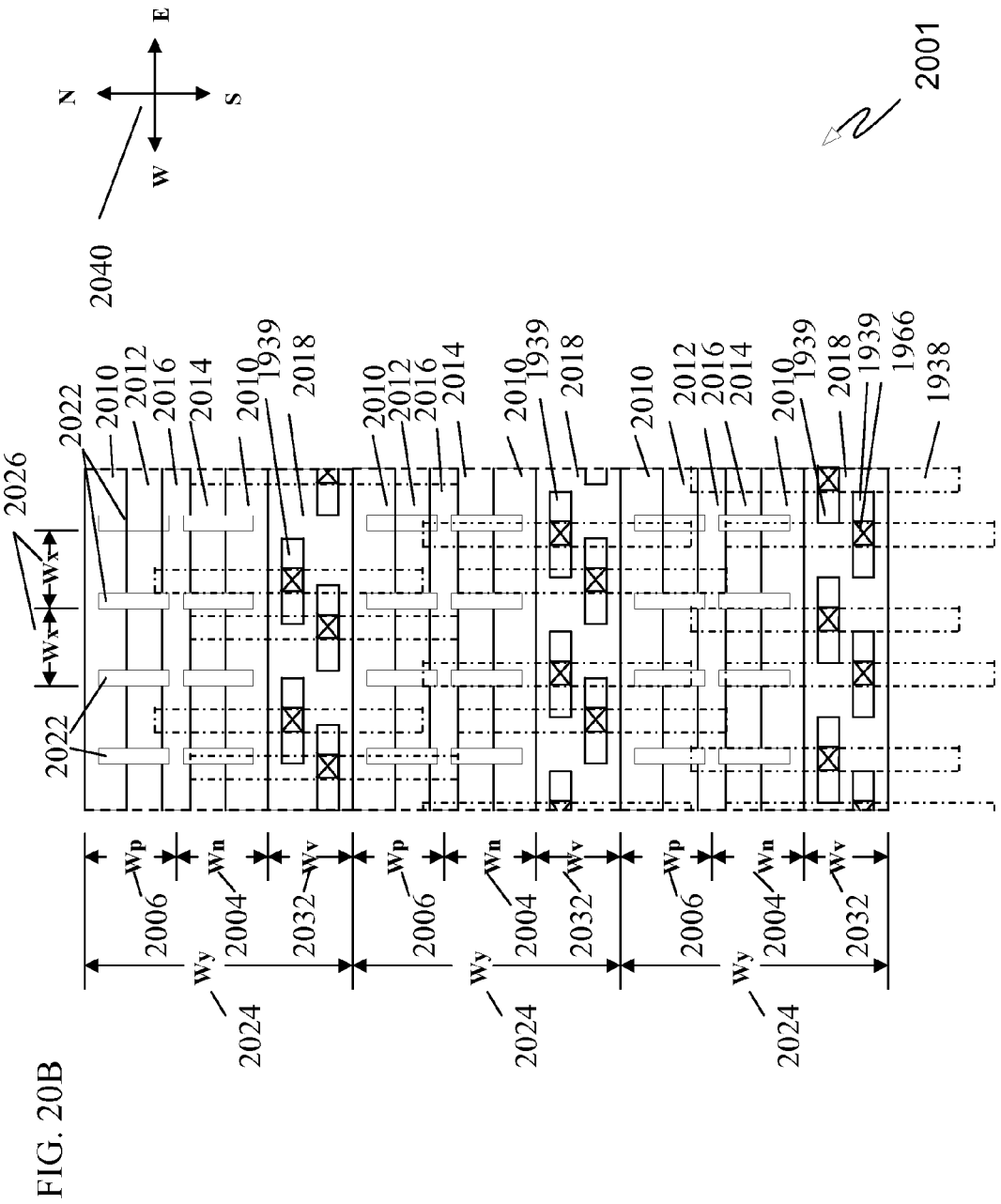
FIG. 20B illustrates an alternative repeatable structure to the repeatable structure of FIG. 20A.

FIG. 20B illustrates an alternative exemplary repeating transistor structure 2001 (or repeating transistor cell structure), where isolation region 2018 in the Donor wafer is enlarged and contains preparation for metal strips 1939 that form one part of the connection between Donor and Receptor wafers. The Receptor wafer contains orthogonal metal strips 1938 and the final locations for vias 1966, aligned east-west to marker 1921 and north-south to marker 1920, are bound to exist at their intersections, as shown in FIG. 19E. The width of isolation region 2018 needs to grow to 10F yielding north-south Wy step of 23F in this case.

Figure 20C:
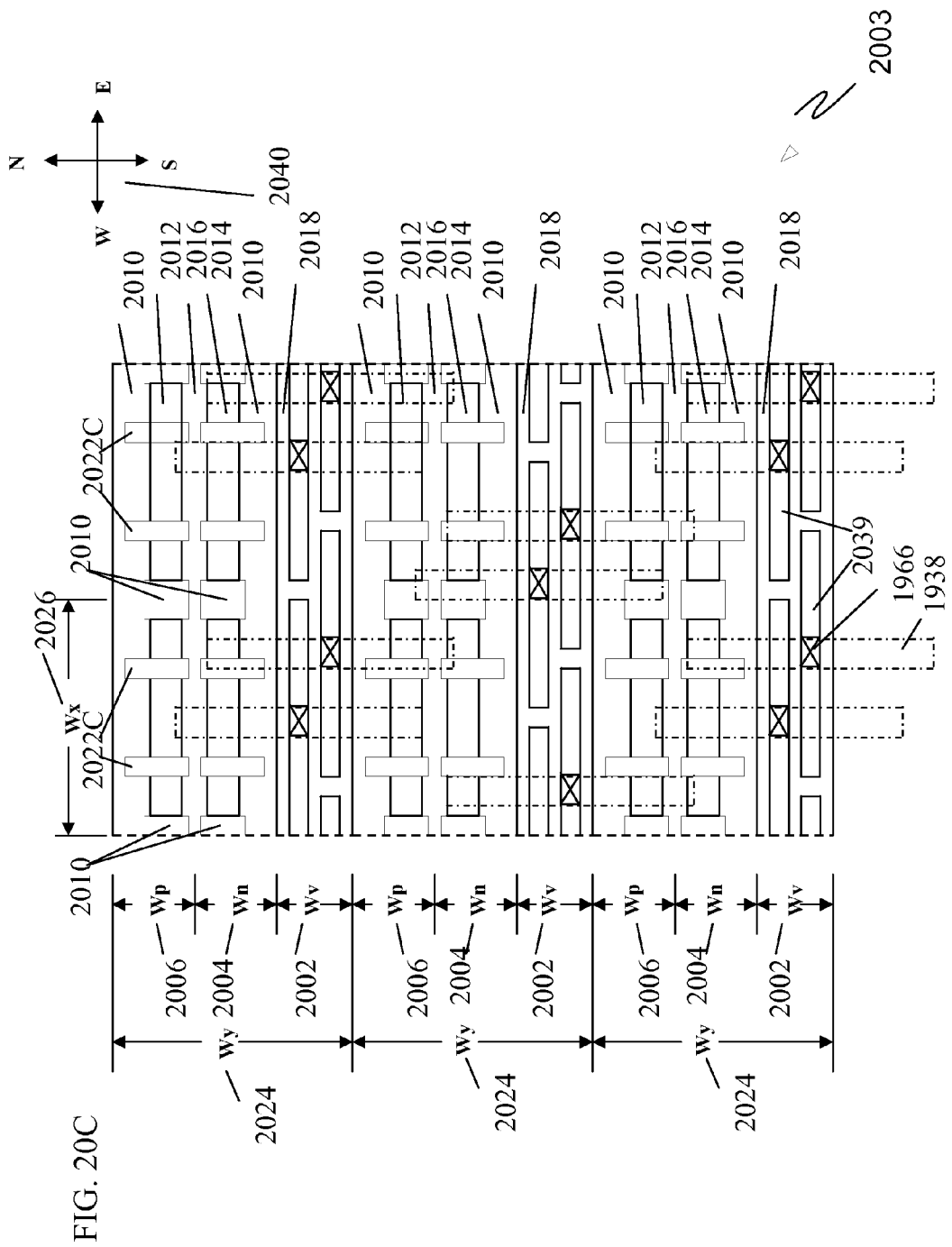
FIG. 20C illustrates an alternative repeatable structure to the repeatable structure of FIG. 20B.

FIG. 20C illustrates an alternative exemplary array of repeating transistor structures 2003 (or repeating transistor cell structure). Here the east-west active regions are broken every two gates by a north-south isolation region, yielding an east-west Wx repeat step 7806 of 14F. This two dimensional repeating transistor structure is suitable for use in the embodiment of FIG. 19C.

Figure 20D:
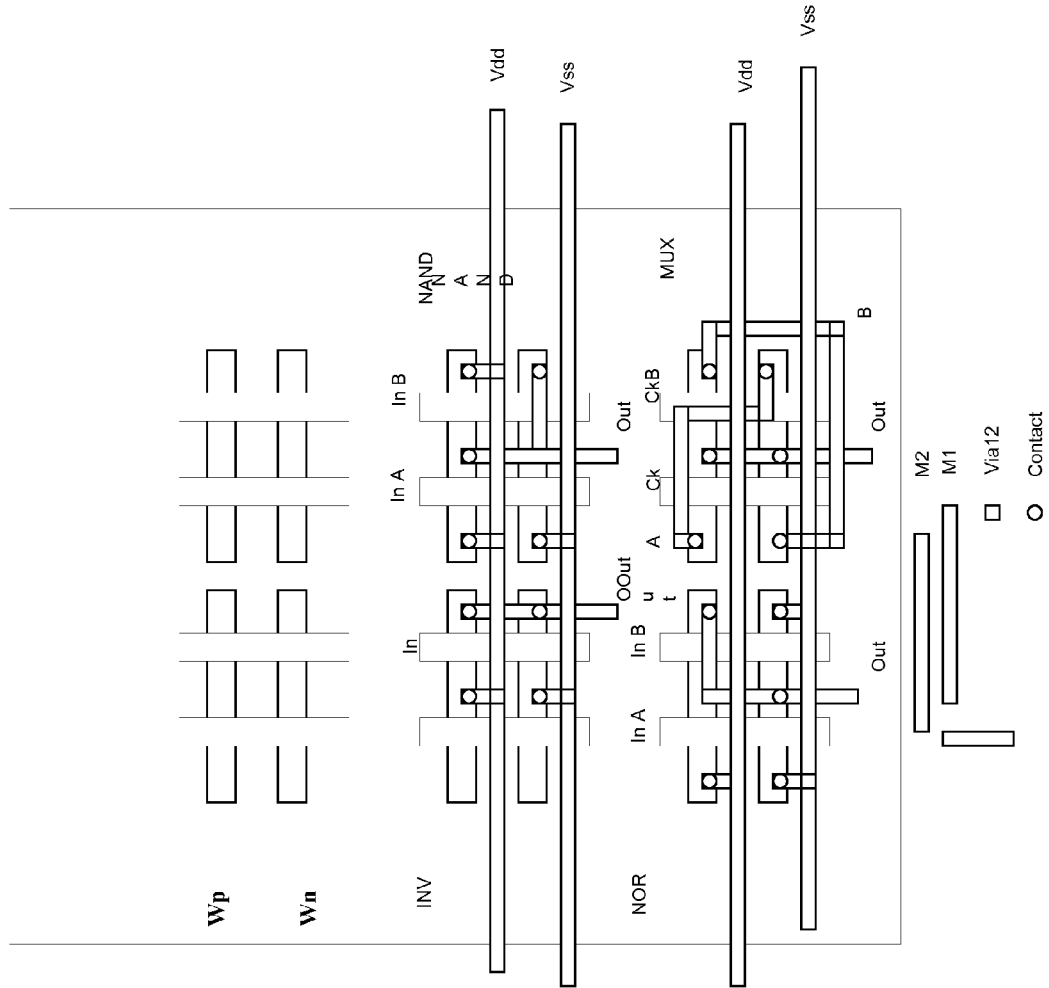
FIG. 20D illustrates an alternative repeatable gate array structure to the repeatable structure of FIG. 20C.

FIG. 20D illustrate a section of a Gate Array terrain with a repeating transistor cell structure. The cell is similar to the one of FIG. 20C wherein the respective gate of the N transistors are connected to the gate of the P transistors. FIG. 20D illustrate an implementation of basic logic cells: Inv, NAND, NOR, MUX It should be noted that in all these alternatives of FIGS. 20A-20D, mostly same mask set can be used for patterning multiple wafers with the only customization needed for a few metal layers after each layer transfer. Preferably, in some embodiments the masks for the transistor layers and at least some of the metal layers would be identical. What this invention allows is the creation of 3D systems based on the Gate Array (or Transistor Array) concept, where multiple implantation layers creating a sea of repeating transistor cell structures are uniform across wafers and customization after each layer transfer is only done through non-repeating metal interconnect layers. Preferably, the entire reticle area comprises repeating transistor cell structures. However in some embodiments some specialized circuitry may be required and a small percentage of the reticle on the order of at most 20% would be devoted to the specialized circuitry.

Figure 21:
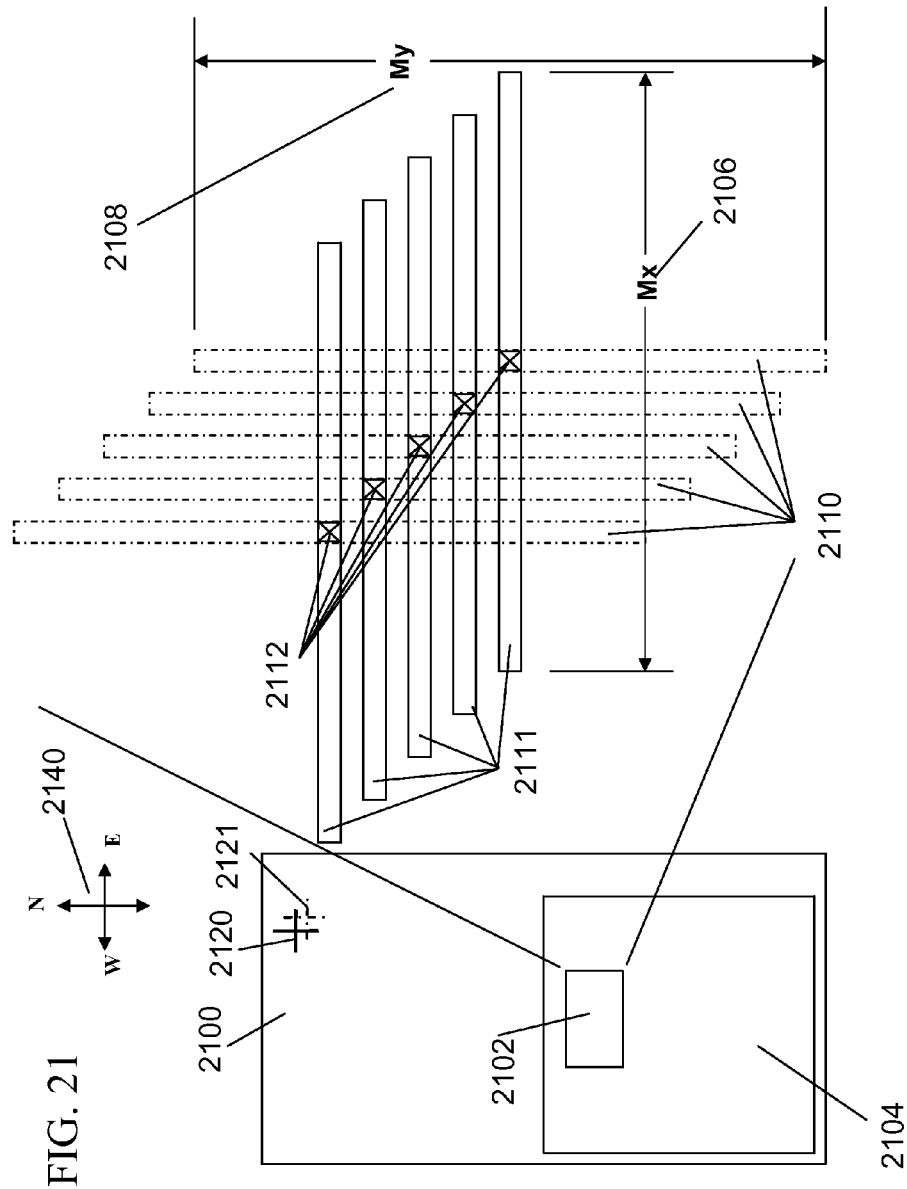
FIG. 21 illustrates an inter-wafer alignment scheme suitable for use with non-repeating structures.

FIG. 21 is a drawing illustration of similar concept of inter-wafer connection applied to large grain non repeating structure 2104 on a donor wafer 2100. Compass rose 2140 is used for orientation, with Donor alignment mark 2120 and Receptor alignment mark 2121. The connectivity structure 2102, which may be inside or outside 2104 boundary, comprises of donor wafer metal strips 2111, aligned to 2120, of length Mx 2106; and of metal strips 2110 on the Receptor wafer, aligned to 2121 and of length My 2108. The lengths Mx and My reflect the worst-case wafer misalignment in east-west and north-south respectively, plus any additional extensions to account for via size and overlap, as well as for wafer warp, bow, and angular wafer misalignment if needed. The inter-wafer vias 2112 will be placed after layer transfer aligned to alignment mark 2120 in north-south direction, and to alignment mark 2121 in east-west direction.

Figure 22A:
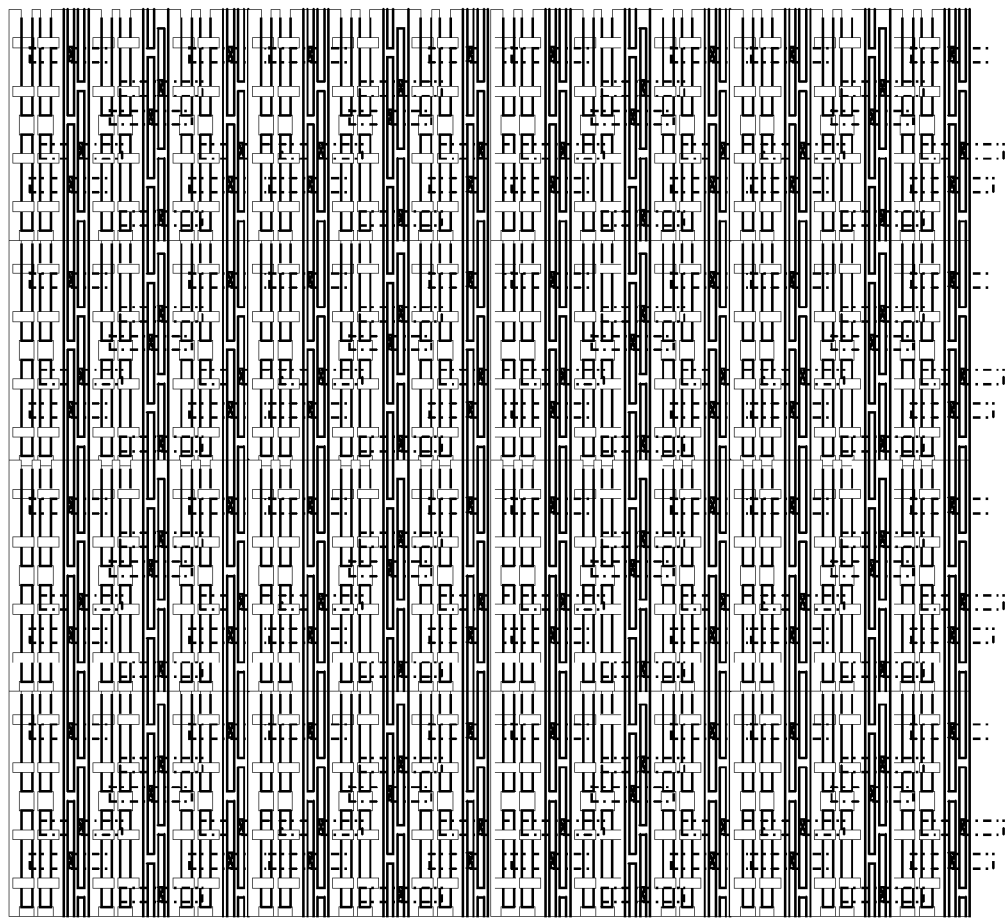
FIG. 22A illustrates an 8×12 array of the repeatable structure of FIG. 20C.
Figure 22B:
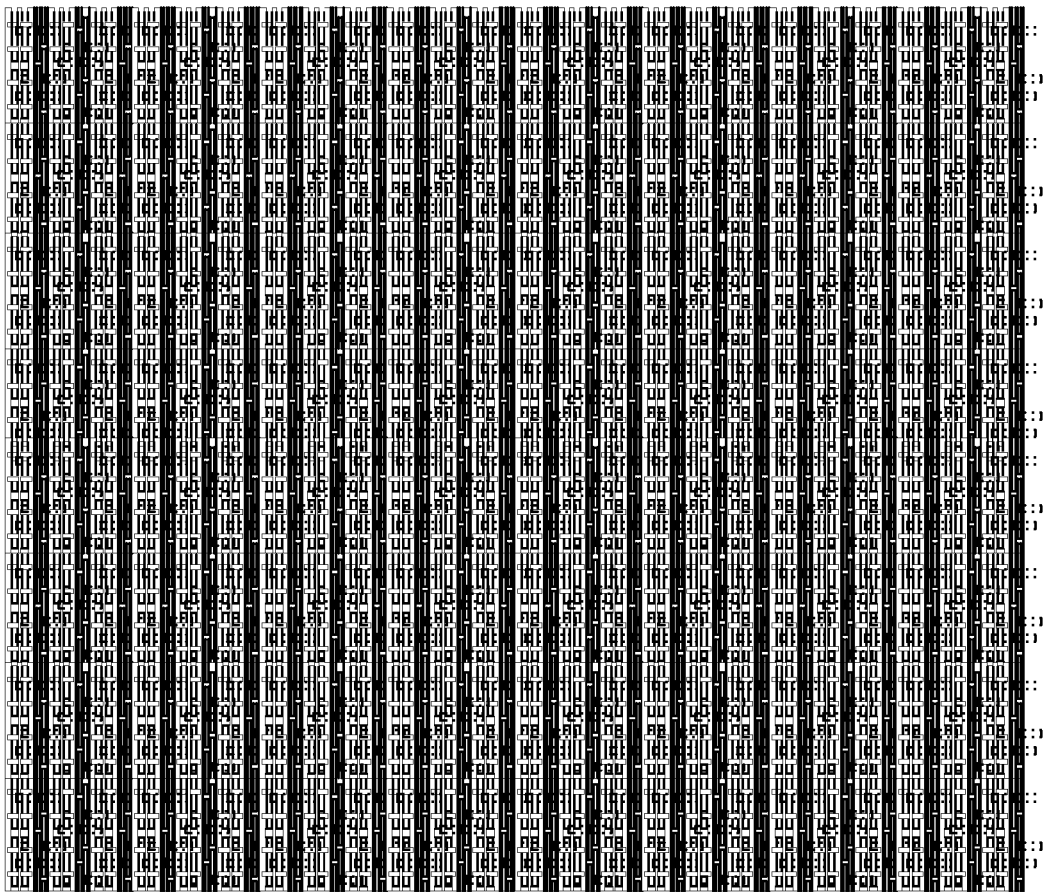
FIG. 22B illustrates a reticle of the repeatable structure of FIG. 20C.
Figure 22C:
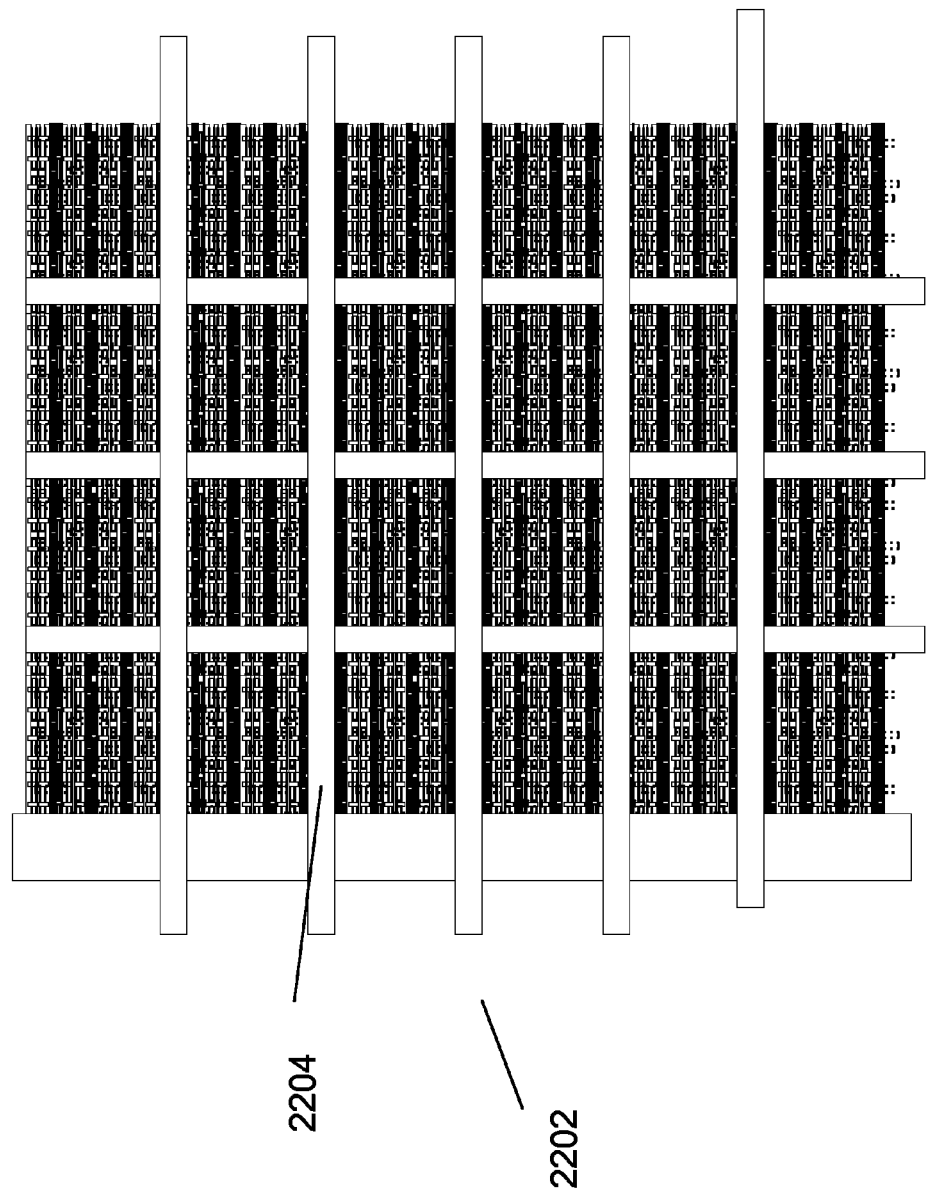
FIG. 22C illustrates the application of a dicing line mask to a continuous array of the structure of FIG. 22A.

FIG. 22A is a drawing illustration of extending the structure of FIG. 20C to a 8×12 array. This can be extended as in FIG. 22B to fill a full reticle with that pattern. That reticle size area can be then repeated across the whole wafer. This is an extension of the Continuous Array idea from U.S. Pat. No. 6,953,956, except that the repeated structure is of much finer granularity. Such structure does not have the definition of wafer dicing lines—those can be created by custom mask to etch away the devices as illustrated in FIG. 22C.

Person skilled in the art will recognize that it is now possible to assemble a true monolithic 3D stack of monocrystalline silicon layers with high performance devices using advanced lithography that repeatedly reuse same masks, with only few custom metal masks for each device layer. Such person will also appreciate that one can stack in the same way a mix of disparate layers, some carrying transistor array for general logic and other carrying larger scale blocks such as memories, analog elements, and I/O.

Figure 23A:
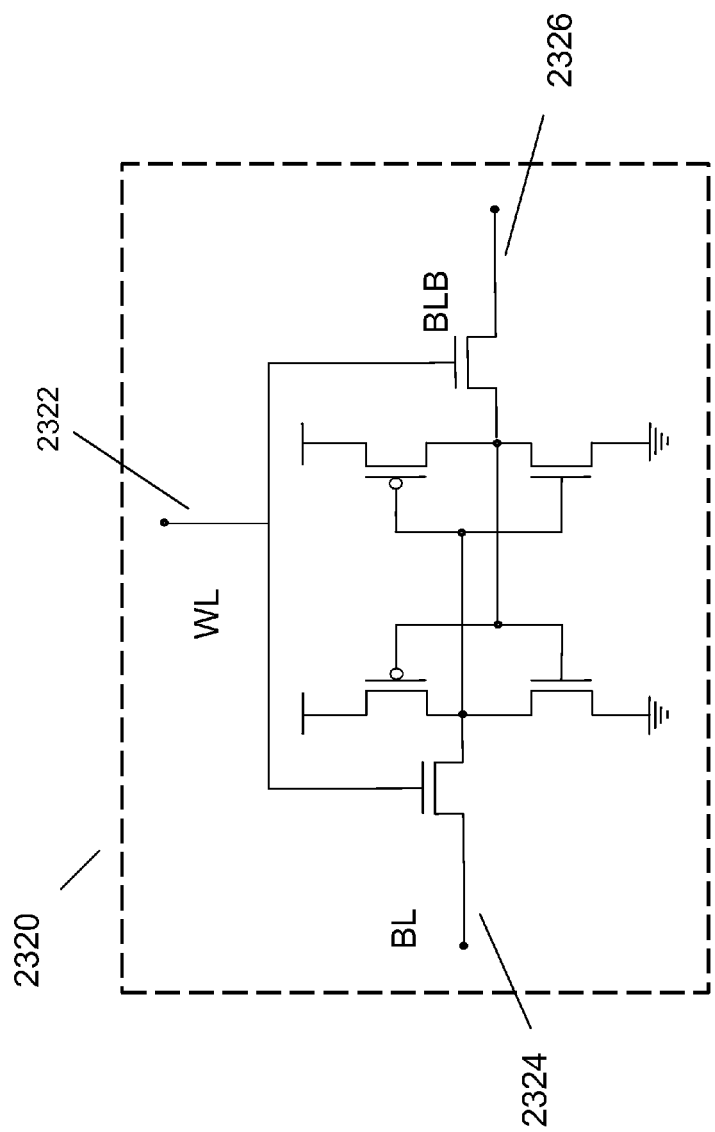
FIG. 23A illustrates a six transistor memory cell suitable for use in a continuous array memory according to the present invention.
Figure 23B:
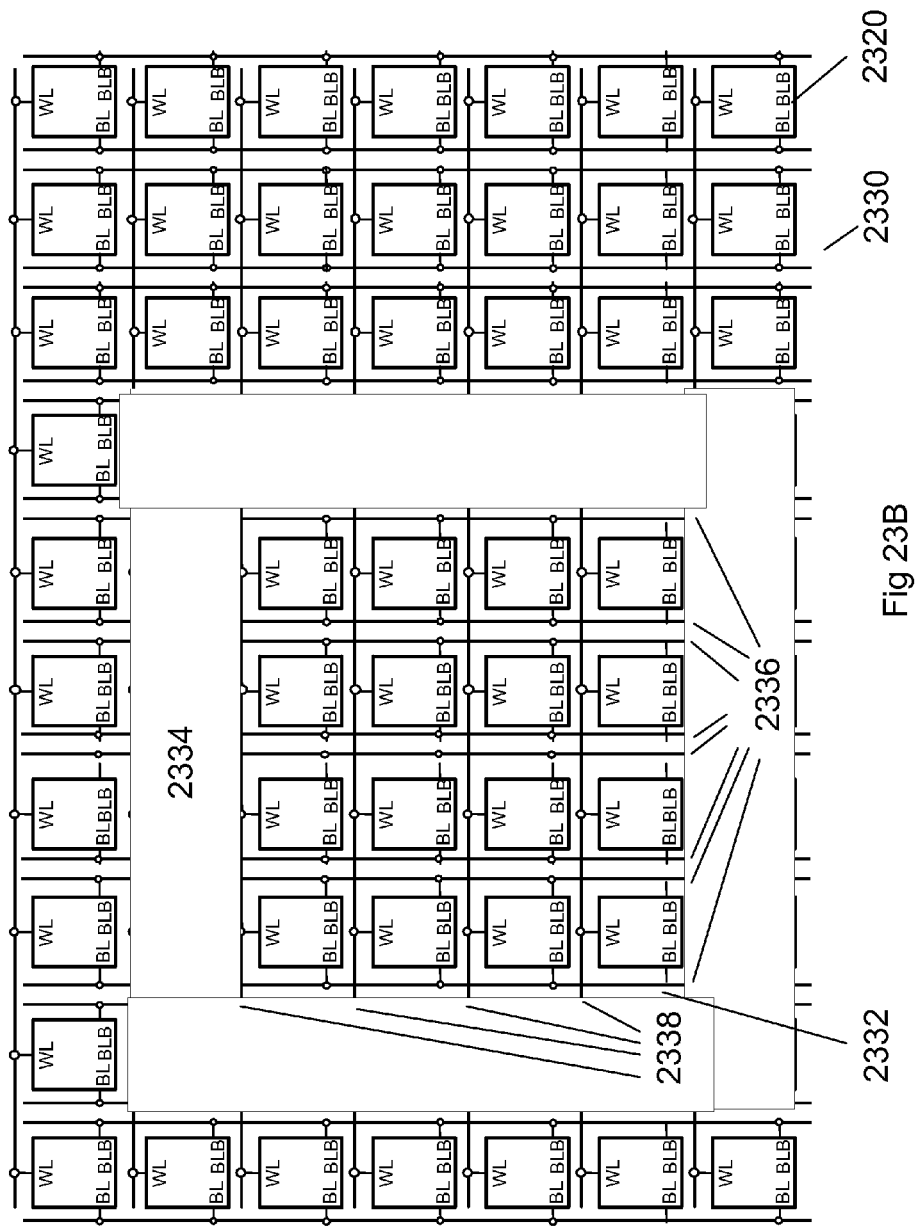
FIG. 23B illustrates a continuous array of the memory cells of FIG. 23A with an etching pattern defining a 4×4 array.
Figure 23C:
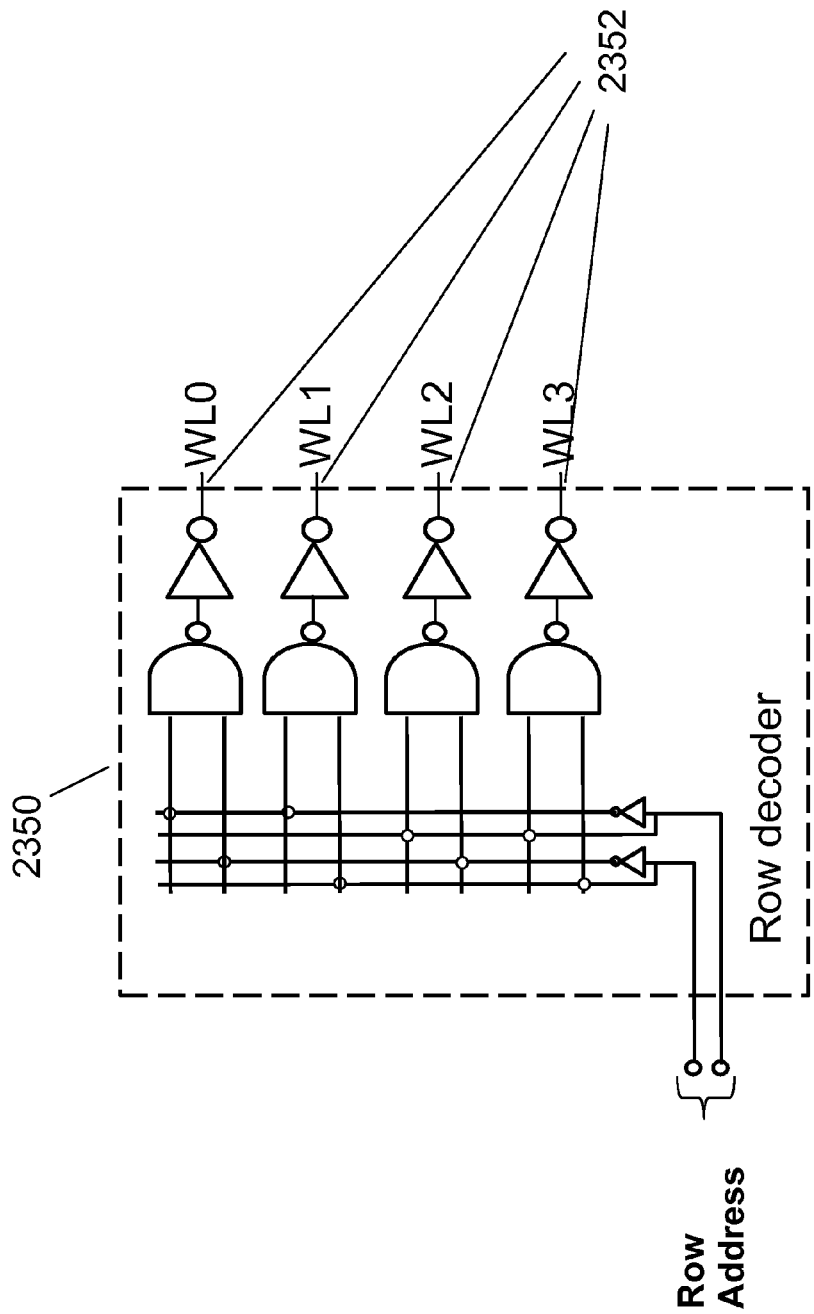
FIG. 23C illustrates a word decoder on another layer suitable for use with the defined array of FIG. 23B.
Figure 23D:
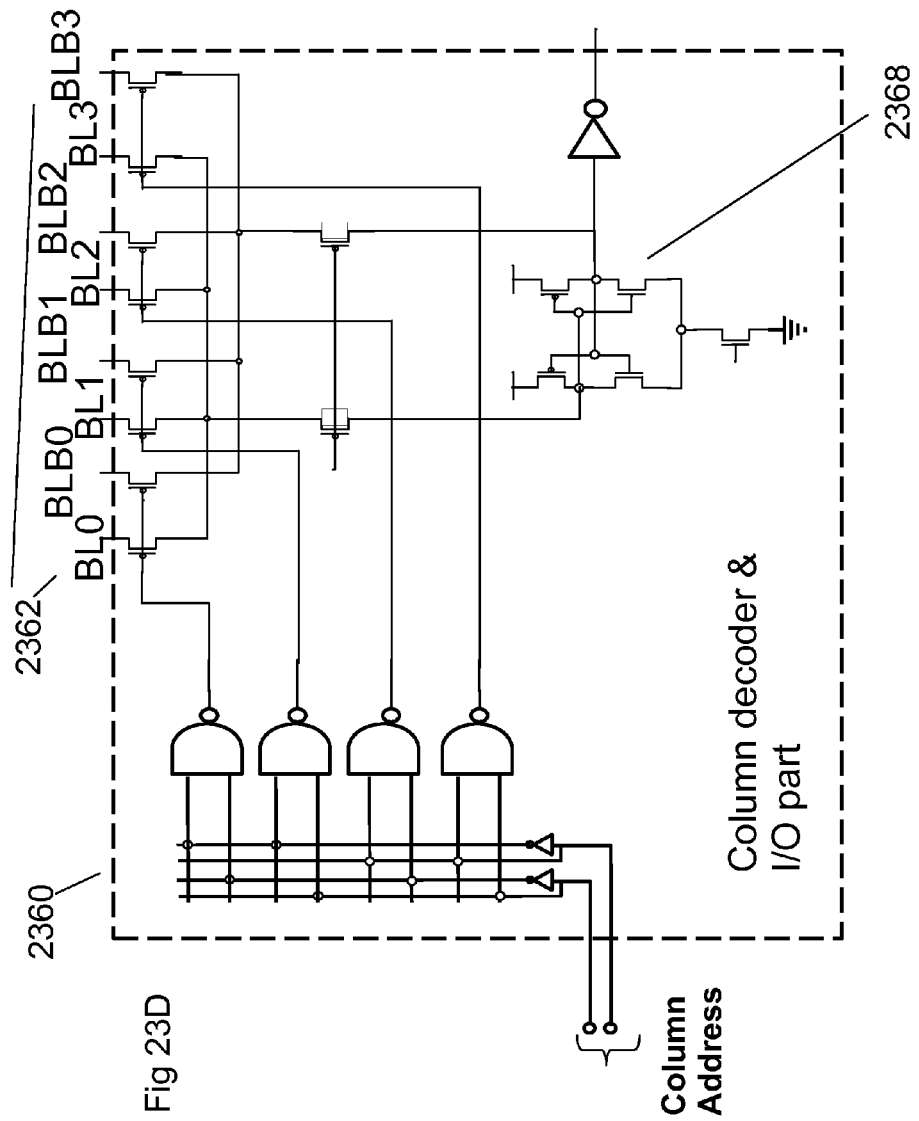
FIG. 23D illustrates a column decoder and sense amplifier on another layer suitable for use with the defined array of FIG. 23B.

The concept of dense Continuous Array concept can be also applied to memory structure. Memory arrays have non-repetitive elements such as bit and word decoders, or sense amplifier, that need to be tailored to each memory size. The idea is to tile the whole wafer with a dense pattern of memory cell, and then customize it using selective etching as before, and providing the required non-repetitive structures through an adjacent logic layer below or above the memory layer. FIG. 23A is a drawing illustration of a typical 6-transistor SRAM cell 2320, with its word line 2322, bit line 2324 and its inverse 2326. Such bit cell is typically densely packed and highly optimized for a given process. A dense array of such 2330 is illustrated in FIG. 23B. A four by four array 2332 may be defined through custom etching away the cells in channel 2334, leaving bit lines 2336 and word lines 2338 unconnected. These word lines 2338 may be then connected to an adjacent logic layer below that will have a word decoder 2350 in FIG. 23C that will drive them through outputs 2352. Similarly the bit lines may be driven by another decoder such as 2360 in FIG. 23D through its outputs 2362. A sense amplifier 2368 is also shown. A critical feature of this approach is that the customized logic can be provided from below or above in close vertical proximity to the area where it is needed assuring high performance customized memory blocks.

In such way a single expensive mask set can be used to build many wafers for different memory sizes and finished through another mask set that is used to build many logic wafers that can be customized by few metal layers.

Figure 24A:
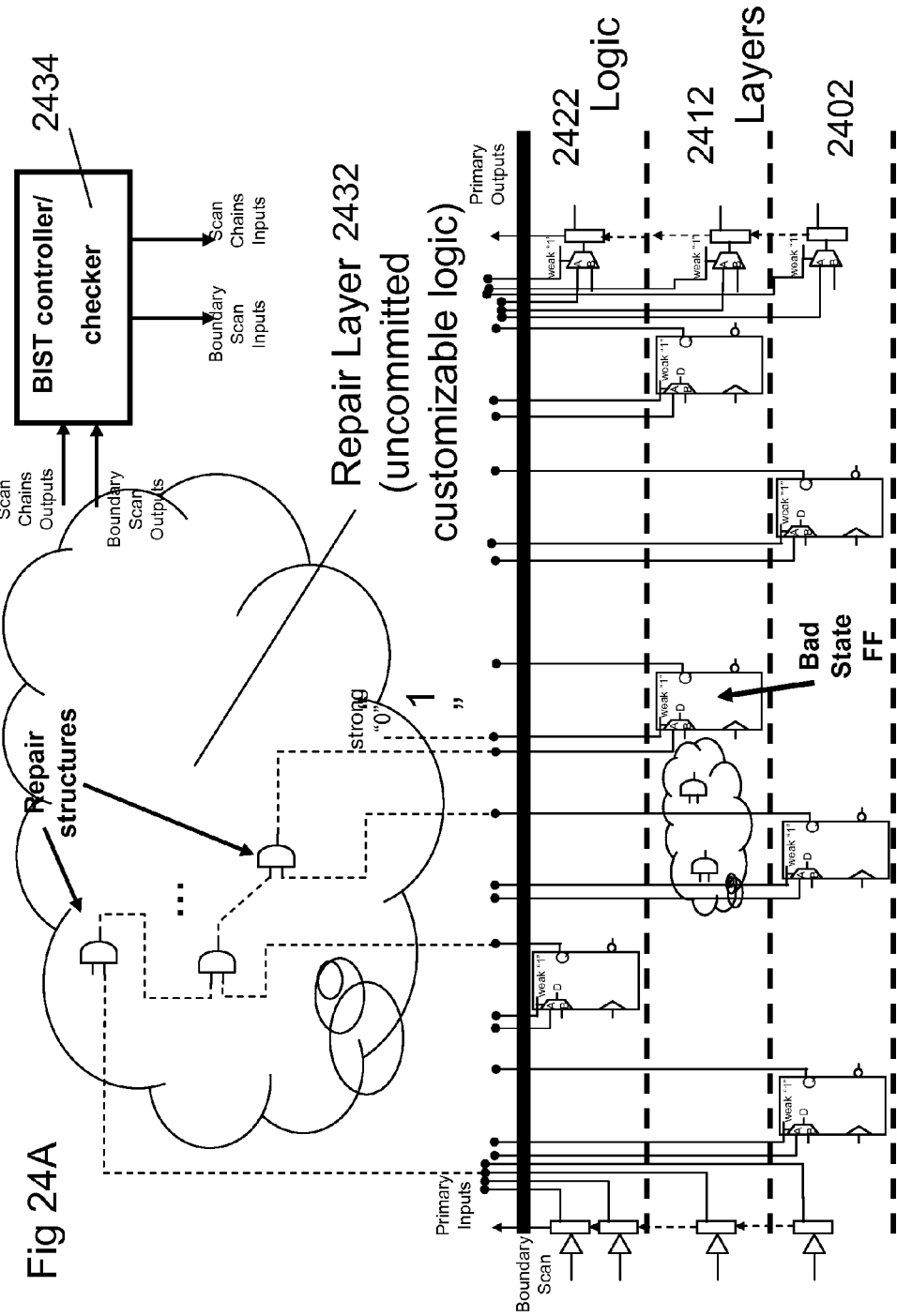
FIG. 24A illustrates a factory repairable 3D IC with three logic layers and a repair layer according to the present invention.

Another alternative of the invention for general type of 3D logic IC is presented on FIG. 24A. Here logic is distributed across multiple layers such as 2402, 2412 and 2422. An additional layer of logic ("Repair Layer") 2432 is used to effect repairs as needed in any of logic layers 2402, 2412 or 2422. Repair Layer's essential components include BIST Controller Checker ("BCC") 2434 that has access to I/O boundary scans and to all FF scan chains from logic layers, and uncommitted logic such as Gate Array described above. Such gate array can be customized using custom metal mask. Alternately it can use Direct-Write e-Beam technology such as available from Advantest or Fujitsu to write custom masking patterns in photoresist at each die location to repair the IC directly on the wafer during manufacturing process.

Figure 25:
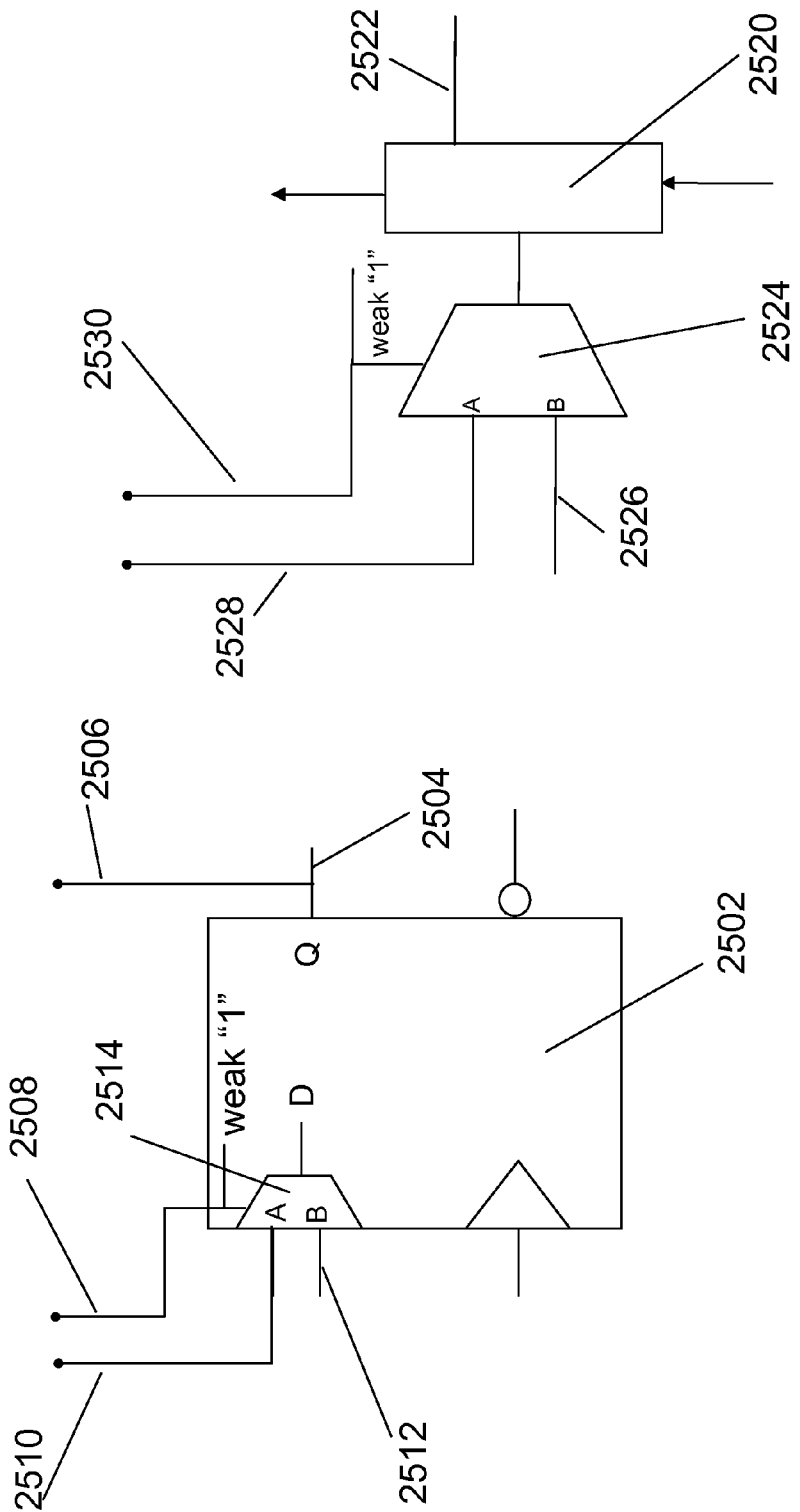
FIG. 25 illustrates a scan flip-flop suitable for use with the 3D IC of FIG. 24A.

It is important to note that substantially all the sequential cells like, for example, flip-flops (FFs), in the logic layers as well as substantially all the primary output boundary scan have certain extra features as illustrated in FIG. 25. Flip flop 2502 shows a possible embodiment and has its output 2504 drive gates in the logic layers, and in parallel it also has vertical stub 2506 raising to the Repair Layer 2432 through as many logic layer as required such as logic layers 2402 and 2412. In addition to any other scan control circuitry that may be necessary, flip flop 2501 also has an additional multiplexer 2514 at its input to allow selective or programmable coupling of replacement circuitry on the Repair Layer to flip flop 2502 D input. One of the multiplexer inputs 2510 can be driven from the Repair Layer, as can multiplexer control 2508. By default, when 2508 is not driven, multiplexer control is set to steer the original logic 2512 to feed the FF, which is driven from the preceding stages of logic. If a repair circuit is to replace the original logic coupled to node 2512, a programmable element like, for example, a latch, an SRAM bit, an antifuse, a flash memory bit, a fuse, or a metal link defined by the Direct-Write e-Beam repair, is used to control multiplexer control 2508. A similar structure comprising of input multiplexer 2524, inputs 2526 and 2528, and control input 2530 is present in substantively every primary output 2522 boundary scan cell 2520, in addition to its regular boundary scan function, which allows the primary outputs to be driven by the regular input 2526 or replaced by input 2528 from the Repair Layer as needed.

The way the repair works can be now readily understood from FIG. 24A. To maximize the benefit from this repair approach, designs need to be implemented as partial or full scan designs. Scan outputs are available to the BCC on the Repair Layer, and the BCC can drive the scan chains. The uncommitted logic on the Repair Layer can be finalized by processing a high metal or via layer, for example a via between layer 5 and layer 6 ("VIA6"), while the BCC is completed with metallization prior to that via, up to metal 5 in this example. During manufacturing, after the IC has been finalized to metal 5 of the repair layer, the chips on the wafer are powered up through a tester probe, the BIST is executed, and faulty FFs are identified. This information is transmitted by BCC to the external tester, and is driving the repair cycle. In the repair cycle the logic cone that feeds the faulty FF is identified, the net-list for the circuit is analyzed, and the faulty logic cone is replicated on the Repair Layer using Direct-Write e-Beam technology to customize the uncommitted logic through writing VIA6, and the replicated output is fed down to the faulty FF from the Repair Layer replacing the original faulty logic cone. It should be noted that because the physical location of the replicated logic cone can be made to be approximately the same as the original logic cone and just vertically displaced, the impact of the repaired logic on timing should be minimal. In alternate implementation additional features of uncommitted logic such as availability of variable strength buffers, may be used to create repair replica of the faulty logic cone that will be slightly faster to compensate for the extra vertical distance.

People skilled in the art will appreciate that Direct-Write e-Beam customization can be done on any metal or via layer as long as such layer is fabricated after the BCC construction and metallization is completed. They will also appreciate that for this repair technique to work the design can have sections of logic without scan, or without special circuitry for FFs such as described in FIG. 25. Absence of such features in some portion of the design will simply reduce the effectiveness of the repair technique. Alternatively, the BCC can be implemented on one or more of the Logic Layers, or the BCC function can be performed using an external tester through JTAG or some other test interface. This allows full customization of all contact, metal and via layers of the Repair Layer.

FIG. 24B is a drawing illustration of the concept that it may be beneficial to chain FFs on each logic layer separately before feeding the scan chains outputs to the Repair Layer because this may allow testing the layer for integrity before continuing with 3D IC assembly.

It should be noted that the repair flow just described can be used to correct not only static logic malfunctions but also timing malfunctions that may be discovered through the scan or BIST test. Slow logic cones may be replaced with faster implementations constructed from the uncommitted logic on the Repair Layer further improving the yield of such complex systems.

Figure 24C:
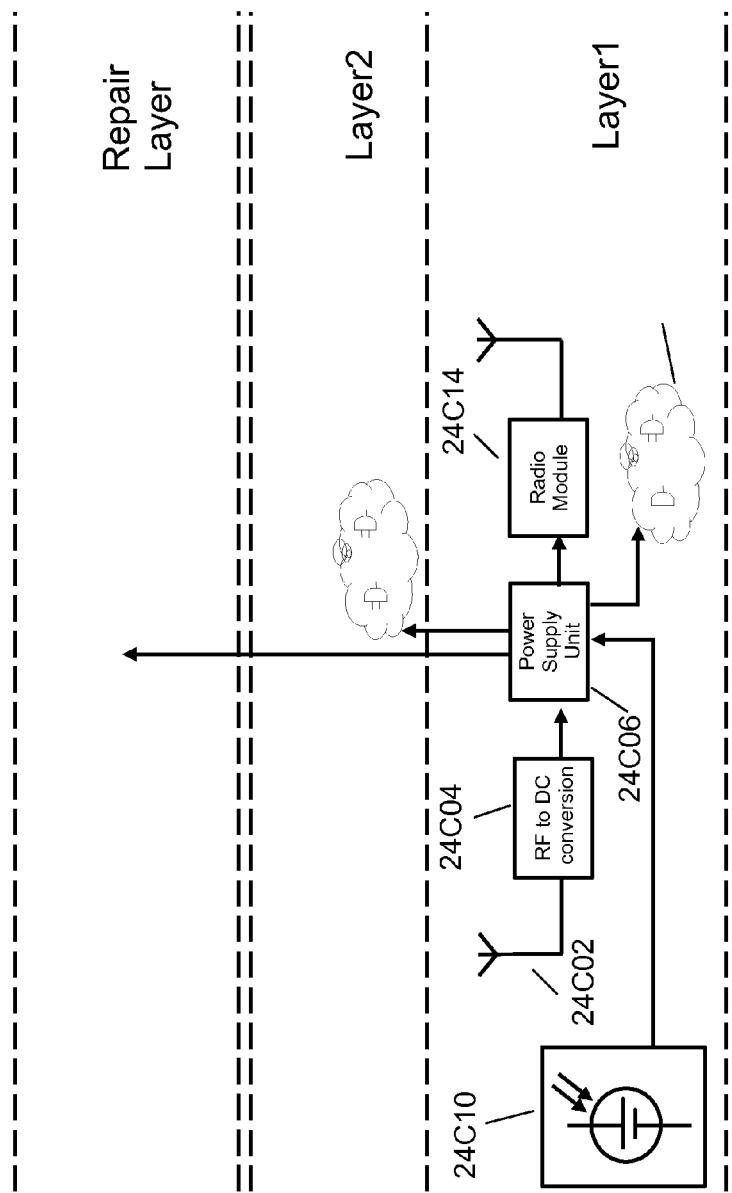
FIG. 24C illustrates methods of contactless testing of the 3D IC of FIG. 24A.

FIG. 24C is a drawing illustration of an alternative implementation of the invention where the ICs on the wafer may be powered and tested through contactless means instead of probes, avoiding potential damage to the wafer surface. One of the active layers of the 3D IC may include Radio Frequency ("RF") antenna 24C02 and RF to Direct Current ("DC") converter 24C04 that powers the power supply unit 24C06. Using this technique the wafer can be powered in a contactless manner to perform self testing. The results of such self testing can be communicated with computing devices external to the wafer under test using RF module 24C14.

An alternative embodiment of the invention may use a small photovoltaic cell 24C10 to power the power supply unit instead of RF induction and RF to DC converter.

An alternative approach to increase yield of complex systems through use of 3D structure is to duplicate the same design on two layers vertically stacked on top of each other and use BIST techniques similar to those described in the previous sections to identify and replace malfunctioning logic cones. This should prove particularly effective repairing very large ICs with very low yields at manufacturing stage using one-time, or hard to reverse, repair structures such as antifuses or Direct-Write e-Beam customization. Similar repair approach can also assist systems that require self-healing ability at every power-up sequence through use of memory-based repair structures as described with regard to FIG. 26 below.

Figure 26:
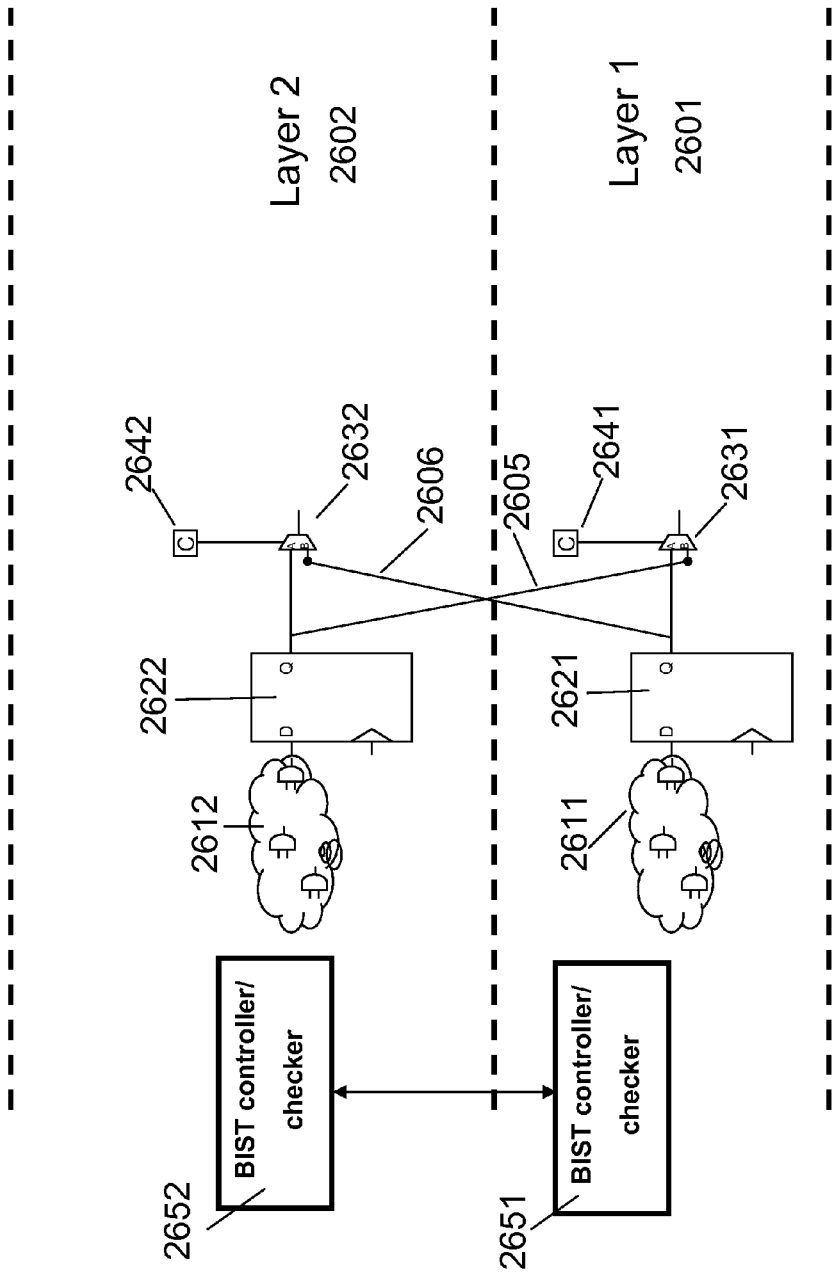
FIG. 26 illustrates a first field repairable 3D IC according to the present invention.

FIG. 26 is a drawing illustration of one possible implementation of this concept. Two vertically stacked logic layers 2601 and 2602 implement essentially an identical design. The design (same on each layer) is scan-based and includes BIST Controller/Checker on each layer 2651 and 2652 that can communicate with each other either directly or through an external tester. 2621 is a representative FF on the first layer that has its corresponding FF 2622 on layer 2, each fed by its respective identical logic cones 2611 and 2612. The output of flip flop 2621 is coupled to the A input of multiplexer 2631 and the B input of multiplexer 2632 through vertical connection 2606, while the output of flip flop 2622 is coupled to the A input of multiplexer 2632 and the B input of multiplexer 2631 through vertical connection 2605. Each such output multiplexer is respectively controlled from control points 2641 and 2642, and multiplexer outputs drive the respective following logic stages at each layer. Thus, either logic cone 2611 and flip flop 2621 or logic cone 2612 and flip flop 2622 may be either programmably coupleable or selectively coupleable to the following logic stages at each layer.

It should be noted that the multiplexer control points 2641 and 2642 can be implemented using a memory cell, a fuse, an Antifuse, or any other customizable element such as metal link that can be customized by a Direct-Write e-Beam machine. If a memory cell is used, its contents can be stored in a ROM, a flash memory, or in some other non-volatile storage mechanism elsewhere in the 3D IC or in the system in which it is deployed and loaded upon a system power up, a system reset, or on-demand during system maintenance.

Upon power on the BCC initializes all multiplexer controls to select inputs A and runs diagnostic test on the design on each layer. Failing FF are identified at each logic layer using scan and BIST techniques, and as long as there is no pair of corresponding FF that fails, the BCCs can communicate with each other (directly or through an external tester) to determine which working FF to use and program the multiplexer controls 2641 and 2642 accordingly.

It should be noted that if multiplexer controls 2641 and 2642 are reprogrammable as in using memory cells, such test and repair process can potentially occur at every power on instance, or on demand, and the 3D IC can self-repair in-circuit. If the multiplexer controls are one-time programmable, the diagnostic and repair process may need to be performed using external equipment. It should be noted that the techniques for contact-less testing and repair as previously described with regard to FIG. 24C can be applicable in this situation.

An alternative embodiment of this concept can use multiplexing 2514 at the inputs of the FF such as described in FIG. 25. In that case both the Q and the inverted Q of FFs may be used, if present.

Person skilled in the art will appreciate that this repair technique of selecting one of two possible outputs from two essentially similar blocks vertically stacked on top of each other can be applied to other type of blocks in addition to FF described above. Examples of such include, but are not limited to, analog blocks, I/O, memory, and other blocks. In such cases the selection of the working output may require specialized multiplexing but it does not change its essential nature.

Such person will also appreciate that once the BIST diagnosis of both layers is complete, a mechanism similar to the one used to define the multiplexer controls can be also used to selectively power off unused sections of a logic layers to save on power dissipation.

Yet another variation on the invention is to use vertical stacking for on the fly repair using redundancy concepts such as Triple (or higher) Modular Redundancy ("TMR"). TMR is a well known concept in the high-reliability industry where three copies of each circuit are manufactured and their outputs are channeled through a majority voting circuitry. Such TMR system will continue to operate correctly as long as no more than a single fault occurs in any TMR block. A major problem in designing TMR ICs is that when the circuitry is triplicated the interconnections become significantly longer slowing down the system speed, and the routing becomes more complex slowing down system design. Another major problem for TMR is that its design process is expensive because of correspondingly large design size, while its market is limited.

Figure 27:
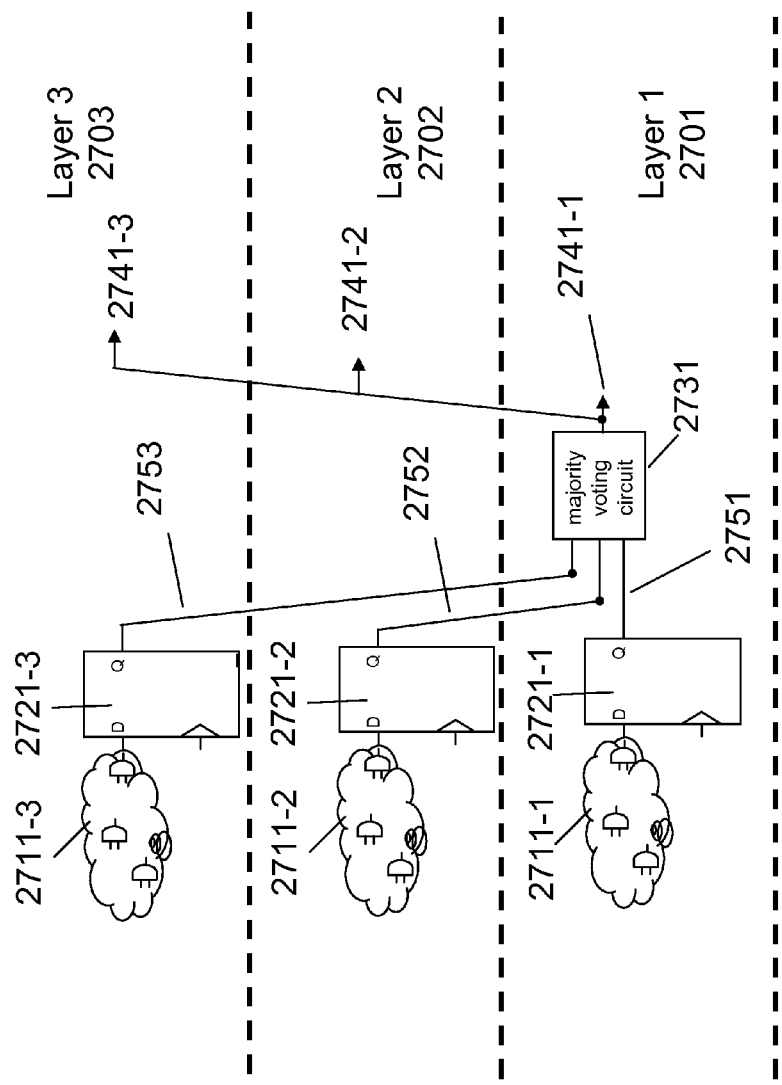
FIG. 27 illustrates a first Triple Modular Redundancy 3D IC according to the present invention.
Figure 28:
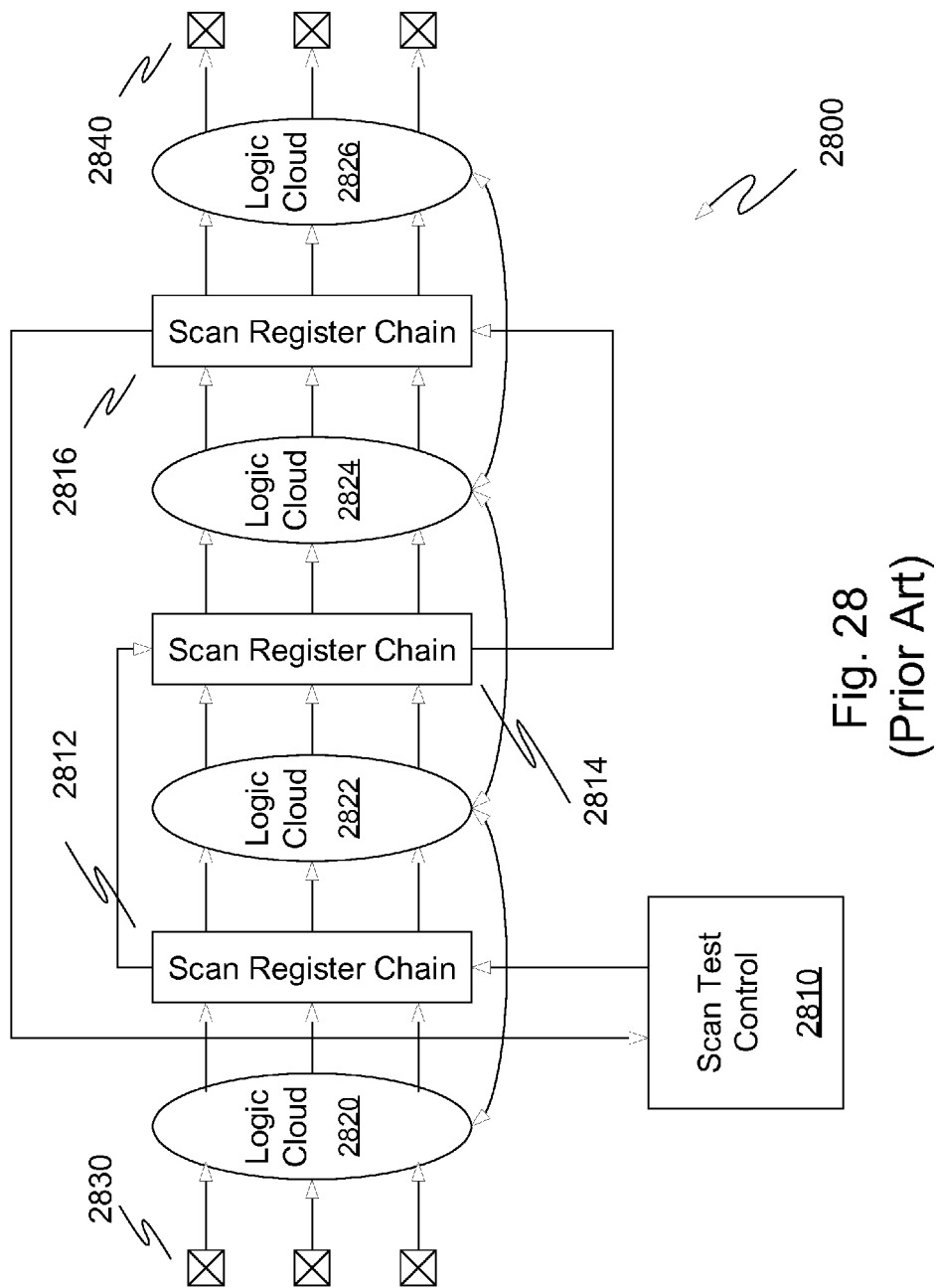
FIG. 28 illustrates a set scan architecture of the prior art.
Figure 29:
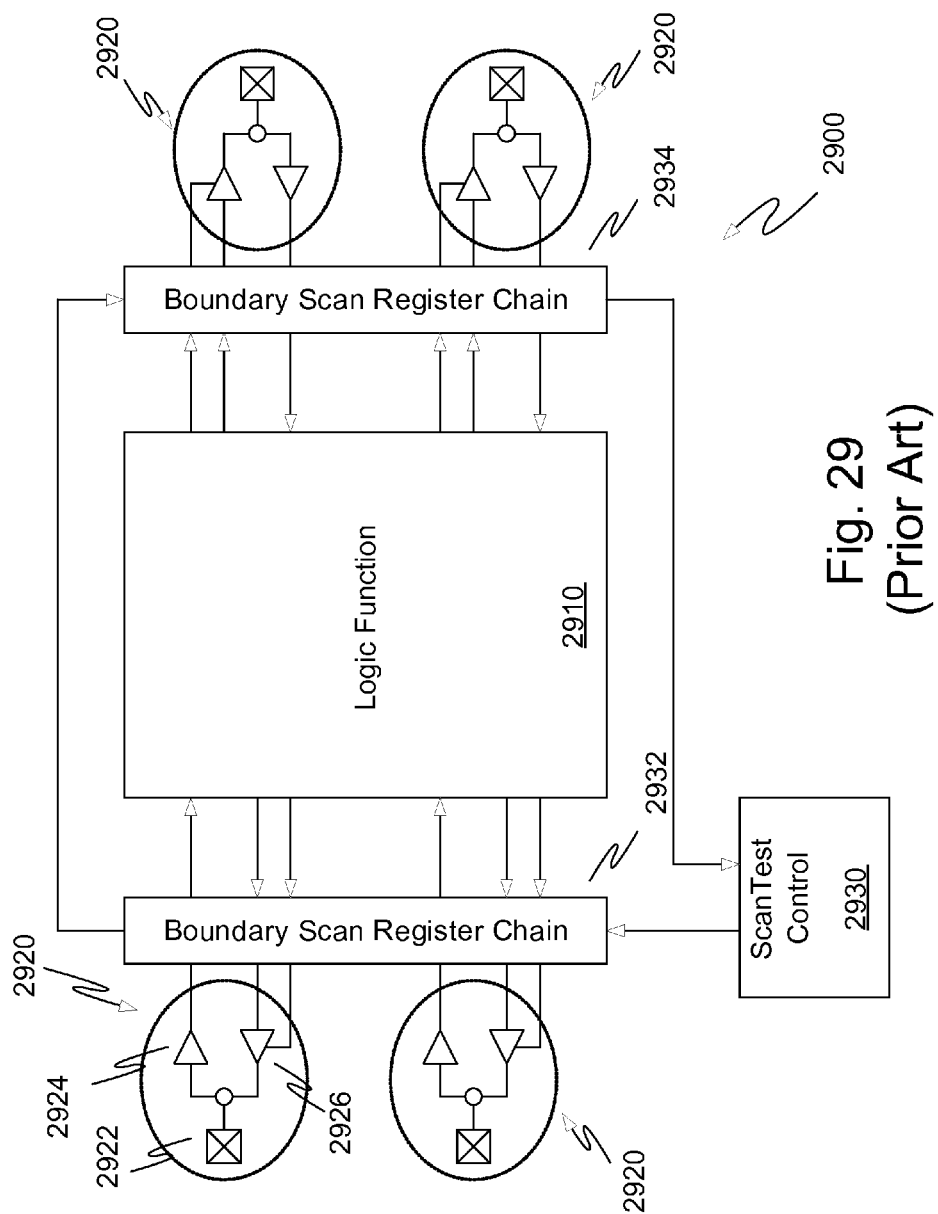
FIG. 29 illustrates a boundary scan architecture of the prior art.
Figure 30:
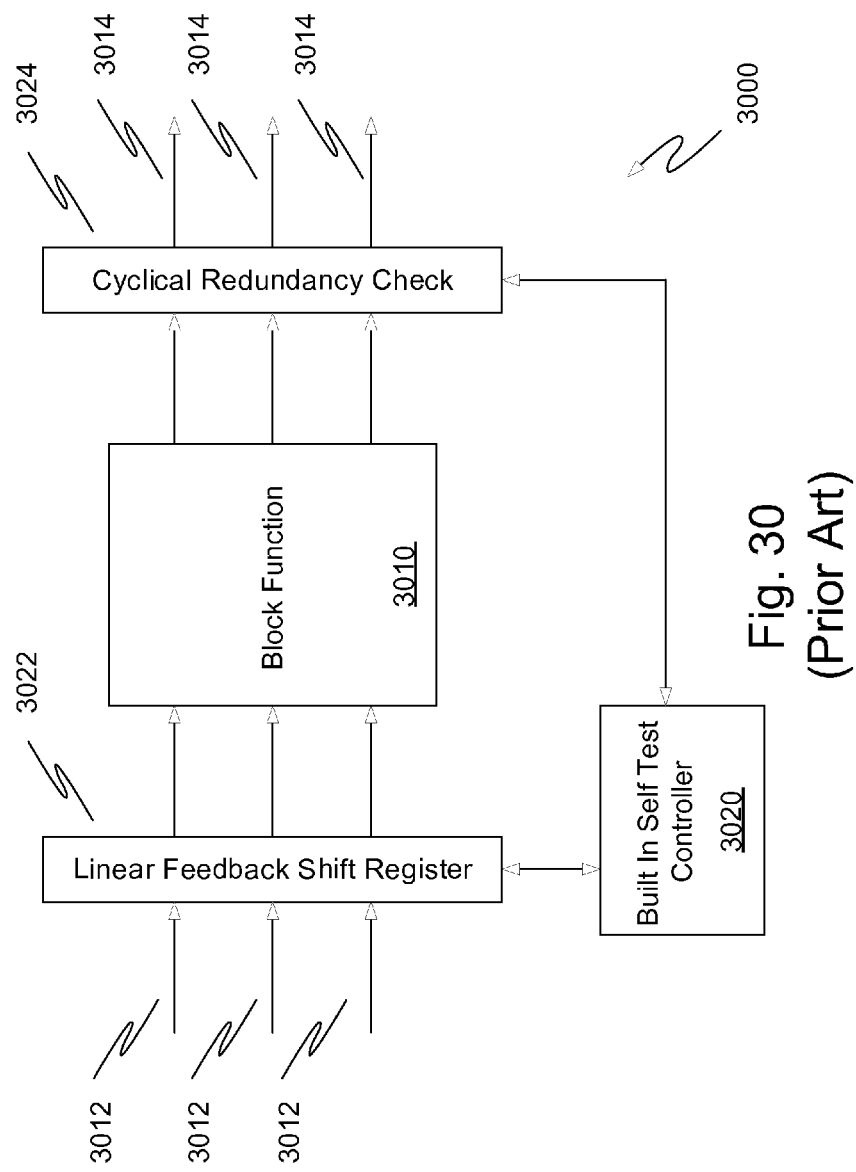
FIG. 30 illustrates a BIST architecture of the prior art.

Vertical stacking offers a natural solution of replicating the system image on top of each other. FIG. 27 is a drawing illustration of such system with three layers 2701 2702 2703, where combinatorial logic is replicated such as in logic cones 2711-1, 2711-2, and 2711-3, and FFs are replicated such as 2721-1, 2721-2, and 2721-3. One of the layers, 2701 in this depiction, includes a majority voting circuitry 2731 that arbitrates among the local FF output 2751 and the vertically stacked FF outputs 2752 and 2753 to produce a final fault tolerant FF output that needs to be distributed to all logic layers as 2741-1, 2741-2, 2741-3.

Person skilled in the art will appreciate that variations on this configuration are possible such as dedicating a separate layer just to the voting circuitry that will make layers 2701, 2702 and 2703 logically identical; relocating the voting circuitry to the input of the FFs rather than to its output; or extending the redundancy replication to more than 3 instances (and stacked layers).

The abovementioned method for designing TMR addresses both of the mentioned weaknesses. First, there is essentially no additional routing congestion in any layer because of TMR, and the design at each layer can be optimally implemented in a single image rather than in triplicate. Second, any design implemented for non high-reliability market can be converted to TMR design with minimal effort by vertical stacking of three original images and adding a majority voting circuitry either to one of the layers, to all three layers as in FIG. 27, or as a separate layer. A TMR circuit can be shipped from the factory with known errors present (masked by the TMR redundancy), or a Repair Layer can be added to repair any known errors for an even higher degree of reliability.

The exemplary embodiments discussed so far are primarily concerned with yield enhancement and repair in the factory prior to shipping a 3D IC to a customer. Another aspect of the present invention is providing redundancy and self-repair once the 3D IC is deployed in the field. This is a desirable product characteristic because defects may occur in products that tested as operating correctly in the factory. For example, this can occur due to a delayed failure mechanism such as a defective gate dielectric in a transistor that develops into a short circuit between the gate and the underlying transistor source, drain or body. Immediately after fabrication such a transistor may function correctly during factory testing, but with time and applied voltages and temperatures, the defect can develop into a failure which may be detected during subsequent tests in the field. Many other delayed failure mechanisms are known. Regardless of the nature of the delayed defect, if it creates a logic error in the 3D IC then subsequent testing according to the present invention may be used to detect and repair it.

Figure 31:
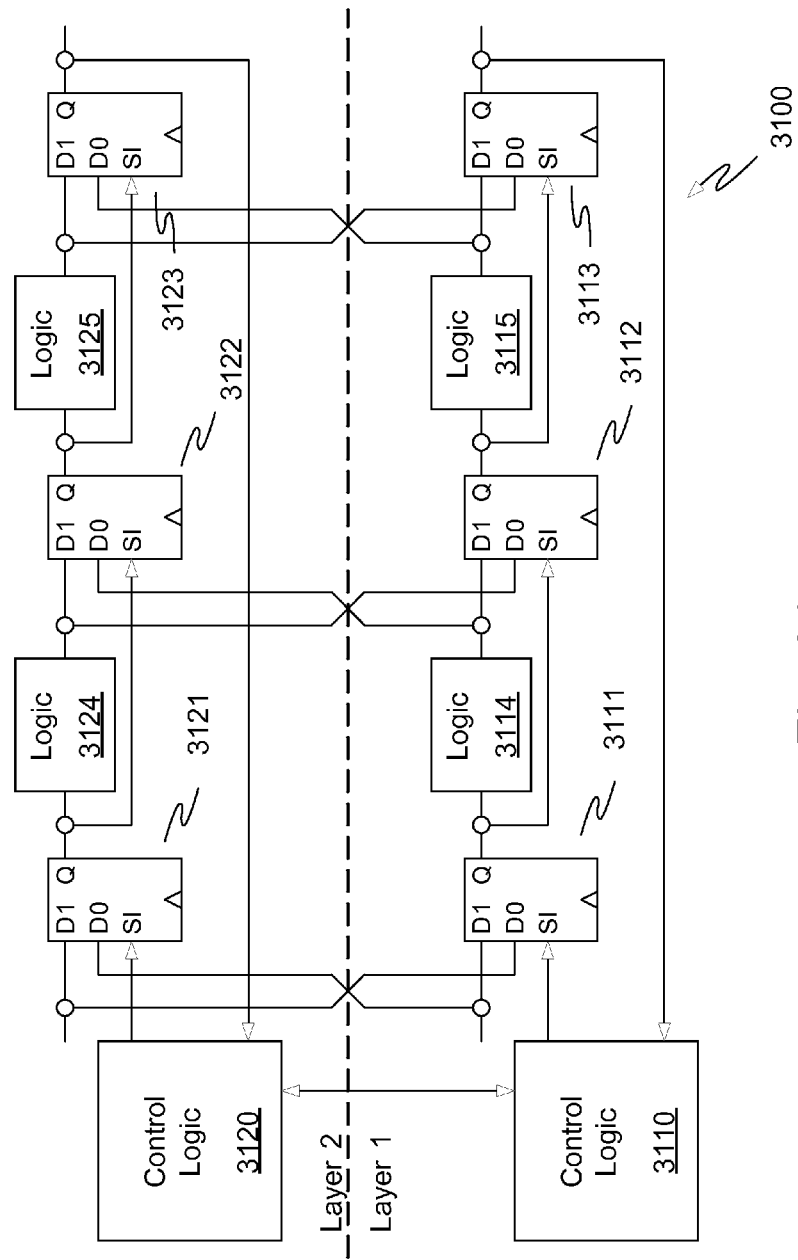
FIG. 31 illustrates a second field repairable 3D IC according to the present invention.

FIG. 31 illustrates an exemplary 3D IC generally indicated by 3100 according to the present invention. 3D IC 3100 comprises two layers labeled Layer 1 and Layer 2 and separated by a dashed line in the figure. Layer 1 and Layer 2 may be bonded together into a single 3D IC using methods known in the art. The electrical coupling of signals between Layer 1 and Layer 2 may be realized with Through-Silicon Via (TSV) or some other interlayer technology. Layer 1 and Layer 2 may each comprise a single layer of semiconductor devices called a Transistor Layer and its associated interconnections (typically realized in one or more physical Metal Layers) which are called Interconnection Layers. The combination of a Transistor Layer and one or more Interconnection Layers is called a Circuit Layer. Layer 1 and Layer 2 may each comprise one or more Circuit Layers of devices and interconnections as a matter of design choice.

Regardless of the details of their construction, Layer 1 and Layer 2 in 3D IC 3100 perform substantially identical logic functions. In some embodiments, Layer 1 and Layer 2 may each be fabricated using the same masks for all layers to reduce manufacturing costs. In other embodiments there may be small variations on one or more mask layers. For example, there may be an option on one of the mask layers which creates a different logic signal on each layer which tells the control logic blocks on Layer 1 and Layer 2 that they are the controllers Layer 1 and Layer 2 respectively in cases where this is important. Other differences between the layers may be present as a matter of design choice.

Layer 1 comprises Control Logic 3110, representative scan flip-flops 3111, 3112 and 3113, and representative combinational logic clouds 3114 and 3115, while Layer 2 comprises Control Logic 3120, representative scan flip-flops 3121, 3122 and 3123, and representative logic clouds 3124 and 3125. Control Logic 3110 and scan flip-flops 3111, 3112 and 3113 are coupled together to form a scan chain for set scan testing of combinational logic clouds 3114 and 3115 in a manner previously described. Control Logic 3120 and scan flip-flops 3121, 3122 and 3123 are also coupled together to form a scan chain for set scan testing of combinational logic clouds 3124 and 3125. Control Logic blocks 3110 and 3120 are coupled together to allow coordination of the testing on both Layers. In some embodiments, Control Logic blocks 3110 and 3120 may be able to test either themselves or each other. If one of them is bad, the other can be used to control testing on both Layer 1 and Layer 2.

Persons of ordinary skill in the art will appreciate that the scan chains in FIG. 31 are representative only, that in a practical design there may be millions of flip-flops which may broken into multiple scan chains, and the inventive principles disclosed herein apply regardless of the size and scale of the design.

As with previously described embodiments, the Layer 1 and Layer 2 scan chains may be used in the factory for a variety of testing purposes. For example, Layer 1 and Layer 2 may each have an associated Repair Layer (not shown in FIG. 31) which was used to correct any defective logic cones or logic blocks which originally occurred on either Layer 1 or Layer 2 during their fabrication processes. Alternatively, a single Repair Layer may be shared by Layer 1 and Layer 2.

Figure 32:
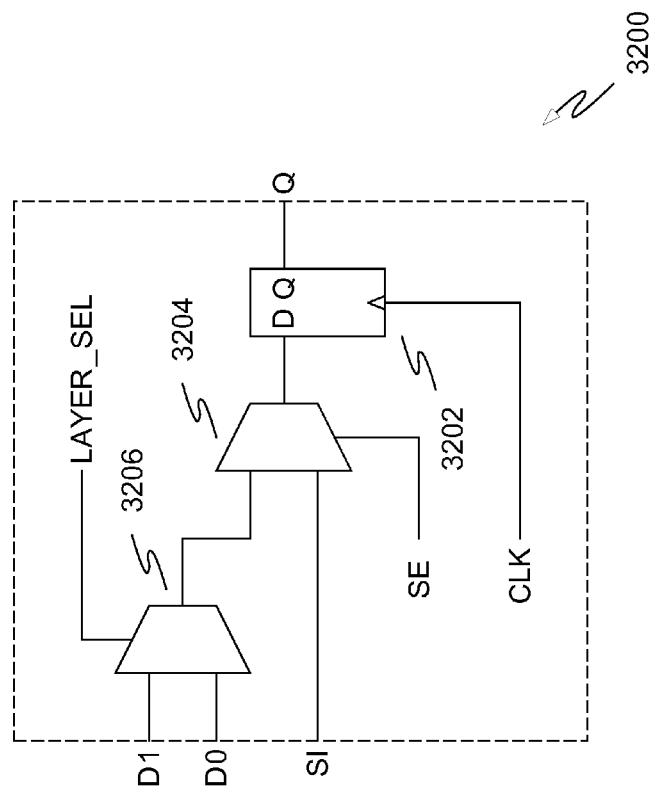
FIG. 32 illustrates a scan flip-flop suitable for use with the 3D IC of FIG. 31.

FIG. 32 illustrates exemplary scan flip-flop 3200 (surrounded by the dashed line in the figure) suitable for use with the present invention. Scan flip-flop 3200 may be used for the scan flip-flop instances 3111, 3112, 3113, 3121, 3122 and 3123 in FIG. 31. Present in FIG. 32 is D-type flip-flop 3202 which has a Q output coupled to the Q output of scan flip-flop 3200, a D input coupled to the output of multiplexer 3204, and a clock input coupled to the CLK signal. Multiplexer 3204 also has a first data input coupled to the output of multiplexer 3206, a second data input coupled to the SI (Scan Input) input of scan flip-flop 3200, and a select input coupled to the SE (Scan Enable) signal. Multiplexer 3206 has a first and second data inputs coupled to the D0 and D1 inputs of scan flip-flop 3200 and a select input coupled to the LAYER_SEL signal.

The SE, LAYER_SEL and CLK signals are not shown coupled to input ports on scan flip-flop 3200 to avoid over complicating the disclosure—particularly in drawings like FIG. 31 where multiple instances of scan flip-flop 3200 appear and explicitly routing them would detract from the concepts being presented. In a practical design, all three of those signals are typically coupled to an appropriate circuit for every instance of scan flip-flop 3200.

When asserted, the SE signal places scan flip-flop 3200 into scan mode causing multiplexer 3204 to gate the S1 input to the D input of D-type flip-flop 3202. Since this signal goes to all scan flip-flops 3200 in a scan chain, this has the effect of connecting them together as a shift register allowing vectors to be shifted in and test results to be shifted out. When SE is not asserted, multiplexer 3204 selects the output of multiplexer 3206 to present to the D input of D-type flip-flop 3202.

The CLK signal is shown as an "internal" signal here since its origin will differ from embodiment to embodiment as a matter of design choice. In practical designs, a clock signal (or some variation of it) is typically routed to every flip-flop in its functional domain. In some scan test architectures, CLK will be selected by a third multiplexer (not shown in FIG. 32) from a domain clock used in functional operation and a scan clock for use in scan testing. In such cases, the SCAN_EN signal will typically be coupled to the select input of the third multiplexer so that D-type flip-flop 3202 will be correctly clocked in both scan and functional modes of operation. In other scan architectures, the functional domain clock is used as the scan clock during test modes and no additional multiplexer is needed. Persons of ordinary skill in the art will appreciate that many different scan architectures are known and will realize that the particular scan architecture in any given embodiment will be a matter of design choice and in no way limits the present invention.

The LAYER_SEL signal determines the data source of scan flip-flop 3200 in normal operating mode. As illustrated in FIG. 31, input D1 is coupled to the output of the logic cone of the Layer (either Layer 1 or Layer 2) where scan flip-flop 3200 is located, while input D0 is coupled to the output of the corresponding logic cone on the other Layer. The default value for LAYER_SEL is thus logic-1 which selects the output from the same Layer. Each scan flip-flop 3200 has its own unique LAYER_SEL signal. This allows a defective logic cone on one Layer to be programmably or selectively replaced by its counterpart on the other Layer. In such cases, the signal coupled to D1 being replaced is called a Faulty Signal while the signal coupled to D0 replacing it is called a Repair Signal.

Figure 33A:
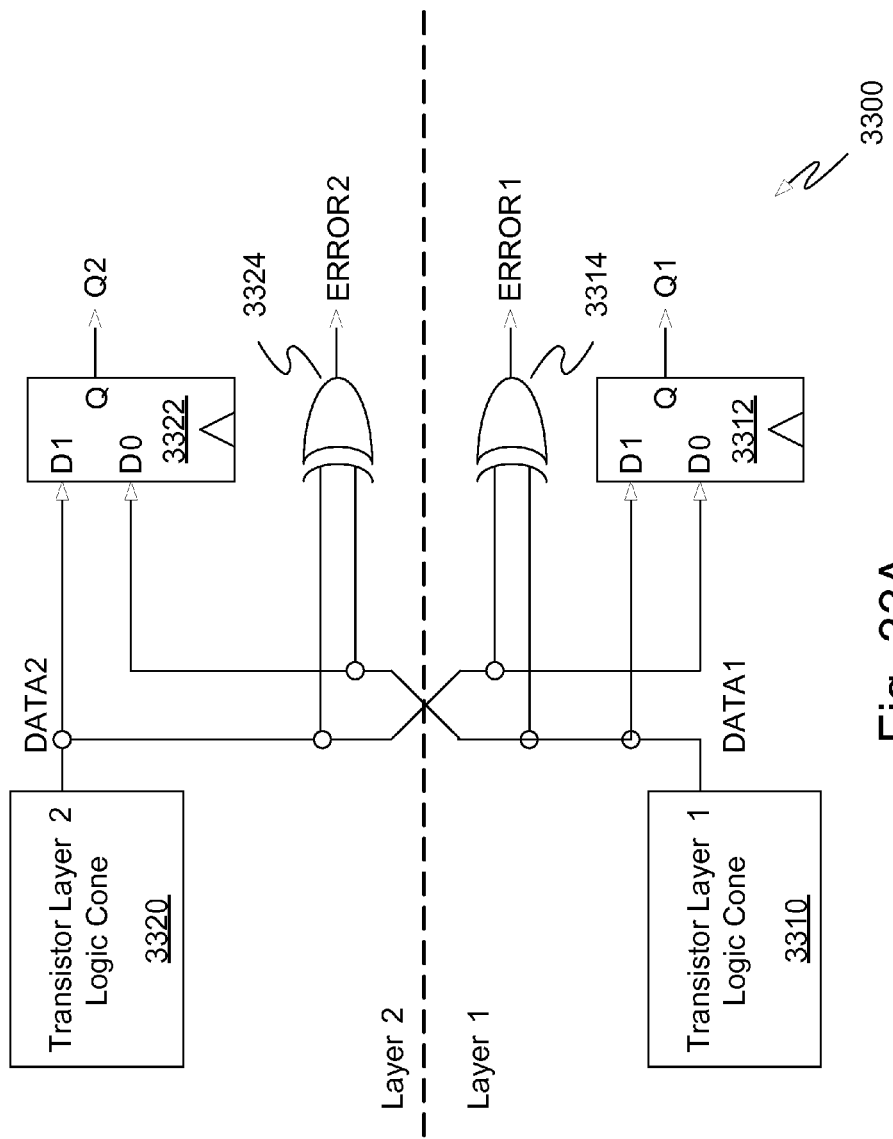
FIG. 33A illustrates a third field repairable 3D IC according to the present invention.

FIG. 33A illustrates an exemplary 3D IC generally indicated by 3300. Like the embodiment of FIG. 31, 3D IC 3300 comprises two Layers labeled Layer 1 and Layer 2 and separated by a dashed line in the drawing figure. Layer 1 comprises Layer 1 Logic Cone 3310, scan flip-flop 3312, and XOR gate 3314, while Layer 2 comprises Layer 2 Logic Cone 3320, scan flip-flop 3322, and XOR gate 3324. The scan flip-flop 3200 of FIG. 32 may be used for scan flip-flops 3312 and 3322, though the SI and other internal connections are not shown in FIG. 33A. The output of Layer 1 Logic Cone 3310 (labeled DATA1 in the drawing figure) is coupled to the D1 input of scan flip-flop 3312 on Layer 1 and the D0 input of scan flip-flop 3322 on Layer 2. Similarly, the output of Layer 2 Logic Cone 3320 (labeled DATA2 in the drawing figure) is coupled to the D1 input of scan flip-flop 3322 on Layer 2 and the D0 input of scan flip-flop 3312 on Layer 1. Each of the scan flip-flops 3312 and 3322 has its own LAYER_SEL signal (not shown in FIG. 33A) that selects between its D0 and D1 inputs in a manner similar to that illustrated in FIG. 32.

XOR gate 3314 has a first input coupled to DATA1, a second input coupled to DATA2, and an output coupled to signal ERROR1. Similarly, XOR gate 3324 has a first input coupled to DATA2, a second input coupled to DATA1, and an output coupled to signal ERROR2. If the logic values present on the signals on DATA1 and DATA2 are not equal, ERROR1 and ERROR2 will equal logic-1 signifying there is a logic error present. If the signals on DATA1 and DATA2 are equal, ERROR1 and ERROR2 will equal logic-0 signifying there is no logic error present. Persons of ordinary skill in art will appreciate that the underlying assumption here is that only one of the Logic Cones 3310 and 3320 will be bad simultaneously. Since both Layer 1 and Layer 2 have already been factory tested, verified and, in some embodiments, repaired, the statistical likelihood of both logic cones developing a failure in the field is extremely unlikely even without any factor repair, thus validating the assumption.

In 3D IC 3300, the testing may be done in a number of different ways as a matter of design choice. For example, the clock could be stopped occasionally and the status of the ERROR1 and ERROR2 signals monitored in a spot check manner during a system maintenance period. Alternatively, operation can be halted and scan vectors run with a comparison done on every vector. In some embodiments a BIST testing scheme using Linear Feedback Shift Registers to generate pseudo-random vectors for Cyclic Redundancy Checking may be employed. These methods all involve stopping system operation and entering a test mode. Other methods of monitoring possible error conditions in real time will be discussed below.

In order to effect a repair in 3D IC 3300, two determinations are typically made: (1) the location of the logic cone with the error, and (2) which of the two corresponding logic cones is operating correctly at that location. Thus a method of monitoring the ERROR1 and ERROR2 signals and a method of controlling the LAYER_SEL signals of scan flip-flops 3312 and 3322 are may be needed, though there are other approaches. In a practical embodiment, a method of reading and writing the state of the LAYER_SEL signal may be needed for factory testing to verify that Layer 1 and Layer 2 are both operating correctly.

Typically, the LAYER_SEL signal for each scan flip-flop will be held in a programmable element like, for example, a volatile memory circuit like a latch storing one bit of binary data (not shown in FIG. 33A). In some embodiments, the correct value of each programmable element or latch may be determined at system power up, at a system reset, or on demand as a routine part of system maintenance. Alternatively, the correct value for each programmable element or latch may be determined at an earlier point in time and stored in a non-volatile medium like a flash memory or by programming antifuses internal to 3D IC 3300, or the values may be stored elsewhere in the system in which 3D IC 3300 is deployed. In those embodiments, the data stored in the non-volatile medium may be read from its storage location in some manner and written to the LAYER_SEL latches.

Various methods of monitoring ERROR1 and ERROR2 are possible. For example, a separate shift register chain on each Layer (not shown in FIG. 33A) could be employed to capture the ERROR1 and ERROR2 values, though this would carry a significant area penalty. Alternatively, the ERROR1 and ERROR2 signals could be coupled to scan flip-flops 3312 and 3322 respectively (not shown in FIG. 33A), captured in a test mode, and shifted out. This would carry less overhead per scan flip-flop, but would still be expensive.

The cost of monitoring the ERROR1 and ERROR2 signals can be reduced further if it is combined with the circuitry necessary to write and read the latches storing the LAYER_SEL information. In some embodiments, for example, the LAYER_SEL latch may be coupled to the corresponding scan flip-flop 3200 and have its value read and written through the scan chain. Alternatively, the logic cone, the scan flip-flop, the XOR gate, and the LAYER_SEL latch may all be addressed using the same addressing circuitry.

Figure 33B:
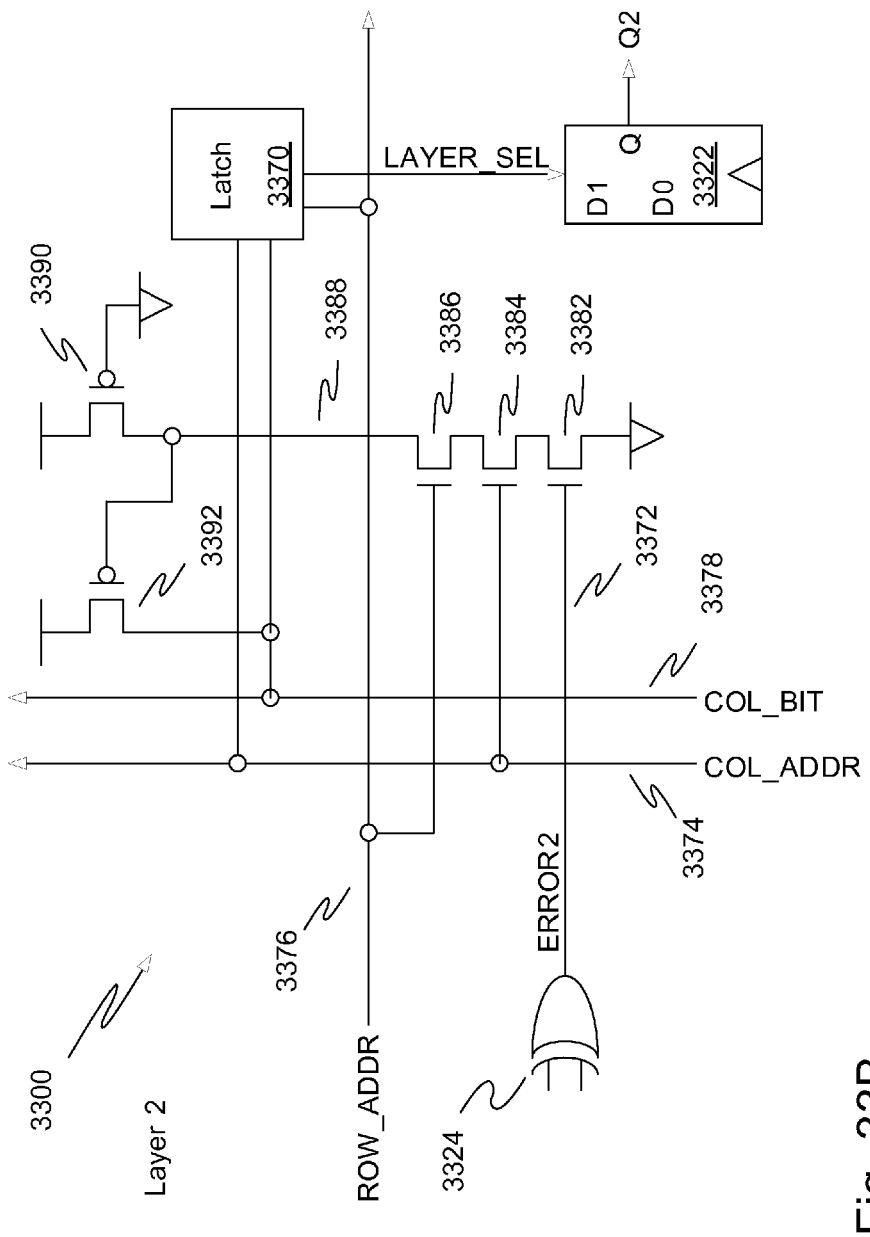
FIG. 33B illustrates additional aspects of the field repairable 3D IC of FIG. 33A.

Illustrated in FIG. 33B is circuitry for monitoring ERROR2 and controlling its associated LAYER_SEL latch by addressing in 3D IC 3300. Present in FIG. 33B is 3D IC 3300, a portion of the Layer 2 circuitry discussed in FIG. 33A including scan flip-flop 3322 and XOR gate 3324. A substantially identical circuit (not shown in FIG. 33B) will be present on Layer 1 involving scan flip-flop 3312 and XOR gate 3314.

Also present in FIG. 33B is LAYER_SEL latch 3370 which is coupled to scan flip-flop 3322 through the LAYER_SEL signal. The value of the data stored in latch 3370 determines which logic cone is used by scan flip-flop 3322 in normal operation. Latch 3370 is coupled to COL_ADDR line 3374 (the column address line), ROW_ADDR line 3376 (the row address line) and COL_BIT line 3378. These lines may be used to read and write the contents of latch 3370 in a manner similar to any SRAM circuit known in the art. In some embodiments, a complementary COL_BIT line (not shown in FIG. 33B) with inverted binary data may be present. In a logic design, whether implemented in full custom, semi-custom, gate array or ASIC design or some other design methodology, the scan flip-flops will not line up neatly in rows and columns the way memory cells do in a memory block. In some embodiments, a tool may be used to assign the scan flip-flops into virtual rows and columns for addressing purposes. Then the various virtual row and column lines would be routed like any other signals in the design.

The ERROR2 line 3372 may be read at the same address as latch 3370 using the circuit comprising N-channel transistors 3382, 3384 and 3386 and P-channel transistors 3390 and 3392. N-channel transistor 3382 has a gate terminal coupled to ERROR2 line 3372, a source terminal coupled to ground, and a drain terminal coupled to the source of N-channel transistor 3384. N-channel transistor 3384 has a gate terminal coupled to COL_ADDR line 3374, a source terminal coupled to N-channel transistor 3382, and a drain terminal coupled to the source of N-channel transistor 3386. N-channel transistor 3386 has a gate terminal coupled to ROW_ADDR line 3376, a source terminal coupled to the drain N-channel transistor 3384, and a drain terminal coupled to the drain of P-channel transistor 3390 and the gate of P-channel transistor 3392 through line 3388. P-channel transistor 3390 has a gate terminal coupled to ground, a source terminal coupled to the positive power supply, and a drain terminal coupled to line 3388. P-channel transistor 3392 has a gate terminal coupled to line 3388, a source terminal coupled to the positive power supply, and a drain terminal coupled to COL_BIT line 3378.

If the particular ERROR2 line 3372 in FIG. 33B is not addressed (i.e., either COL_ADDR line 3374 equals the ground voltage level (logic-0) or ROW_ADDR line 3376 equals the ground voltage supply voltage level (logic-0)), then the transistor stack comprising the three N-channel transistors 3372, 3374 and $6376 will be non-conductive. The P-channel transistor 3390 functions as a weak pull-up device pulling the voltage level on line 3388 to the positive power supply voltage (logic-1) when the N-channel transistor stack is non-conductive. This causes P-channel transistor 3392 to be non-conductive presenting high impedance to COL_BIT line 3378.

A weak pull-down (not shown in FIG. 33B) is coupled to COL_BIT line 3378. If all the memory cells coupled to COL_BIT line 3378 present high impedance, then the weak pull-down will pull the voltage level to ground (logic-0).

If the particular ERROR2 line 3372 in FIG. 33B is addressed (i.e., both COL_ADDR line 3374 and ROW_ADDR line 3376 are at the positive power supply voltage level (logic-1)), then the transistor stack comprising the three N-channel transistors 3372, 3374 and $6376 will be non-conductive if ERROR2=logic-0 and conductive if ERROR2=logic-1. Thus the logic value of ERROR2 may be propagated through P-channel transistors 3390 and 3392 and onto the COL_BIT line 3378.

An advantage of the addressing scheme of FIG. 63B is that a broadcast ready mode is available by addressing all of the rows and columns simultaneously and monitoring all of the column bit lines 3378. If all the column bit lines 3378 are logic-0, all of the ERROR2 signals are logic-0 meaning there are no bad logic cones present on Layer 2. Since field correctable errors will be relatively rare, this can save a lot of time locating errors relative to a scan flip-flop chain approach. If one or more bit lines is logic-1, faulty logic cones will only be present on those columns and the row addresses can be cycled quickly to find their exact addresses. Another advantage of the scheme is that large groups or all of the LAYER_SEL latches can be initialized simultaneously to the default value of logic-1 quickly during a power up or reset condition.

At each location where a faulty logic cone is present, if any, the defect is isolated to a particular layer so that the correctly functioning logic cone may be selected by the corresponding scan flip-flop on both Layer 1 and Layer 2. If a large non-volatile memory is present in the 3D IC 3300 or in the external system, then automatic test pattern generated (ATPG) vectors may be used in a manner similar to the factory repair embodiments. In this case, the scan itself is capable of identifying both the location and the correctly functioning layer. Unfortunately, this requires a large number of vectors and a correspondingly large amount of available non-volatile memory which may not be available in all embodiments.

Using some form of Built In Self Test (BIST) has the advantage of being self contained inside 3D IC 3300 without needing the storage of large numbers of test vectors. Unfortunately, BIST tests tend to be of the "go" or "no go" variety. They identify the presence of an error, but are not particularly good at diagnosing either the location or the nature of the fault. Fortunately, there are ways to combine the monitoring of the error signals previously described with BIST techniques and appropriate design methodology to quickly determine the correct values of the LAYER_SEL latches.

Figure 34:
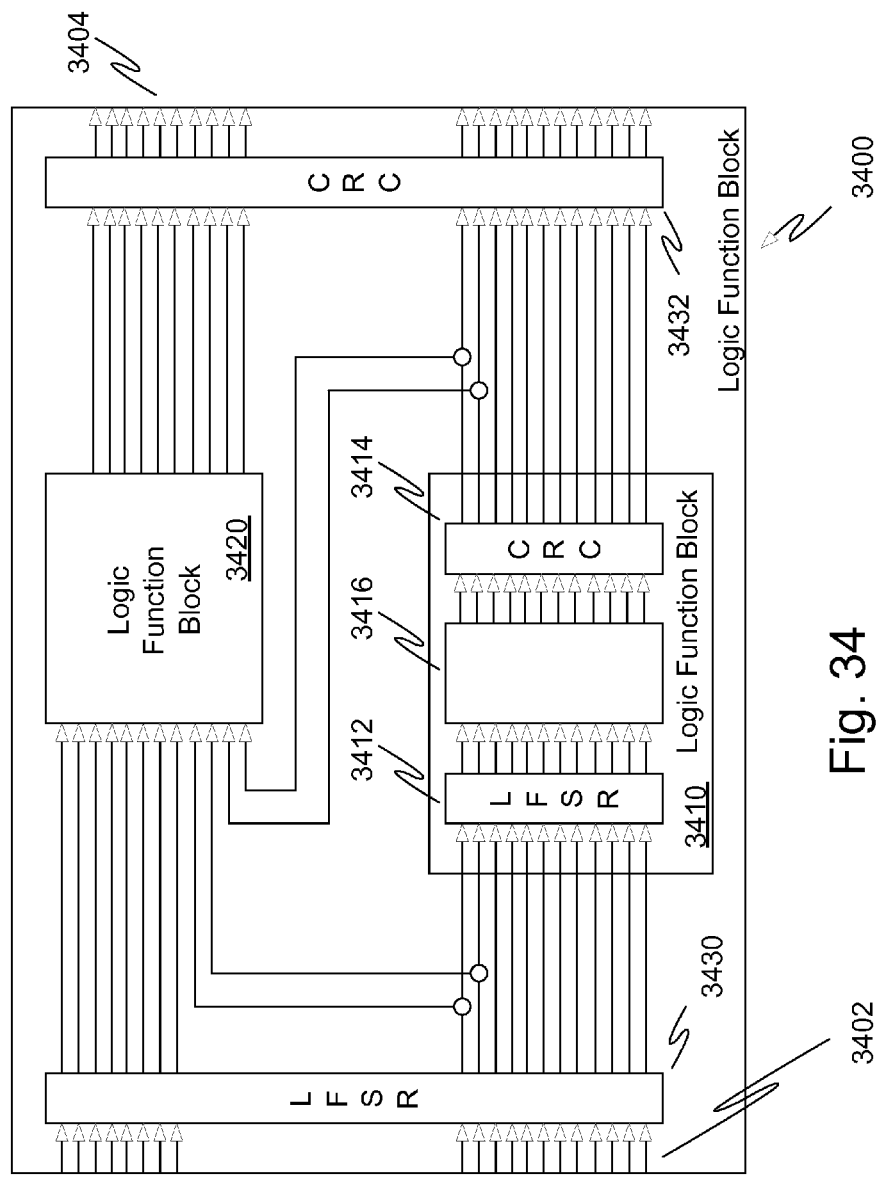
FIG. 34 illustrates a fourth field repairable 3D IC according to the present invention.

FIG. 34 illustrates an exemplary portion of the logic design implemented in a 3D IC such as 3100 of FIG. 31 or 3300 of FIG. 63A. The logic design is present on both Layer 1 and Layer 2 with substantially identical gate-level implementations. Preferably, all of the flip-flops (not illustrated in FIG. 34) in the design are implemented using scan flip-flops similar or identical in function to scan flip-flop 3200 of FIG. 32. Preferably, all of the scan flip-flops on each Layer have the sort of interconnections with the corresponding scan flip-flop on the other Layer as described in conjunction with FIG. 33A. Preferably, each scan flip-flop will have an associated error signal generator (e.g., an XOR gate) for detecting the presence of a faulty logic cone, and a LAYER_SEL latch to control which logic cone is fed to the flip-flop in normal operating mode as described in conjunction with FIGS. 33A and 33B.

Present in FIG. 34 is an exemplary logic function block (LFB) 3400. Typically LFB 3400 has a plurality of inputs, an exemplary instance being indicated by reference number 3402, and a plurality of outputs, an exemplary instance being indicated by reference number 3404. Preferably LFB 3400 is designed in a hierarchical manner, meaning that it typically has smaller logic function blocks such as 3410 and 3420 instantiated within it. Circuits internal to LFBs 3410 and 3420 are considered to be at a "lower" level of the hierarchy than circuits present in the "top" level of LFB 3400 which are considered to be at a "higher" level in the hierarchy. LFB 3400 is exemplary only. Many other configurations are possible. There may be more (or less) than two LFBs instantiated internal to LFB 7500. There may also be individual logic gates and other circuits instantiated internal to LFB 3400 not shown in FIG. 34 to avoid overcomplicating the disclosure. LFBs 3410 and 3420 may have internally instantiated even smaller blocks forming even lower levels in the hierarchy. Similarly, Logic Function Block 3400 may itself be instantiated in another LFB at an even higher level of the hierarchy of the overall design.

Present in LFB 3400 is Linear Feedback Shift Register (LFSR) circuit 3430 for generating pseudo-random input vectors for LFB 3400 in a manner well known in the art. In FIG. 34 one bit of LSFR 3430 is associated with each of the inputs 3402 of LFB 3400. If an input 3402 couples directly to a flip-flop (preferably a scan flip-flop similar to 3200) then that scan flip-flop may be modified to have the additional LFSR functionality to generate pseudo-random input vectors. If an input 3402 couples directly to combinatorial logic, it will be intercepted in test mode and its value determined and replaced by a corresponding bit in LFSR 3430 during testing. Alternatively, the LFSR circuit 3430 will intercept all input signals during testing regardless of the type of circuitry it connects to internal to LFB 3400.

Thus during a BIST test, all the inputs of LFB 3400 may be exercised with pseudo-random input vectors generated by LSFR 3430. As is known in the art, LSFR 3430 may be a single LSFR or a number of smaller LSFRs as a matter of design choice. LSFR 3430 is preferably implemented using a primitive polynomial to generate a maximum length sequence of pseudo-random vectors. LSFR 3430 needs to be seeded to a known value, so that the sequence of pseudo-random vectors is deterministic. The seeding logic can be inexpensively implemented internal to the LSFR 3430 flip-flops and initialized, for example, in response to a reset signal.

Also present in LFB 3400 is Cyclic Redundancy Check (CRC) circuit 3432 for generating a signature of the LFB 3400 outputs generated in response to the pseudo-random input vectors generated by LFSR 3430 in a manner well known in the art. In FIG. 34 one bit of CRC 3432 is associated with each of the outputs 3404 of LFB 3400. If an output 3404 couples directly to a flip-flop (preferably a scan flip-flop similar to 3200) then that scan flip-flop may be modified to have the additional CRC functionality to generate the signature. If an output 3404 couples directly to combinatorial logic, it will be monitored in test mode and its value coupled to a corresponding bit in CRC 3432. Alternatively, all the bits in CRC will passively monitor an output regardless of the source of the signal internal to LFB 3400.

Thus during a BIST test, all the outputs of LFB 3400 may be analyzed to determine the correctness of their responses to the stimuli provided by the pseudo-random input vectors generated by LSFR 3430. As is known in the art, CRC 3432 may be a single CRC or a number of smaller CRCs as a matter of design choice. As known in the art, a CRC circuit is a special case of an LSFR, with additional circuits present to merge the observed data into the pseudo-random pattern sequence generated by the base LSFR. The CRC 3432 is preferably implemented using a primitive polynomial to generate a maximum sequence of pseudo-random patterns. CRC 3432 needs to be seeded to a known value, so that the signature generated by the pseudo-random input vectors is deterministic. The seeding logic can be inexpensively implemented internal to the LSFR 3430 flip-flops and initialized, for example, in response to a reset signal. After completion of the test, the value present in the CRC 3432 is compared to the known value of the signature. If all the bits in CRC 3432 match, the signature is valid and the LFB 3400 is deemed to be functioning correctly. If one or more of the bits in CRC 3432 does not match, the signature is invalid and the LFB 3400 is deemed to not be functioning correctly. The value of the expected signature can be inexpensively implemented internal to the CRC 3432 flip-flops and compared internally to CRC 3432 in response to an evaluate signal.

As shown in FIG. 34, LFB 3410 comprises LFSR circuit 3412, CRC circuit 3414, and logic function 3416. Since its input/output structure is analogous to that of LFB 3400, it can be tested in a similar manner albeit on a smaller scale. If 3400 is instantiated into a larger block with a similar input/output structure, 3400 may be tested as part of that larger block or tested separately as a matter of design choice. It is not required that all blocks in the hierarchy have this input/output structure if it is deemed unnecessary to test them individually. An example of this is LFB 3420 instantiated inside LFB 3400 which does not have an LFSR circuit on the inputs and a CRC circuit on the outputs and which is tested along with the rest of LFB 3400.

Persons of ordinary skill in the art will appreciate that other BIST test approaches are known in the art and that any of them may be used to determine if LFB 3400 is functional or faulty.

In order to repair a 3D IC like 3D IC 3300 of FIG. 33A using the block BIST approach, the part is put in a test mode and the DATA1 and DATA2 signals are compared at each scan flip-flop 3200 on Layer 1 and Layer 2 and the resulting ERROR1 and ERROR2 signals are monitored as described in the embodiments above or possibly using some other method. The location of the faulty logic cone is determined with regards to its location in the logic design hierarchy. For example, if the faulty logic cone were located inside LFB 3410 then the BIST routine for only that block would be run on both Layer 1 and Layer 2. The results of the two tests determine which of the blocks (and by implication which of the logic cones) is functional and which is faulty. Then the LAYER_SEL latches for the corresponding scan flip-flops 3200 can be set so that each receives the repair signal from the functional logic cone and ignores the faulty signal. Thus the layer determination can be made for a modest cost in hardware in a shorter period of time without the need for expensive ATPG testing.

Figure 35:
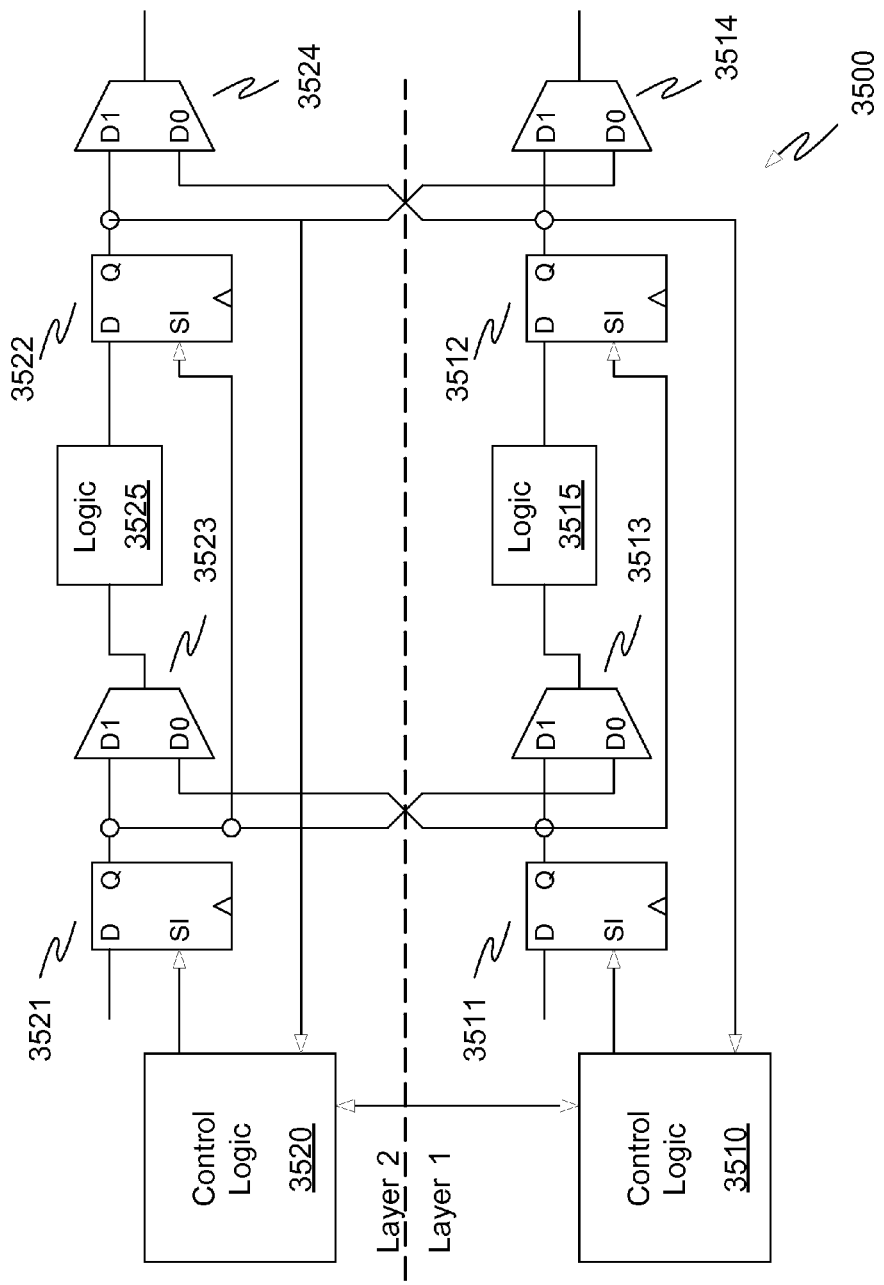
FIG. 35 illustrates a fifth field repairable 3D IC according to the present invention.

FIG. 35 illustrates an alternate embodiment with the ability to perform field repair of individual logic cones. An exemplary 3D IC indicated generally by 3500 comprises two layers labeled Layer 1 and Layer 2 and separated by a dashed line in the drawing figure. Layer 1 and Layer 2 are bonded together to form 3D IC 3500 using methods known in the art and interconnected using TSVs or some other interlayer interconnect technology. Layer 1 comprises Control Logic block 3510, scan flip-flops 3511 and 3512, multiplexers 3513 and 3514, and Logic cone 3515. Similarly, Layer 2 comprises Control Logic block 3520, scan flip-flops 3521 and 3522, multiplexers 3523 and 3524, and Logic cone 3525.

In Layer 1, scan flip-flops 3511 and 3512 are coupled in series with Control Logic block 3510 to form a scan chain. Scan flip-flops 3511 and 3512 can be ordinary scan flip-flops of a type known in the art. The Q outputs of scan flip-flops 3511 and 3512 are coupled to the D1 data inputs of multiplexers 3513 and 3514 respectively. Representative logic cone 3515 has a representative input coupled to the output of multiplexer 3513 and an output coupled to the D input of scan flip-flop 3512.

In Layer 2, scan flip-flops 3521 and 3522 are coupled in series with Control Logic block 3520 to form a scan chain. Scan flip-flops 3521 and 3522 can be ordinary scan flip-flops of a type known in the art. The Q outputs of scan flip-flops 3521 and 3522 are coupled to the D1 data inputs of multiplexers 3523 and 3524 respectively. Representative logic cone 3525 has a representative input coupled to the output of multiplexer 3523 and an output coupled to the D input of scan flip-flop 3522.

The Q output of scan flip-flop 3511 is coupled to the D0 input of multiplexer 3523, the Q output of scan flip-flop 3521 is coupled to the D0 input of multiplexer 3513, the Q output of scan flip-flop 3512 is coupled to the D0 input of multiplexer 3524, and the Q output of scan flip-flop 3522 is coupled to the D0 input of multiplexer 3514. Control Logic block 3510 is coupled to Control Logic block 3520 in a manner that allows coordination between testing functions between layers. In some embodiments the Control Logic blocks 3510 and 3520 can test themselves or each other and, if one is faulty, the other can control testing on both layers. These interlayer couplings may be realized by TSVs or by some other interlayer interconnect technology.

The logic functions performed on Layer 1 are substantially identical to the logic functions performed on Layer 2. The embodiment of 3D IC 3500 in FIG. 35 is similar to the embodiment of 3D IC 3100 shown in FIG. 31, with the primary difference being that the multiplexers used to implement the interlayer programmable or selectable cross couplings for logic cone replacement are located immediately after the scan flip-flops instead of being immediately before them as in exemplary scan flip-flop 3200 of FIG. 32 and in exemplary 3D IC 3100 of FIG. 31.

Figure 36:
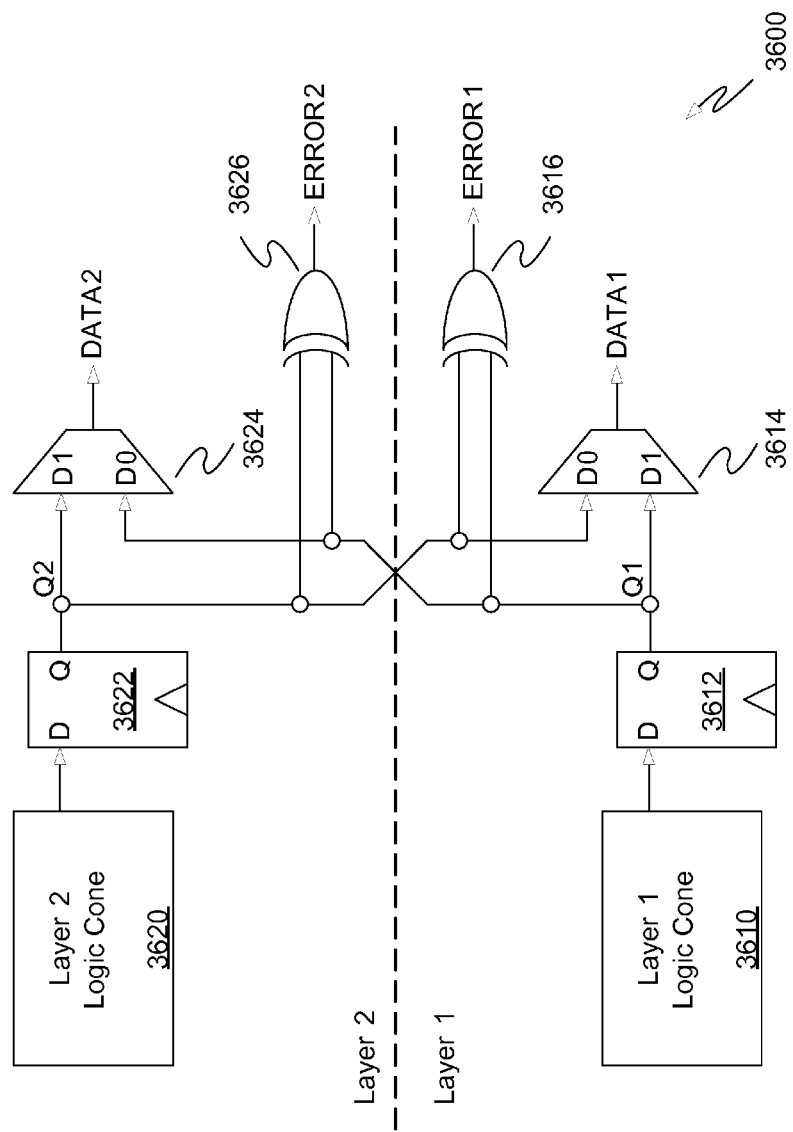
FIG. 36 illustrates a sixth field repairable 3D IC according to the present invention.

FIG. 36 illustrates an exemplary 3D IC indicated generally by 3600 which is also constructed using this approach. Exemplary 3D IC 3600 comprises two Layers labeled Layer 1 and Layer 2 and separated by a dashed line in the drawing figure. Layer 1 and Layer 2 are bonded together to form 3D IC 3600 and interconnected using TSVs or some other interlayer interconnect technology. Layer 1 comprises Layer 1 Logic Cone 3610, scan flip-flop 3612, multiplexer 3614, and XOR gate 3616. Similarly, Layer 2 comprises Layer 2 Logic Cone 3620, scan flip-flop 3622, multiplexer 3624, and XOR gate 3626.

Layer 1 Logic Cone 3610 and Layer 2 Logic Cone 3620 implement substantially identical logic functions. In order to detect a faulty logic cone, the output of the logic cones 3610 and 3620 are captured in scan flip-flops 3612 and 3622 respectively in a test mode. The Q outputs of the scan flip-flops 3612 and 382 are labeled Q1 and Q2 respectively in FIG. 36. Q1 and Q2 are compared using the XOR gates 3616 and 3626 to generate error signals ERROR1 and ERROR2 respectively. Each of the multiplexers 3614 and 3624 has a select input coupled to a layer select latch (not shown in FIG. 36) preferably located in the same layer as the corresponding multiplexer within relatively close proximity to allow selectable or programmable coupling of Q1 and Q2 to either DATA1 or DATA2.

All the methods of evaluating ERROR1 and ERROR2 described in conjunction with the embodiments of FIGS. 33A, 33B and 34 may be employed to evaluate ERROR1 and ERROR2 in FIG. 36. Similarly, once ERROR1 and ERROR2 are evaluated, the correct values may be applied to the layer select latches for the multiplexers 3614 and 3624 to effect a logic cone replacement if necessary. In this embodiment, logic cone replacement also includes replacing the associated scan flip-flop.

Figure 37A:
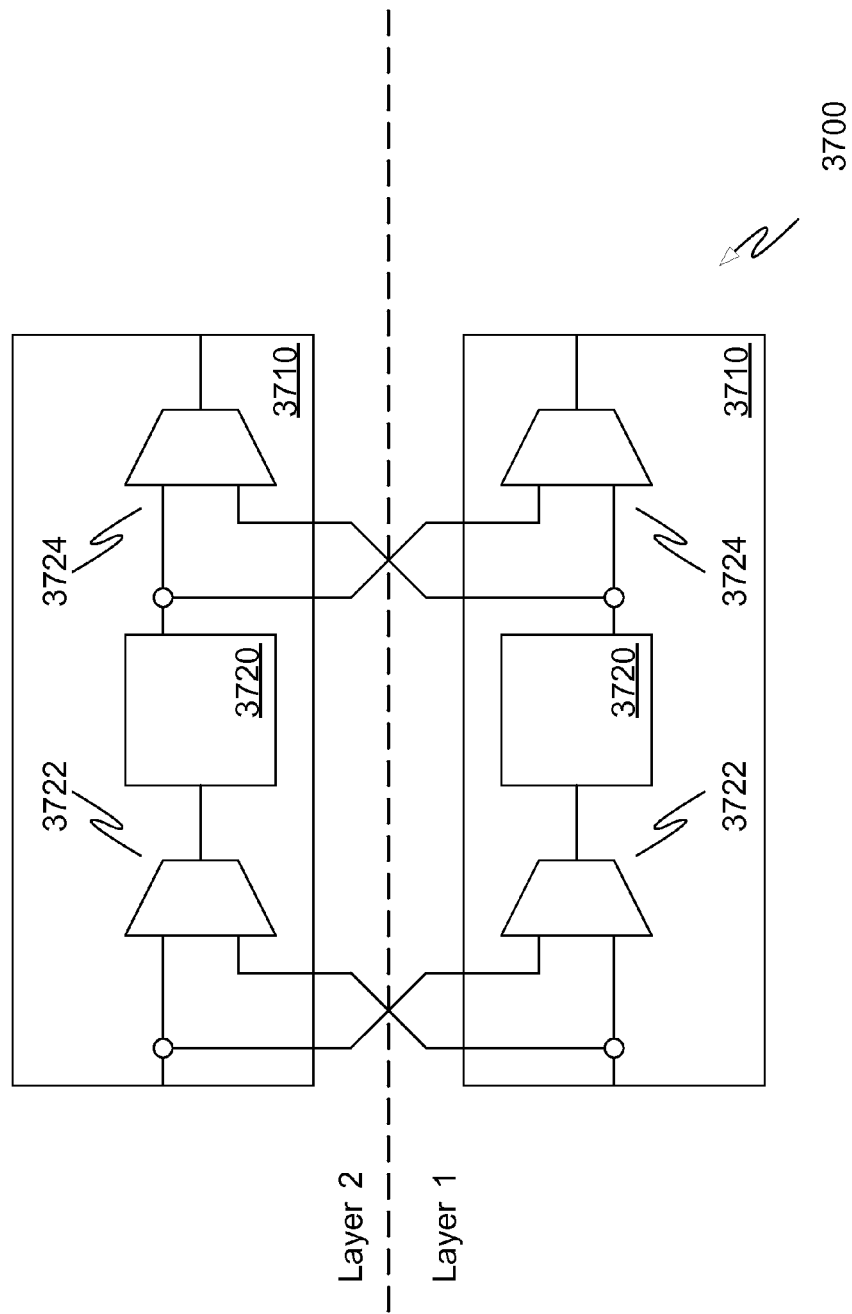
FIG. 37A illustrates a seventh field repairable 3D IC according to the present invention.

FIG. 37A illustrates an exemplary embodiment with an even more economical approach to field repair. An exemplary 3D IC generally indicated by 3700 which comprises two Layers labeled Layer 1 and Layer 2 and separated by a dashed line in the drawing figure. Each of Layer 1 and Layer 2 comprises at least one Circuit Layer. Layer 1 and Layer 2 are bonded together using techniques known in the art to form 3D IC 3700 and interconnected with TSVs or other interlayer interconnect technology. Each Layer further comprises an instance of Logic Function Block 3710, each of which in turn comprises an instance of Logic Function Block 3720. LFB 3720 comprises LSFR circuits on its inputs (not shown in FIG. 37A) and CRC circuits on its outputs (not shown in FIG. 37A) in a manner analogous to that described with respect to LFB 3400 in FIG. 34.

Each instance of LFB 3720 has a plurality of multiplexers 3722 associated with its inputs and a plurality of multiplexers 3724 associated with its outputs. These multiplexers may be used to programmably or selectively replace the entire instance of LFB 3720 on either Layer 1 or Layer 2 with its counterpart on the other layer.

On power up, system reset, or on demand from control logic located internal to 3D IC 3700 or elsewhere in the system where 3D IC 3700 is deployed, the various blocks in the hierarchy can be tested. Any faulty block at any level of the hierarchy with BIST capability may be programmably and selectively replaced by its corresponding instance on the other Layer. Since this is determined at the block level, this decision can be made locally by the BIST control logic in each block (not shown in FIG. 37A), though some coordination may be required with higher level blocks in the hierarchy with regards to which Layer the plurality of multiplexers 3722 sources the inputs to the functional LFB 3720 in the case of multiple repairs in the same vicinity in the design hierarchy. Since both Layer 1 and Layer 2 preferably leave the factory fully functional, or alternatively nearly fully functional, a simple approach is to designate one of the Layers, for example, Layer 1, as the primary functional layer. Then the BIST controllers of each block can coordinate locally and decide which block should have its inputs and outputs coupled to Layer 1 through the Layer 1 multiplexers 3722 and 3724.

Persons of ordinary skill in the art will appreciate that significant area can be saved by employing this embodiment. For example, since LFBs are evaluated instead of individual logic cones, the interlayer selection multiplexers for each individual flip-flop like multiplexer 3206 in FIG. 32 and multiplexer 3614 in FIG. 36 can be removed along with the LAYER_SEL latches 3370 of FIG. 33B since this function is now handled by the pluralities of multiplexers 3722 and 3724 in FIG. 37A, all of which may be controlled one or more control signals in parallel. Similarly, the error signal generators (e.g., XOR gates 3314 and 3324 in FIG. 33A and 3616 and 7826 in FIG. 36) and any circuitry needed to read them like coupling them to the scan flip-flops or the addressing circuitry described in conjunction with FIG. 33B may also be removed, since in this embodiment entire Logic Function Blocks rather than individual Logic Cones are replaced.

Even the scan chains may be removed in some embodiments, though this is a matter of design choice. In embodiments where the scan chains are removed, factory testing and repair would also have to rely on the block BIST circuits. When a bad block is detected, an entire new block would need to be crafted on the Repair Layer with Direct-Write e-Beam. Typically this takes more time than crafting a replacement logic cone due to the greater number of patterns to shape, and the area savings may need to be compared to the test time losses to determine the economically superior decision.

Removing the scan chains also entails a risk in the early debug and prototyping stage of the design, since BIST circuitry is not very good for diagnosing the nature of problems. If there is a problem in the design itself, the absence of scan testing will make it harder to find and fix the problem, and the cost in terms of lost time to market can be very high and hard to quantify. Prudence might suggest leaving the scan chains in for reasons unrelated to the field repair aspects of the present invention.

Figure 37B:
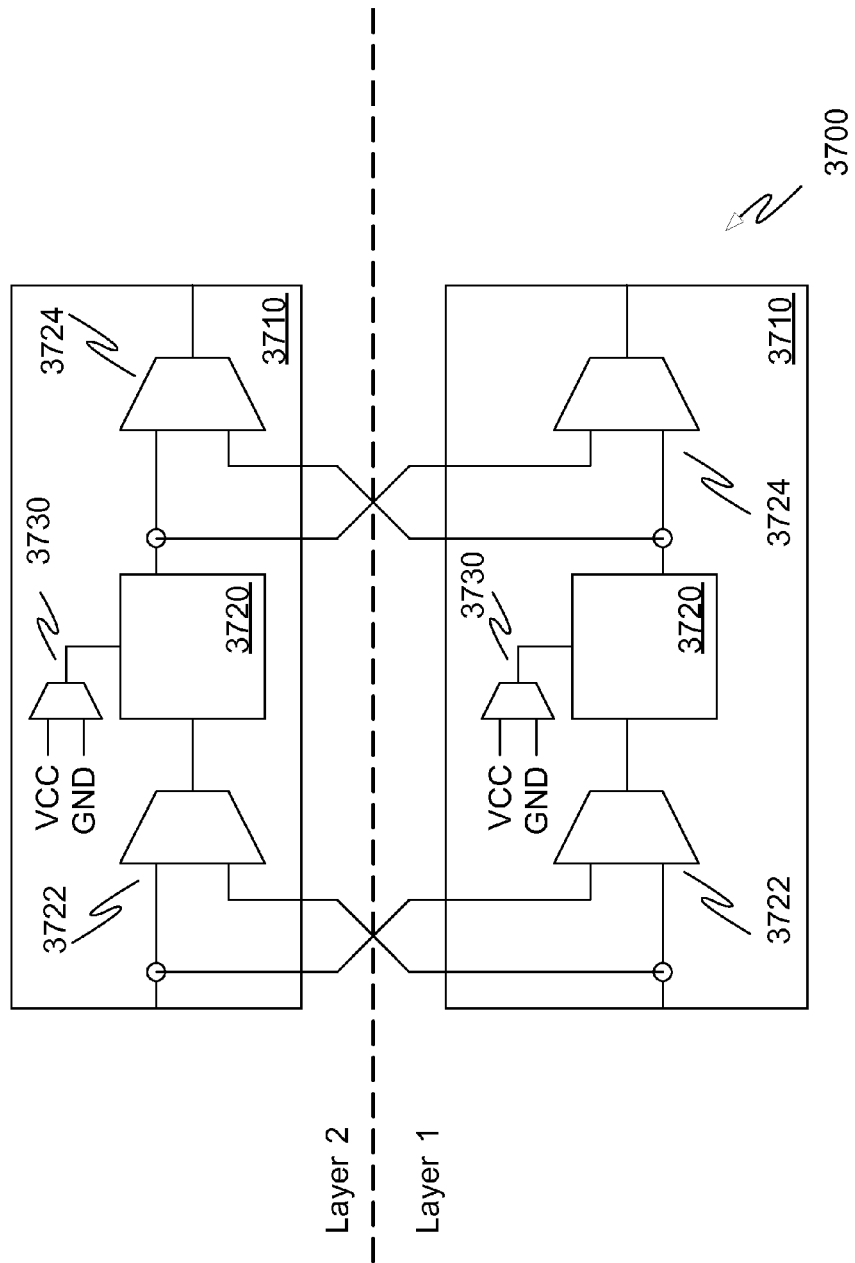
FIG. 37B illustrates additional aspects of the field repairable 3D IC of FIG. 37A.

Another advantage to embodiments using the block BIST approach is described in conjunction with FIG. 37B. One disadvantage to some of the earlier embodiments is that the majority of circuitry on both Layer 1 and Layer 2 is active during normal operation. Thus power can be substantially reduced relative to earlier embodiments by operating only one instance of a block on one of the layers whenever possible.

Present in FIG. 37B are 3D IC 3700, Layer 1 and Layer 2, and two instances each of LFBs 3710 and 3720, and pluralities of multiplexers 3722 and 3724 previously discussed. Also present in each Layer in FIG. 37B is a power select multiplexer 3730 associated with that layer's version of LFB 3720. Each power select multiplexer 3730 has an output coupled to the power terminal of its associated LFB 3720, a first select input coupled to the positive power supply (labeled VCC in the figure), and a second input coupled to the ground potential power supply (labeled GND in the figure). Each power select multiplexer 3730 has a select input (not shown in FIG. 37B) coupled to control logic (also not shown in FIG. 37B), typically present in duplicate on Layer 1 and Layer 2 though it may be located elsewhere internal to 3D IC 3700 or possibly elsewhere in the system where 3D IC 3700 is deployed.

Persons of ordinary skill in the art will appreciate that there are many ways to programmably or selectively power down a block inside an integrated circuit known in the art and that the use of power multiplexer 3730 in the embodiment of FIG. 37B is exemplary only. Any method of powering down LFB 3720 is within the scope of the invention. For example, a power switch could be used for both VCC and GND. Alternatively, the power switch for GND could be omitted and the power supply node allowed to "float" down to ground when VCC is decoupled from LFB 3730. In some embodiments, VCC may be controlled by a transistor, like either a source follower or an emitter follower which is itself controlled by a voltage regulator, and VCC may be removed by disabling or switching off the transistor in some way. Many other alternatives are possible.

In some embodiments, control logic (not shown in FIG. 37B) uses the BIST circuits present in each block to stitch together a single copy of the design (using each block's plurality of input and output multiplexers which function similarly to pluralities of multiplexers 3722 and 3724 associated with LFB 3720) comprised of functional copies of all the LFBs. When this mapping is complete, all of the faulty LFBs and the unused functional LFBs are powered off using their associated power select multiplexers (similar to power select multiplexer 3730). Thus the power consumption can be reduced to the level that a single copy of the design would require using standard two dimensional integrated circuit technology.

Alternatively, if a layer, for example, Layer 1 is designated as the primary layer, then the BIST controllers in each block can independently determine which version of the block is to be used. Then the settings of the pluralities of multiplexers 3722 and 3724 are set to couple the used block to Layer 1 and the settings of multiplexers 3730 can be set to power down the unused block. Typically, this should reduce the power consumption by half relative to embodiments where power select multiplexers 3730 or equivalent are not implemented.

There are test techniques known in the art that are a compromise between the detailed diagnostic capabilities of scan testing with the simplicity of BIST testing. In embodiments employing such schemes, each BIST block (smaller than a typical LFB, but typically comprising a few tens to a few hundreds of logic cones) stores a small number of initial states in particular scan flip-flops while most of the scan flip-flops can use a default value. CAD tools may be used to analyze the design's net-list to identify the necessary scan flip-flops to allow efficient testing.

During test mode, the BIST controller shifts in the initial values and then starts the clocking the design. The BIST controller has a signature register which might be a CRC or some other circuit which monitors bits internal to the block being tested. After a predetermined number of clock cycles, the BIST controller stops clocking the design, shifts out the data stored in the scan flip-flops while adding their contents to the block signature, and compares the signature to a small number of stored signatures (one for each of the stored initial states.

This approach has the advantage of not needing a large number of stored scan vectors and the "go" or "no go" simplicity of BIST testing. The test block is less fine than identifying a single faulty logic cone, but much coarser than a large Logic Function Block. In general, the finer the test granularity (i.e., the smaller the size of the circuitry being substituted for faulty circuitry) the less chance of a delayed fault showing up in the same test block on both Layer 1 and Layer 2. Once the functional status of the BIST block has been determined, the appropriate values are written to the latches controlling the interlayer multiplexers to replace a faulty BIST block on one if the layers, if necessary. In some embodiments, faulty and unused BIST blocks may be powered down to conserve power.

While discussions of the various exemplary embodiments described so far concern themselves with finding and repairing defective logic cones or logic function blocks in a static test mode, embodiments of the present invention can address failures due to noise or timing. For example, in 3D IC 3100 of FIG. 31 and in 3D IC 3500 of FIG. 35 the scan chains can be used to perform at-speed testing in a manner known in the art. One approach involves shifting a vector in through the scan chains, applying two or more at-speed clock pulses, and then shifting out the results through the scan chain. This will catch any logic cones that are functionally correct at low speed testing but are operating too slowly to function in the circuit at full clock speed. While this approach will allow field repair of slow logic cones, it requires the time, intelligence and memory capacity necessary to store, run and evaluate scan vectors.

Another approach is to use block BIST testing at power up, reset, or on-demand to over-clock each block at ever increasing frequencies until one fails, determine which layer version of the block is operating faster, and then substitute the faster block for the slower one at each instance in the design. This has the more modest time, intelligence and memory requirements generally associated with block BIST testing, but it still requires placing the 3D IC in a test mode.

Figure 38:
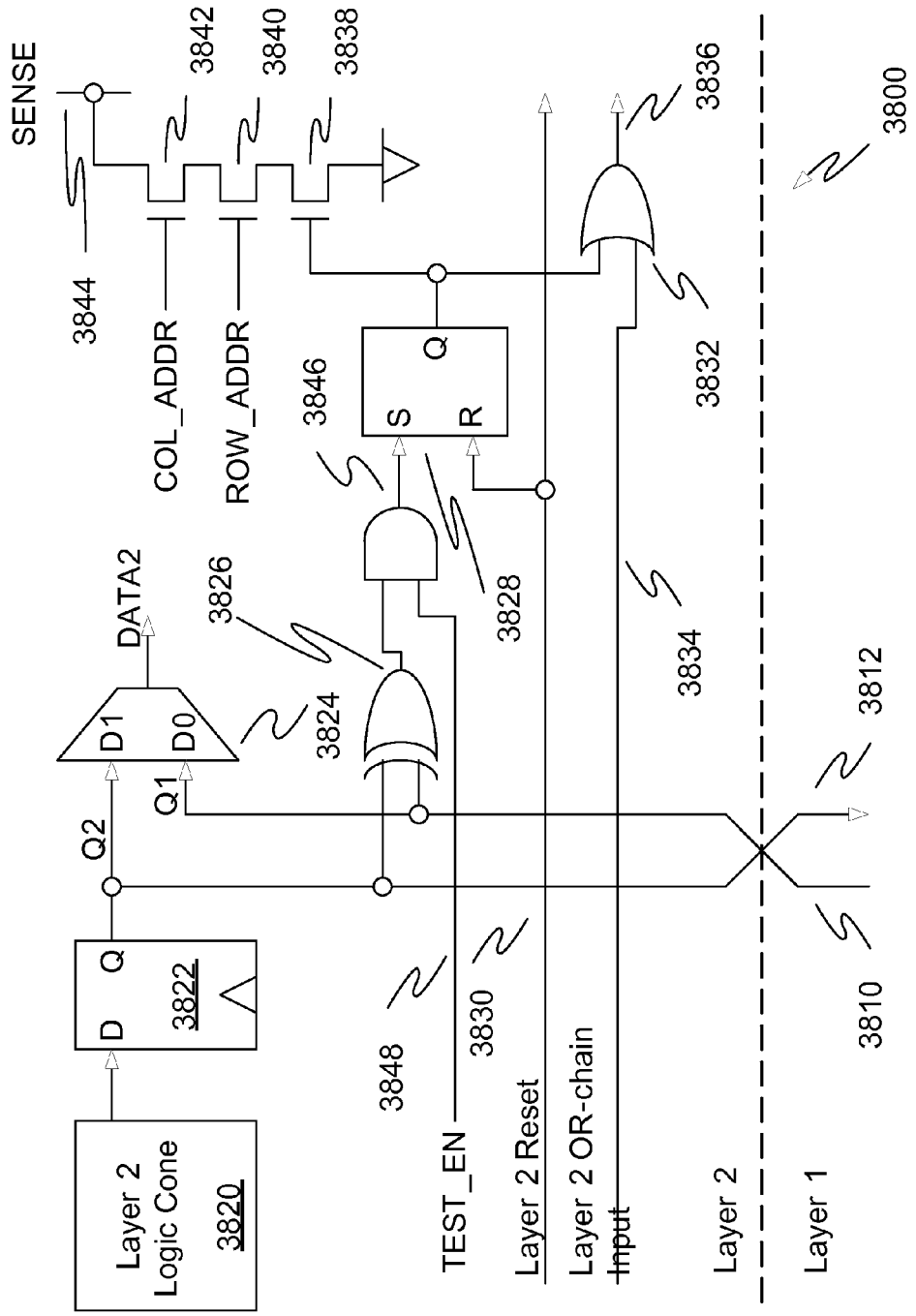
FIG. 38 illustrates an eighth field repairable 3D IC according to the present invention.

FIG. 38 illustrates an embodiment where errors due to slow logic cones can be monitored in real time while the circuit is in normal operating mode. An exemplary 3D IC generally indicated at 3800 comprises two Layers labeled Layer 1 and Layer 2 and separated by a dashed line in the drawing figure. The Layers each comprise one or more Circuit Layers and are bonded together to form 3D IC 3800. The are electrically coupled together using TSVs or some other interlayer interconnect technology.

FIG. 38 focuses on the operation of circuitry coupled to the output of a single Layer 2 Logic Cone 3820, though substantially identical circuitry is also present on Layer 1 (not shown in FIG. 82). Also present in FIG. 38 is scan flip-flop 3822 with its D input coupled to the output of Layer 2 Logic Cone 3820 and its Q output coupled to the D1 input of multiplexer 3824 through interlayer line 3812 labeled Q2 in the figure. Multiplexer 3824 has an output DATA2 coupled to a logic cone (not shown in FIG. 38) and a D0 input coupled the Q1 output of the Layer 1 flip-flop corresponding to flip-flop 3822 (not shown in the figure) through interlayer line 3810.

XOR gate 3826 has a first input coupled to Q1, a second input coupled to Q2, and an output coupled to a first input of AND gate 3846. AND gate 3846 also has a second input coupled to TEST_EN line 3848 and an output coupled to the Set input of RS flip-flop 3828. RS flip-flop also has a Reset input coupled to Layer 2 Reset line 3830 and an output coupled to a first input of OR gate 3832 and the gate of N-channel transistor 3838. OR gate 3832 also has a second input coupled to Layer 2 OR-chain Input line 3834 and an output coupled to Layer 2 OR-chain Output line 3836.

Layer 2 control logic (not shown in FIG. 38) controls the operation of XOR gate 3826, AND gate 3846, RS flip-flop 3828, and OR gate 3836. The TEST_EN line 3848 is used to disable the testing process with regards to Q1 and Q2. This is desirable in cases where, for example, a functional error has already been repaired and differences between Q1 and Q2 are routinely expected and would interfere with the background testing process looking for marginal timing errors.

Layer 2 Reset line 3830 is used to reset the internal state of RS flip-flop 3828 to logic-0 along with all the other RS flip-flops associated with other logic cones on Layer 2. OR gate 3832 is coupled together with all of the other OR-gates associated with other logic cones on Layer 2 to form a large Layer 2 distributed OR function coupled to all of the Layer 2 RS flip-flops like 3828 in FIG. 38. If all of the RS flip-flops are reset to logic-0, then the output of the distributed OR function will be logic-0. If a difference in logic state occurs between the flip-flops generating the Q1 and Q2 signals, XOR gate 3826 will present a logic-1 through AND gate 3846 (if TEST_EN=logic-1) to the Set input of RS flip-flop 3828 causing it to change state and present a logic-1 to the first input of OR gate 3832, which in turn will produce a logic-1 at the output of the Layer 2 distributed OR function (not shown in FIG. 38) notifying the control logic (not shown in the figure) that an error has occurred.

The control logic can then use the stack of N-channel transistors 3838, 3840 and 3842 to determine the location of the logic cone producing the error. Transistor 3838 has a gate terminal coupled to the Q output of RS flip-flop 3828, a source terminal coupled to ground, and a drain terminal coupled to the source of transistor 3840. Transistor 3840 has a gate terminal coupled to the row address line ROW_ADDR line, a source terminal coupled to the drain of transistor 3838, and a drain terminal coupled to the source of transistor 3842. Transistor 3842 has a gate terminal coupled to the column address line COL_ADDR line, a source terminal coupled to the drain of transistor 3840, and a drain terminal coupled to the sense line SENSE.

The row and column addresses are virtual addresses, since in a logic design the locations of the flip-flops will not be neatly arranged in rows and columns. In some embodiments a Computer Aided Design (CAD) tool is used to modify the net-list to correctly address each logic cone and then the ROW_ADDR and COL_ADDR signals are routed like any other signal in the design.

This produces an efficient way for the control logic to cycle through the virtual address space. If COL_ADDR=ROW_ADDR=logic-1 and the state of RS flip-flop is logic-1, then the transistor stack will pull SENSE=logic-0. Thus a logic-1 will only occur at a virtual address location where the RS flip-flop has captured an error. Once an error has been detected, RS flip-flop 3828 can be reset to logic-0 with the Layer 2 Reset line 3830 where it will be able to detect another error in the future.

The control logic can be designed to handle an error in any of a number of ways. For example, errors can be logged and if a logic error occurs repeatedly for the same logic cone location, then a test mode can be entered to determine if a repair is necessary at that location. This is a good approach to handle intermittent errors resulting from marginal logic cones that only occasionally fail, for example, due to noise, and may test as functional in normal testing. Alternatively, action can be taken upon receipt of the first error notification as a matter of design choice.

As discussed earlier in conjunction with FIG. 27, using Triple Modular Redundancy at the logic cone level can also function as an effective field repair method, though it really creates a high level of redundancy that masks rather than repairs errors due to delayed failure mechanisms or marginally slow logic cones. If factory repair is used to make sure all the equivalent logic cones on each layer test functional before the 3D IC is shipped from the factory, the level of redundancy is even higher. The cost of having three layers versus having two layers, with or without a repair layer must be factored into determining the best embodiment for any application.

Figure 39:
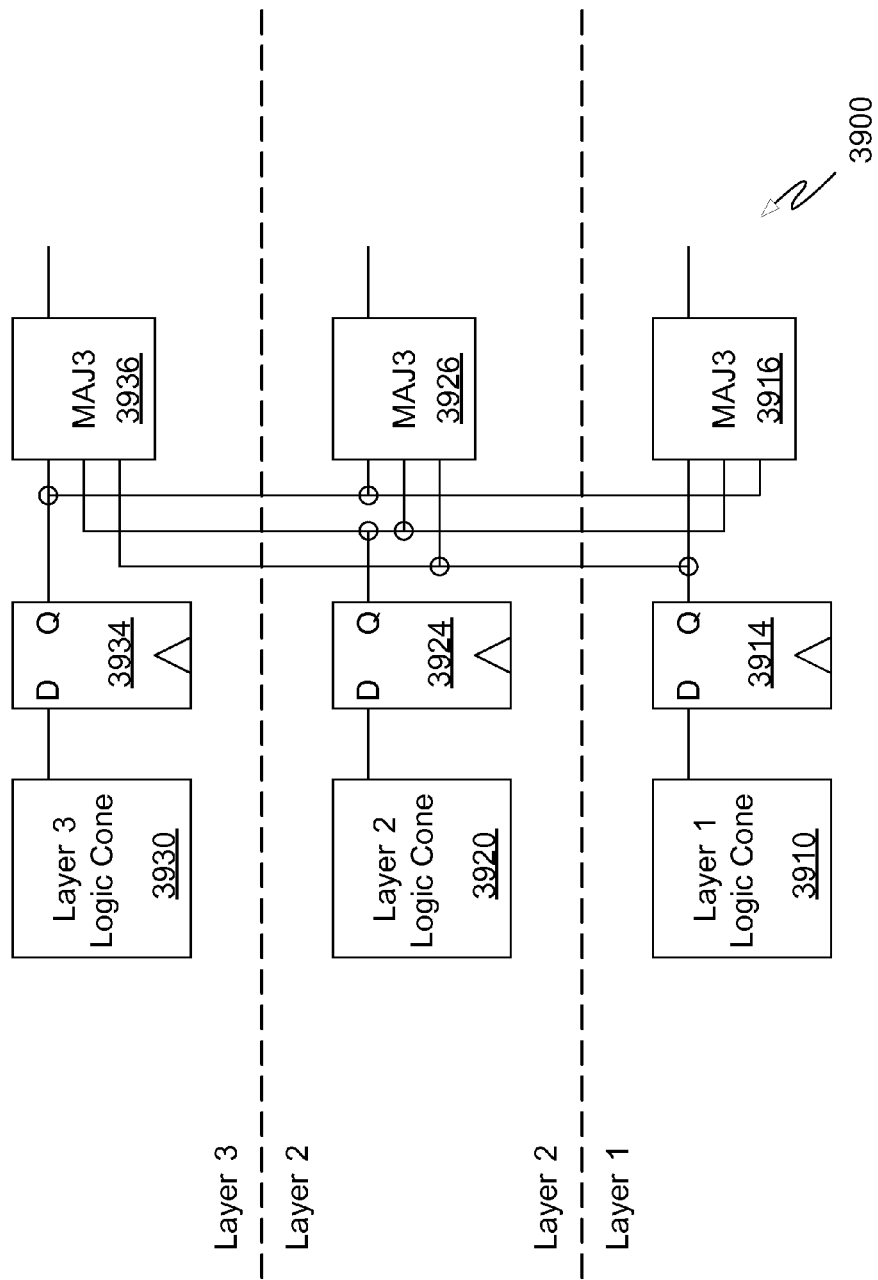
FIG. 39 illustrates a second Triple Modular Redundancy 3D IC according to the present invention.

An alternative TMR approach is shown in exemplary 3D IC 3900 in FIG. 39. Present in FIG. 39 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 3900 using techniques known in the art. Layer 1 comprises Layer 1 Logic Cone 3910, flip-flop 3914, and majority-of-three (MAJ3) gate 3916. Layer 2 comprises Layer 2 Logic Cone 3920, flip-flop 3924, and MAJ3 gate 3926. Layer 3 comprises Layer 3 Logic Cone 3930, flip-flop 3934, and MAJ3 gate 3936.

The logic cones 3910, 3920 and 3930 all perform a substantially identical logic function. The flip-flops 3914, 3924 and 3934 are preferably scan flip-flops. If a Repair Layer is present (not shown in FIG. 39), then the flip-flop 2502 of FIG. 25 may be used to implement repair of a defective logic cone before 3D IC 3900 is shipped from the factory. The MAJ3 gates 3916, 3926 and 3936 compare the outputs from the three flip-flops 3914, 3924 and 3934 and output a logic value consistent with the majority of the inputs: specifically if two or three of the three inputs equal logic-0 then the MAJ3 gate will output logic-0 and if two or three of the three inputs equal logic-1 then the MAJ3 gate will output logic-1. Thus if one of the three logic cones or one of the three flip-flops is defective, the correct logic value will be present at the output of all three MAJ3 gates.

One advantage of the embodiment of FIG. 39 is that Layer 1, Layer 2 or Layer 3 can all be fabricated using all or nearly all of the same masks. Another advantage is that MAJ3 gates 3916, 3926 and 3936 also effectively function as a Single Event Upset (SEU) filter for high reliability or radiation tolerant applications as described in Rezgui cited above.

Figure 40:
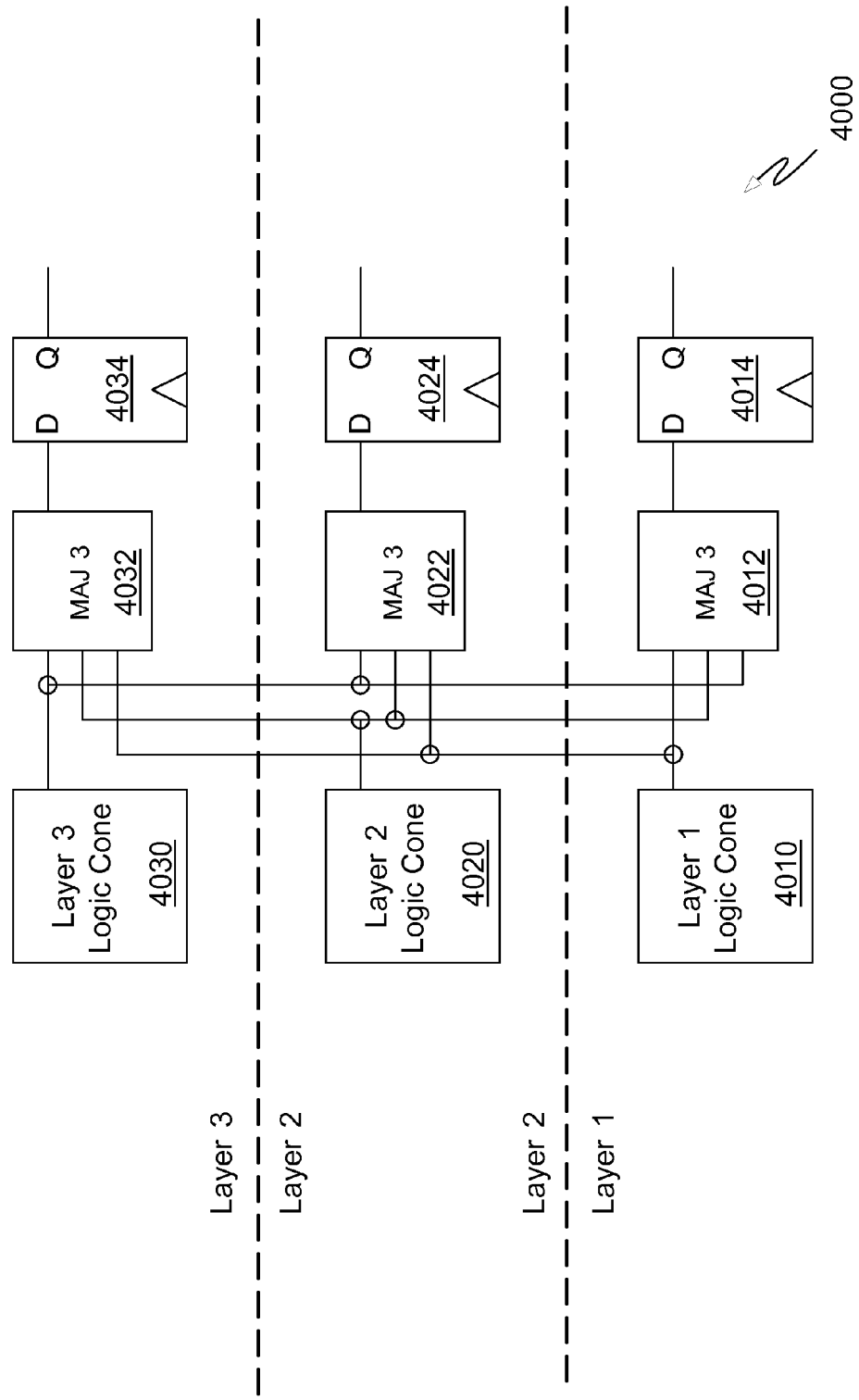
FIG. 40 illustrates a third Triple Modular Redundancy 3D IC according to the present invention.

Another TMR approach is shown in exemplary 3D IC 4000 in FIG. 40. In this embodiment, the MAJ3 gates are placed between the logic cones and their respective flip-flops. Present in FIG. 40 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 4000 using techniques known in the art. Layer 1 comprises Layer 1 Logic Cone 4010, flip-flop 4014, and majority-of-three (MAJ3) gate 4012. Layer 2 comprises Layer 2 Logic Cone 4020, flip-flop 4024, and MAJ3 gate 4022. Layer 3 comprises Layer 3 Logic Cone 4030, flip-flop 4034, and MAJ3 gate 4032.

The logic cones 4010, 4020 and 4030 all perform a substantially identical logic function. The flip-flops 4014, 4024 and 4034 are preferably scan flip-flops. If a Repair Layer is present (not shown in FIG. 40), then the flip-flop 2502 of FIG. 25 may be used to implement repair of a defective logic cone before 3D IC 4000 is shipped from the factory. The MAJ3 gates 4012, 4022 and 4032 compare the outputs from the three logic cones 4010, 4020 and 4030 and output a logic value consistent with the majority of the inputs. Thus if one of the three logic cones is defective, the correct logic value will be present at the output of all three MAJ3 gates.

One advantage of the embodiment of FIG. 40 is that Layer 1, Layer 2 or Layer 3 can all be fabricated using all or nearly all of the same masks. Another advantage is that MAJ3 gates 3912, 3922 and 3932 also effectively function as a Single Event Transient (SET) filter for high reliability or radiation tolerant applications as described in Rezgui cited above.

Figure 41:
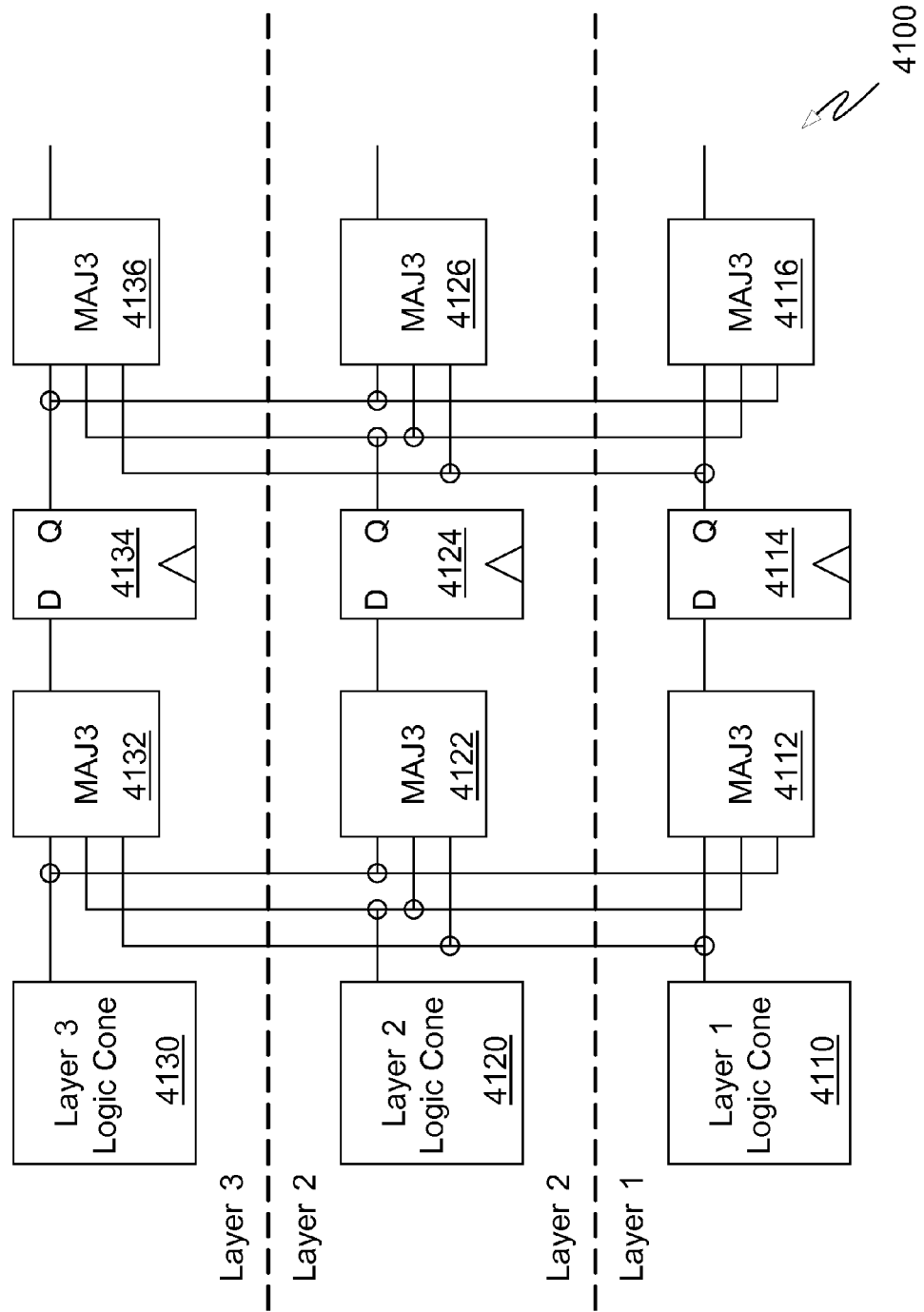
FIG. 41 illustrates a fourth Triple Modular Redundancy 3D IC according to the present invention.

Another TMR embodiment is shown in exemplary 3D IC 4100 in FIG. 41. In this embodiment, the MAJ3 gates are placed between the logic cones and their respective flip-flops. Present in FIG. 41 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 4100 using techniques known in the art. Layer 1 comprises Layer 1 Logic Cone 4110, flip-flop 4114, and majority-of-three (MAJ3) gates 4112 and 4116. Layer 2 comprises Layer 2 Logic Cone 4120, flip-flop 4124, and MAJ3 gates 4122 and 4126. Layer 3 comprises Layer 3 Logic Cone 4130, flip-flop 4134, and MAJ3 gates 4132 and 4136.

The logic cones 4110, 4120 and 4130 all perform a substantially identical logic function. The flip-flops 4114, 4124 and 4134 are preferably scan flip-flops. If a Repair Layer is present (not shown in FIG. 41), then the flip-flop 2502 of FIG. 25 may be used to implement repair of a defective logic cone before 3D IC 4100 is shipped from the factory. The MAJ3 gates 4112, 4122 and 4132 compare the outputs from the three logic cones 4110, 4120 and 4130 and output a logic value consistent with the majority of the inputs. Similarly, the MAJ3 gates 4116, 4126 and 4136 compare the outputs from the three flip-flops 4114, 4124 and 4134 and output a logic value consistent with the majority of the inputs. Thus if one of the three logic cones or one of the three flip-flops is defective, the correct logic value will be present at the output of all six of the MAJ3 gates.

One advantage of the embodiment of FIG. 41 is that Layer 1, Layer 2 or Layer 3 can all be fabricated using all or nearly all of the same masks. Another advantage is that MAJ3 gates 3912, 3922 and 3932 also effectively function as a Single Event Transient (SET) filter while MAJ3 gates 3916, 3926 and 3936 also effectively function as a Single Event Upset (SEU) filter for high reliability or radiation tolerant applications as described in Rezgui cited above.

The present invention can be applied to a large variety of commercial as well as high reliability, aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the present invention can be traded off against the cost requirements of the target application.

In order to reduce the cost of a 3D IC according to the present invention, it is desirable to use the same set of masks to manufacture each Layer. This can be done by creating an identical structure of vias in an appropriate pattern on each layer and then offsetting it by a desired amount when aligning Layer 1 and Layer 2.

Figure 42:
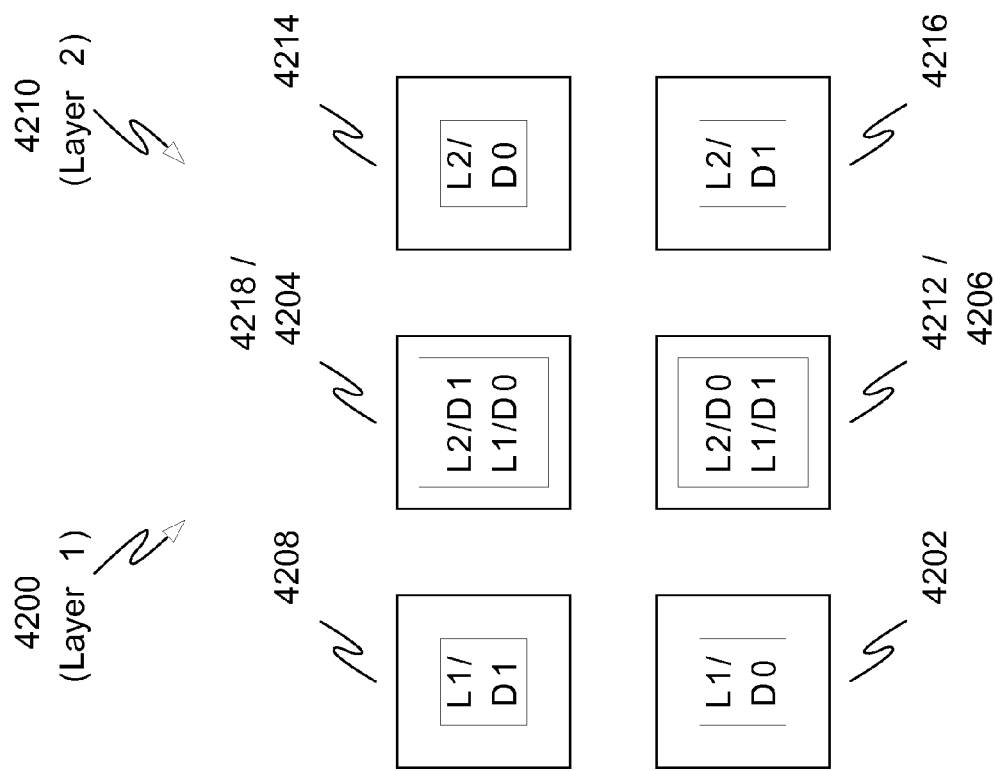
FIG. 42A illustrates a first via metal overlap pattern according to the present invention.
FIG. 42B illustrates a second via metal overlap pattern according to the present invention.
FIG. 42C illustrates the alignment of the via metal overlap patterns of FIGS. 42A and 42B in a 3D IC according to the present invention.
FIG. 42D illustrates a side view of the structure of FIG. 42C.

FIG. 42A illustrates a via pattern 4200 which is constructed on Layer 1 of 3DICs like 3100, 3300, 3400, 3500, 3600, 3700 and 3800 previously discussed. At a minimum the metal overlap pad at each via location 4202, 4204, 4206 and 4208 may be present on the top and bottom metal layers of Layer 1. Via pattern 4200 occurs in proximity to each repair or replacement multiplexer on Layer 1 where via metal overlap pads 4202 and 4204 (labeled L1/D0 for Layer 1 input D0 in the figure) are coupled to the D0 multiplexer input at that location, and via metal overlap pads 4206 and 4208 (labeled L1/D1 for Layer 1 input D1 in the figure) are coupled to the D1 multiplexer input.

Similarly, FIG. 42B illustrates a substantially identical via pattern 4210 which is constructed on Layer 2 of 3DICs like 3100, 3300, 3400, 3500, 3600, 3700 and 3800 previously discussed. At a minimum the metal overlap pad at each via location 4212, 4214, 4216 and 4218 may be present on the top and bottom metal layers of Layer 2. Via pattern 4210 occurs in proximity to each repair or replacement multiplexer on Layer 2 where via metal overlap pads 4212 and 4214 (labeled L2/D0 for Layer 2 input D0 in the figure) are coupled to the D0 multiplexer input at that location, and via metal overlap pads 4216 and 4218 (labeled L2/D1 for Layer 2 input D1 in the figure) are coupled to the D1 multiplexer input.

FIG. 42C illustrates a top view where via patterns 4200 and 4210 are aligned offset by one interlayer interconnection pitch. The interlayer interconnects may be TSVs or some other interlayer interconnect technology. Present in FIG. 42C are via metal overlap pads 4202, 4204, 4206, 4208, 4212, 4214, 4216 and 4218 previously discussed. In FIG. 42C Layer 2 is offset by one interlayer connection pitch to the right relative to Layer 1. This causes via metal overlap pads 4204 and 4218 to physically overlap with each other. Similarly, this causes via metal overlap pads 4206 and 4212 to physically overlap with each other. If Through Silicon Vias or other interlayer vertical coupling points are placed at these two overlap locations (using a single mask) then multiplexer input D1 of Layer 2 is coupled to multiplexer input D0 of Layer 1 and multiplexer input D0 of Layer 2 is coupled to multiplexer input D1 of Layer 1. This is precisely the interlayer connection topology necessary to realize the repair or replacement of logic cones and functional blocks in, for example, the embodiments of FIGS. 33A and 35.

Figure 42D:
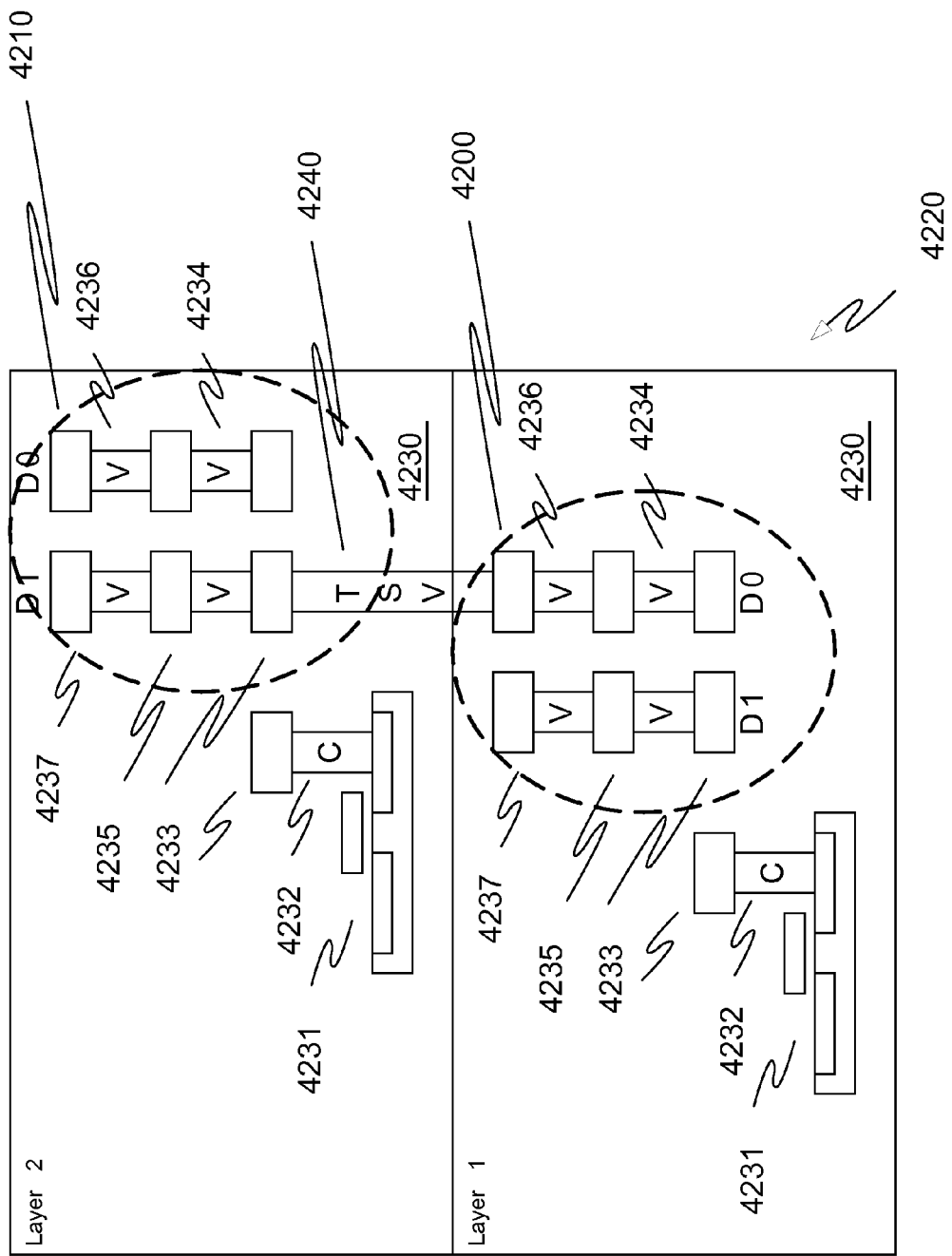

FIG. 42D illustrates a side view of a structure employing the technique described in conjunction with FIGS. 42A, 42B and 42C. Present in FIG. 42D is an exemplary 3D IC generally indicated by 4220 comprising two instances of Layer 4230 stacked together with the top instance labeled Layer 2 and the bottom instance labeled Layer 1 in the figure. Each instance of Layer 4220 comprises an exemplary transistor 4231, an exemplary contact 4232, exemplary metal 1 4233, exemplary via 1 4234, exemplary metal 2 4235, exemplary via 2 4236, and exemplary metal 3 4237. The dashed oval labeled 4200 indicates the part of the Layer 1 corresponding to via pattern 4200 in FIGS. 42A and 42C. Similarly, the dashed oval labeled 4210 indicates the part of the Layer 2 corresponding to via pattern 4210 in FIGS. 42B and 42C. An interlayer via such as TSV 4240 in this example is shown coupling the signal D1 of Layer 2 to the signal D0 of Layer 1. A second interlayer via (not shown since it is out of the plane of FIG. 42D) couples the signal D01 of Layer 2 to the signal D1 of Layer 1. As can be seen in FIG. 42D, while Layer 1 is identical to Layer 2, Layer 2 is offset by one interlayer via pitch allowing the TSVs to correctly align to each layer while only requiring a single interlayer via mask to make the correct interlayer connections.

As previously discussed, in some embodiments of the present invention it is desirable for the control logic on each Layer of a 3D IC to know which layer it is. It is also desirable to use all of the same masks for each Layers. In an embodiment using the one interlayer via pitch offset between layers to correctly couple the functional and repair connections, we can place a different via pattern in proximity to the control logic to exploit the interlayer offset and uniquely identify each of the layers to its control logic.

FIG. 43A illustrates a via pattern 4300 which is constructed on Layer 1 of 3DICs like 3100, 3300, 3400, 3500, 3600, 3700 and 3800 previously discussed. At a minimum the metal overlap pad at each via location 4302, 4304, and 4306 may be present on the top and bottom metal layers of Layer 1. Via pattern 4300 occurs in proximity to control logic on Layer 1. Via metal overlap pad 4302 is coupled to ground (labeled L1/G in the FIG. for Layer 1 Ground). Via metal overlap pad 4304 is coupled to a signal named ID (labeled L1/ID in the FIG. for Layer 1 ID). Via metal overlap pad 4306 is coupled to the power supply voltage (labeled L1N in the FIG. for Layer 1 VCC).

FIG. 43B illustrates a via pattern 4310 which is constructed on Layer 1 of 3DICs like 3100, 3300, 3400, 3500, 3600, 3700 and 3800 previously discussed. At a minimum the metal overlap pad at each via location 4312, 4314, and 4316 may be present on the top and bottom metal layers of Layer 2. Via pattern 4310 occurs in proximity to control logic on Layer 2. Via metal overlap pad 4312 is coupled to ground (labeled L2/G in the FIG. for Layer 2 Ground). Via metal overlap pad 4314 is coupled to a signal named ID (labeled L2/ID in the FIG. for Layer 2 ID). Via metal overlap pad 4316 is coupled to the power supply voltage (labeled L2/V in the FIG. for Layer 2 VCC).

FIG. 43C illustrates a top view where via patterns 4300 and 4310 are aligned offset by one interlayer interconnection pitch. The interlayer interconnects may be TSVs or some other interlayer interconnect technology. Present in FIG. 42C are via metal overlap pads 4302, 4304, 4306, 4312, 4314, and 4216 previously discussed. In FIG. 42C Layer 2 is offset by one interlayer connection pitch to the right relative to Layer 1. This causes via metal overlap pads 4304 and 4312 to physically overlap with each other. Similarly, this causes via metal overlap pads 4306 and 4314 to physically overlap with each other. If Through Silicon Vias or other interlayer vertical coupling points are placed at these two overlap locations (using a single mask) then the Layer 1 ID signal is coupled to ground and the Layer 2 ID signal is coupled to VCC. This allows the control logic in Layer 1 and Layer 2 to uniquely know their vertical position in the stack.

Persons of ordinary skill in the art will appreciate that the metal connections between Layer 1 and Layer 2 will typically be much larger comprising larger pads and numerous TSVs or other interlayer interconnections. This makes alignment of the power supply nodes easy and ensures that L1N and L2/V will both be at the positive power supply potential and that L1/G and L2/G will both be at ground potential.

Several embodiments of the present invention utilize Triple Modular Redundancy distributed over three Layers. In such embodiments it is desirable to use the same masks for all three Layers.

Figure 44:
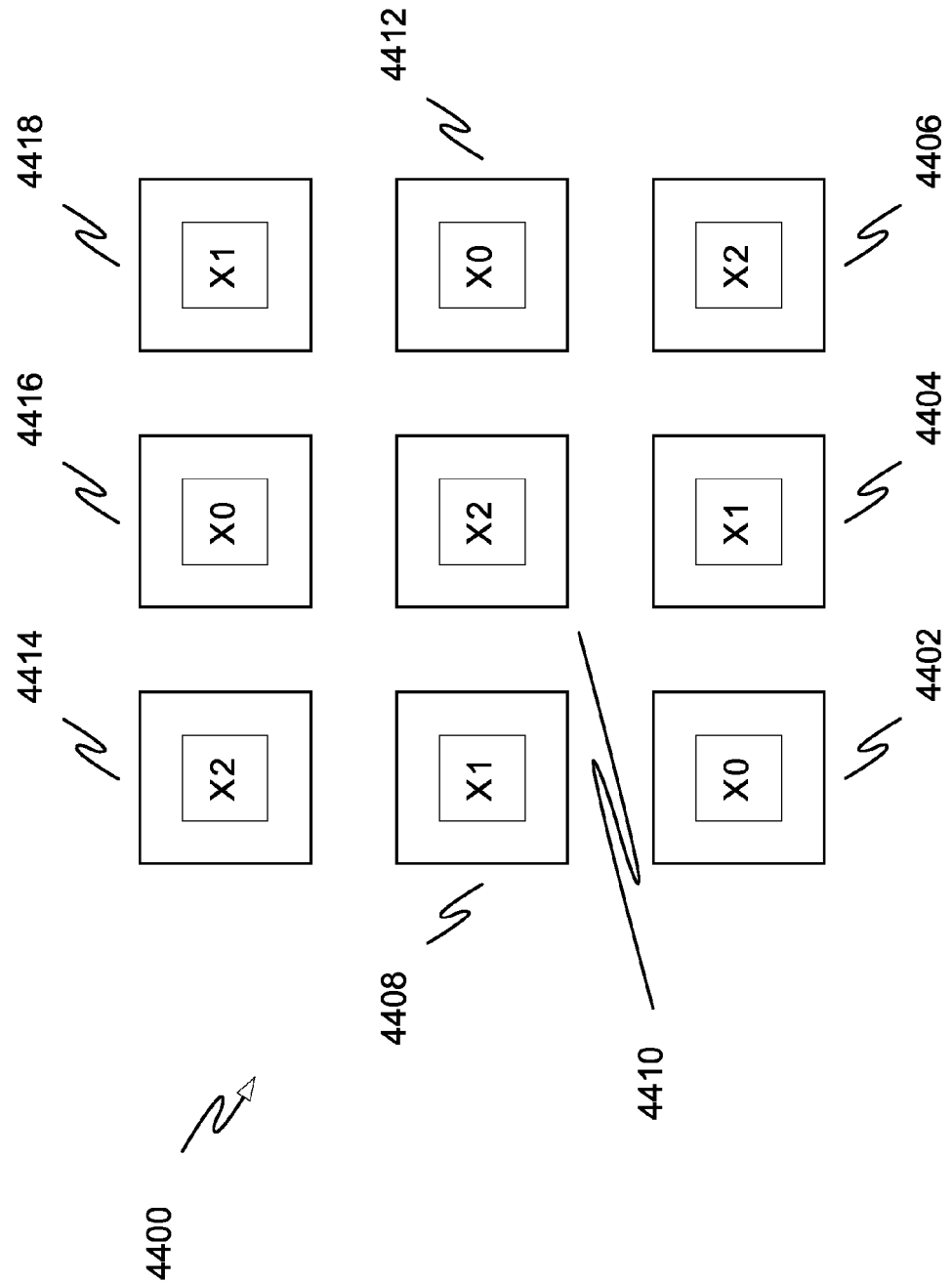
FIG. 44A illustrates a fifth via metal overlap pattern according to the present invention.
FIG. 44B illustrates the alignment of three instances of the via metal overlap patterns of FIG. 44A in a 3DIC according to the present invention.

FIG. 44A illustrates a via metal overlap pattern 4400 comprising a 3×3 array of TSVs (or other interlayer coupling technology). The TMR interlayer connections occur in the proximity of a majority-of-three (MAJ3) gate typically fanning in or out from either a flip-flop or functional block. Thus at each location on each of the three layers we have the function f(X0, X1, X2)=MAJ3(X0, X1, X2) being implemented where X0, X1 and X2 are the three inputs to the MAJ3 gate. For purposes of this discussion the X0 input is always coupled to the version of the signal generated on the same layer as the MAJ3 gate and the X1 and X2 inputs come from the other two layers.

In via pattern 4400, via metal overlap pads 4402, 4412 and 4416 are coupled to the X0 input of the MAJ3 gate on that layer, via metal overlap pads 4404, 4408 and 4418 are coupled to the X1 input of the MAJ3 gate on that layer, and via metal overlap pads 4406, 4410 and 4414 are coupled to the X2 input of the MAJ3 gate on that layer.

Figure 44B:
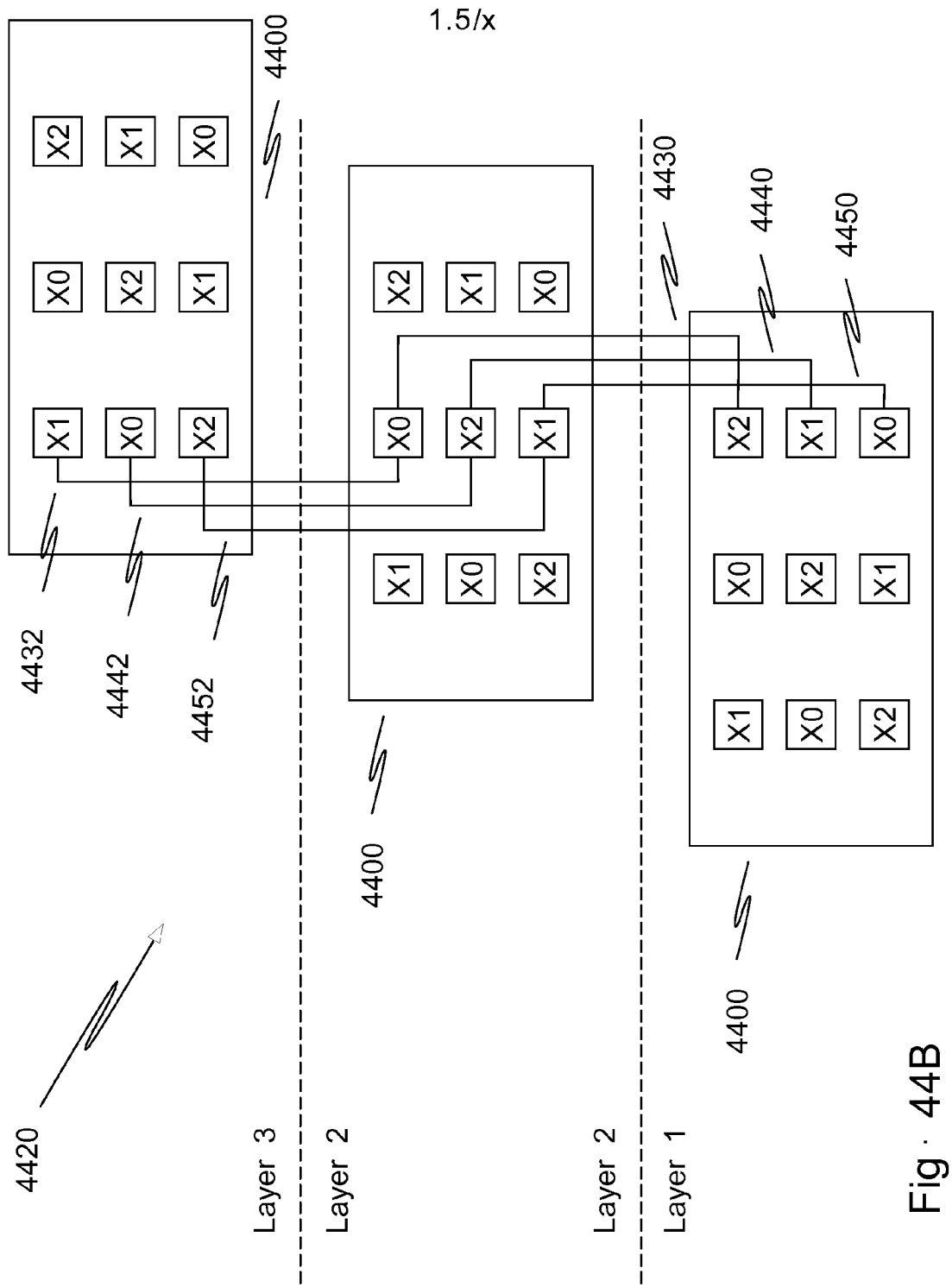

FIG. 44B illustrates an exemplary 3D IC generally indicated by 9220 having three Layers labeled Layer 1, Layer 2 and Layer 3 from bottom to top. Each layer comprises an instance of via pattern 4400 in the proximity of each MAJ3 gate used to implement a TMR related interlayer coupling. Layer 2 is offset one interlayer via pitch to the right relative to Layer 1 while Layer 3 is offset one interlayer via pitch to the right relative to Layer 2. The illustration in FIG. 44B is an abstraction. While it correctly shows the two interlayer via pitch offsets in the horizontal direction, a person of ordinary skill in the art will realize that each row of via metal overlap pads in each instance of 4400 is horizontally aligned with the same row in the other instances.

Thus there are three locations where a via metal overlap pad is aligned on all three layers. FIG. 44B shows three interlayer vias 4430, 4440 and 4450 placed in those locations coupling Layer 1 to Layer 2 and three more interlayer vias 4432, 4442 and 4452 placed in those locations coupling Layer 2 to Layer 3. The same interlayer via mask may be used for both interlayer via fabrication steps.

Thus the interlayer vias 4430 and 4432 are vertically aligned and couple together the Layer 1×2 MAJ3 gate input, the Layer 2 X0 MAJ3 gate input, and the Layer 3 X1 MAJ3 gate input. Similarly, the interlayer vias 4440 and 4442 are vertically aligned and couple together the Layer 1 X1 MAJ3 gate input, the Layer 2×2 MAJ3 gate input, and the Layer 3 X0 MAJ3 gate input. Finally, the interlayer vias 4450 and 4452 are vertically aligned and couple together the Layer 1 X0 MAJ3 gate input, the Layer 2 X1 MAJ3 gate input, and the Layer 3×2 MAJ3 gate input. Since the X0 input of the MAJ3 gate in each layer is driven from that layer, we can see that each driver is coupled to a different MAJ3 gate input on each layer assuring that no drivers are shorted together and the each MAJ3 gate on each layer receives inputs from each of the three drivers on the three Layers.

The present invention can be applied to a large variety of commercial as well as high reliability, aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the present invention can be traded off against the cost requirements of the target application.

For example, a 3D IC targeted an inexpensive consumer products where cost is dominant consideration might do factory repair to maximize yield in the factory but not include any field repair circuitry to minimize costs in products with short useful lifetimes. A 3D IC aimed at higher end consumer or lower end business products might use factory repair combined with two layer field replacement. A 3D IC targeted at enterprise class computing devices which balance cost and reliability might skip doing factory repair and use TMR for both acceptable yields as well as field repair. A 3D IC targeted at high reliability, military, aerospace, space or radiation tolerant applications might do factory repair to ensure that all three instances of every circuit are fully functional and use TMR for field repair as well as SET and SEU filtering. Battery operated devices for the military market might add circuitry to allow the device to operate only one of the three TMR layers to save battery life and include a radiation detection circuit which automatically switches into TMR mode when needed if the operating environment changes. Many other combinations and tradeoffs are possible within the scope of the invention.

Some embodiments of the present invention may include alternative techniques to build IC (Integrated Circuit) devices including techniques and methods to construct 3D IC systems. Some embodiments of the present invention may enable device solutions with far less power consumption than prior art. These device solutions could be very useful for the growing application of mobile electronic devices such as mobile phones, smart phone, cameras and the like. For example, incorporating the 3D IC semiconductor devices according to some embodiments of the present invention within these mobile electronic devices could provide superior mobile units that could operate much more efficiently and for a much longer time than with prior art technology.

3D ICs according to some embodiments of the present invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the present invention could far exceed what was practical with the prior art technology. These advantages could lead to more powerful computer systems and improved systems that have embedded computers.

Some embodiments of the present invention may also enable the design of state of the art electronic systems at a greatly reduced non-recurring engineering (NRE) cost by the use of high density 3D FPGAs or various forms of 3D array base ICs with reduced custom masks as been described previously. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduce NRE using deneric masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system and to provide it with competitive edge. Such end system could be electronic based products or other type of systems that include some level of embedded electronics, such as, for example, cars, remote controlled vehicle, etc.

It is worth noting that many of the principles of the present invention are also applicable to conventional two dimensional integrated circuits (2DICs). For example, an analogous of the two layer field repair embodiments could be built on a single layer with both versions of the duplicate circuitry on a single 2D IC employing the same cross connections between the duplicate versions. A programmable technology like, for example, fuses, antifuses, flash memory storage, etc., could be used to effect both factory repair and field repair. Similarly, an analogous version of some of the TMR embodiments are unique topologies in 2DICs as well as in 3DICs which would also improve the yield or reliability of 2D IC systems if implemented on a single layer.

While embodiments and applications of the present invention have been shown and described, it would be apparent to those of ordinary skill in the art that many more modifications than mentioned above are possible without departing from the inventive concepts herein. The invention, therefore, is not to be limited except by the spirit of the appended claims.

What is claimed is:

1. A method to construct a semiconductor device, the method comprising:
   forming a first layer comprising mono-crystallized semiconductor and first logic circuits;
   forming a second layer comprising a mono-crystallized semiconductor layer, said second layer overlying said first logic circuits;
   forming transistors on said second layer;
      wherein said forming transistors comprises a lithography step, said lithography step comprises an alignment to said first layer, and
   connecting said first logic circuits to an external device using input/output (I/O) circuits, said input/output (I/O) circuits are constructed on said second mono-crystallized semiconductor layer.

2. The method according to claim 1,
   wherein said first logic circuits comprise copper or aluminum interconnect, and
   wherein a plurality of said transistors are connected to form second logic circuits.

3. The method according to claim 1,
   wherein said first logic circuits comprises copper or aluminum interconnect, and wherein at least one of said transistors is a horizontally oriented transistor.

4. The method according to claim 1, further comprising:
etching at least a portion of said transistors in a customization step of a generic structure.

5. The method according to claim 1,
wherein said semiconductor device comprises a circuit that provides a wireless connection to a device that is external to said semiconductor device.

6. The method according to claim 1,
wherein said forming transistors comprises optical annealing.

7. The method according to claim 1,
wherein said forming transistors comprises gate replacement.

8. A method to construct a semiconductor device, the method comprising:
forming a first layer comprising mono-crystallized semiconductor and first logic circuits;
forming a second layer comprising a mono-crystallized semiconductor layer, said second layer overlying said first logic circuits;
forming transistors on said second layer;
wherein said forming transistors comprises a lithography step, said lithography step comprises an alignment to said first layer, and
connecting said first logic circuits to an external device using input/output (I/O) circuits, said input/output (I/O) circuits are constructed on said second mono-crystallized semiconductor layer,
wherein said input/output (I/O) circuits comprise a SerDes circuit.

9. The method according to claim 8,
wherein said first logic circuits comprise copper or aluminum interconnect, and
wherein a plurality of said transistors are connected to form second logic circuits.

10. The method according to claim 8,
wherein said semiconductor device comprises a circuit that provides a wireless connection to a device that is external to said semiconductor device.

11. The method according to claim 8, further comprising:
etching at least a portion of said transistors in a customization step of a generic structure.

12. The method according to claim 8, wherein said connecting comprises applying at least one Through Silicon Via (TSV).

13. The method according to claim 8,
wherein said forming transistors comprises optical annealing.

14. The method according to claim 8,
wherein said forming transistors comprises gate replacement.

15. A method to construct a semiconductor device, the method comprising:
forming a first layer comprising mono-crystallized semiconductor and first logic circuits;
forming a second layer comprising a mono-crystallized semiconductor layer, said second layer overlying said first logic circuits;
forming transistors on said second layer;
wherein said forming transistors comprises a lithography step, said lithography step comprises an alignment to said first layer,
wherein said transistors are connected to form second logic circuits, and
wherein said second logic circuits comprise a scan chain.

16. The method according to claim 15,
wherein said first logic circuits comprise copper or aluminum interconnect.

17. The method according to claim 15,
wherein said first logic circuits comprises copper or aluminum interconnect, and
wherein at least one of said transistors is a horizontally oriented transistor.

18. The method according to claim 15, further comprising:
etching at least a portion of said transistors in a customization step of a generic structure.

19. The method according to claim 15,
wherein said semiconductor device comprises a circuit that provides a wireless connection to an external device.

20. The method according to claim 15, further comprising:
connecting said first logic circuits to an external device using input/output (I/O) circuits, said input/output (I/O) circuits are constructed on said second mono-crystallized semiconductor layer.

21. The method according to claim 15,
wherein said forming transistors comprises gate replacement.

* * * * *